United States Patent
Tanaka et al.

(10) Patent No.: US 6,596,656 B2
(45) Date of Patent: Jul. 22, 2003

(54) MANUFACTURING USE OF PHOTOMASKS WITH AN OPAQUE PATTERN COMPRISING AN ORGANIC LAYER PHOTOABSORPTIVE TO EXPOSURE LIGHT WITH WAVELENGTHS EXCEEDING 200 NM

(75) Inventors: Toshihiko Tanaka, Tokyo (JP); Norio Hasegawa, Hinode (JP); Kazutaka Mori, Kokubunji (JP); Ko Miyazaki, Kokubunji (JP); Tsuneo Terasawa, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/931,938

(22) Filed: Aug. 20, 2001

(65) Prior Publication Data

US 2002/0052122 A1 May 2, 2002

(30) Foreign Application Priority Data

Oct. 27, 2000 (JP) ........................................ 2000-328160

(51) Int. Cl.⁷ .................... H01L 21/31; H01L 21/469
(52) U.S. Cl. ...................... 438/942; 438/945; 430/5
(58) Field of Search .............................. 438/942, 945, 438/946, 947, 948, 949, 950, 585; 430/5, 270.1

(56) References Cited

U.S. PATENT DOCUMENTS

| | | | | |
|---|---|---|---|---|
| 4,621,042 A | * | 11/1986 | Pampalone et al. | 430/271.1 |
| 4,770,739 A | * | 9/1988 | Orvek et al. | 438/717 |
| 5,718,991 A | * | 2/1998 | Lin et al. | 430/5 |
| 6,221,542 B1 | * | 4/2001 | Reinberg | 430/5 |
| 6,319,639 B1 | * | 11/2001 | Reinberg | 430/5 |

FOREIGN PATENT DOCUMENTS

JP        5-289307       4/1992

* cited by examiner

Primary Examiner—Richard Elms
Assistant Examiner—Beth E. Owens

(57) ABSTRACT

A method is provided for well printing a specified pattern even when the exposure treatment using a resist mask uses exposure light with a wavelength over 200 nm. When exposure treatment is applied to a semiconductor wafer by using exposure light with a wavelength over 200 nm, a photomask is used. The photomask is provided with an opaque pattern of a resist layer on an organic layer which is photoabsorptive in reaction to exposure light.

27 Claims, 37 Drawing Sheets

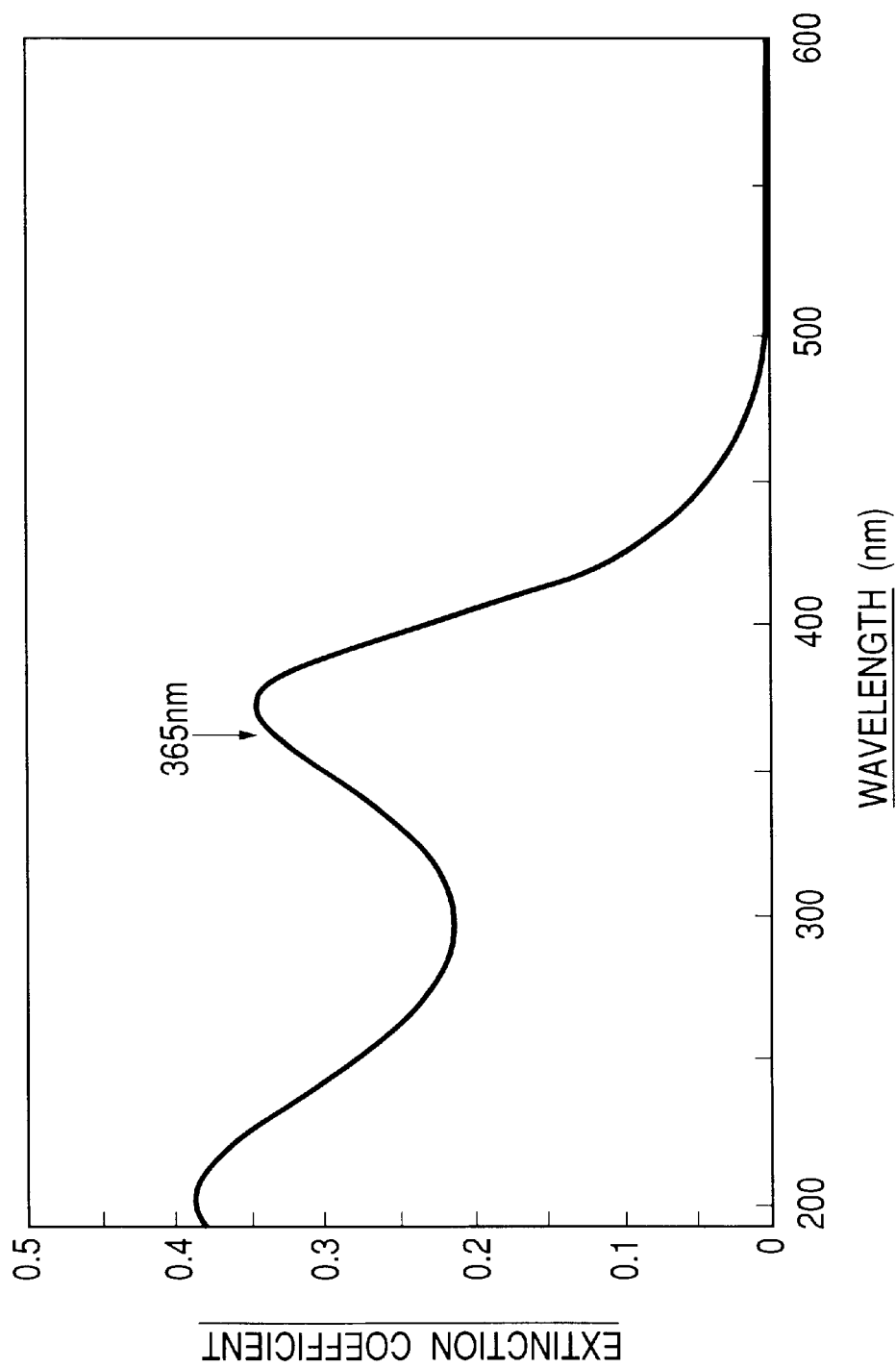

FIG. 30A
FIG. 30B
FIG. 30C
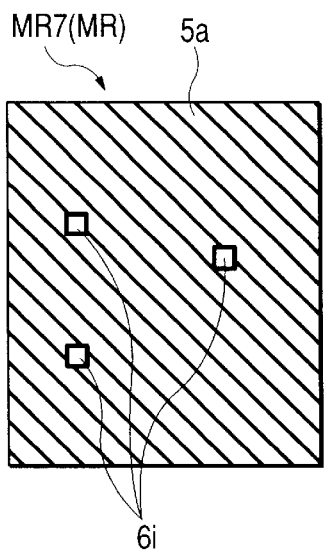
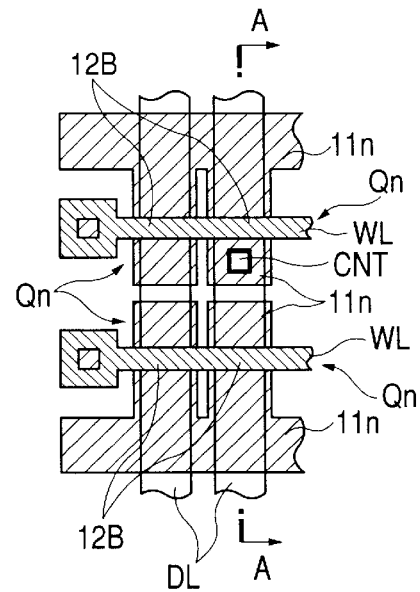
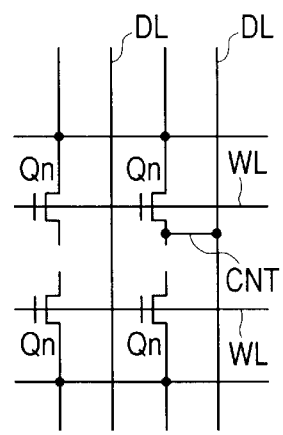
FIG. 30D
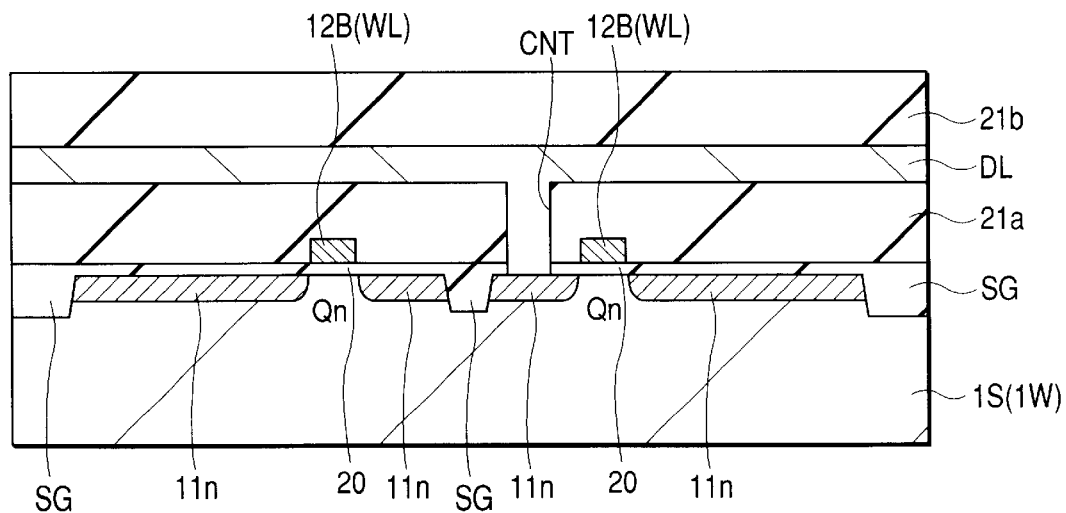

MANUFACTURING USE OF PHOTOMASKS WITH AN OPAQUE PATTERN COMPRISING AN ORGANIC LAYER PHOTOABSORPTIVE TO EXPOSURE LIGHT WITH WAVELENGTHS EXCEEDING 200 NM

BACKGROUND OF THE INVENTION

1. Field of the Invention

The present invention relates to a technique for manufacturing a semiconductor device. More specifically, the present invention concerns a technique effectively applicable to lithography using a photomask (hereafter simply referred to as a mask) during a semiconductor device manufacturing process.

2. Prior Art

In semiconductor device manufacturing, lithography is used as a method of forming a fine pattern on semiconductor wafers. The mainstream lithography is the so-called optical projection exposure method which repeatedly prints a mask-formed pattern on semiconductor wafers via the reduction projection optics. The basic configuration of a stepper is described in, for example, Japanese Patent Application Laid-Open Publication No. 2000-91192.

Generally, resolution, R, on a semiconductor wafer according to the projection exposure method is expressed as $R=k\times\lambda/NA$. In this formula, k is a constant dependent on a resist material or a process; $\lambda$ is an illumination light wavelength; and an NA is a numerical aperture for a projection exposure lens. As seen from this formula, a finer pattern is necessary when using the projection exposure technique, using a light source with a shorter wavelength. Presently, the semiconductor device manufacture uses a stepper whose illumination light source is a mercury lamp's i-line ($\lambda=365$ nm) or a KrF excimer laser ($\lambda=248$ nm). Further fining patterns require a light source with a shorter wavelength, making the use of ArF excimer laser ($\lambda=193$ nm) or F2 excimer laser ($\lambda=157$ nm) under consideration.

An ordinary mask used for this type of lithography is fabricated by processing a transparent mask plate. On this plate, there is formed an opaque metal layer such as chromium (Cr) and the like, or a dimming or opaque inorganic film such as MoSi, ZrSiO, SiN, and the like. An ordinary mask comprises the above-mentioned transparent mask plate on which the above-mentioned metal or inorganic film with a specified shape is formed. However, the thus configured mask causes problems; it requires many manufacturing processes, involves increasing costs, and decreases processing accuracy. The reason is that an opaque pattern is processed with isotropic etching. Considering these problems, Japanese Patent Application Laid-Open Publication No. 5-289307 discloses the technique of using a resist layer for an opaque pattern on the mask plate. This technique is based on the characteristic that the ArF excimer laser decreases transparency of a specified resist layer.

However, the inventors found that the technique of using the resist layer for an opaque pattern is subject to the following problems.

First, an opaque pattern comprising the resist layer cannot sufficiently shield the light with a wavelength over 200 nm. Generally, the exposure light such as KrF excimer laser ($\lambda=248$ nm) or i-line ($\lambda=365$ nm) is used for manufacturing a volume zone on a semiconductor integrated circuit device. An applicable wavelength for the resist layer is critical for the opaque pattern formation.

Second, no sufficient consideration is given about more efficiently manufacturing masks in a short period. In recent years, reflecting a trend of system LSI (Large Scale Integrated) circuits, there is an increasing need for developing and manufacturing a small quantity of, and many types of LSI chip in a short period. The manufacture of these LSI chips uses, for example, 20 to 40 masks. The TAT (turn-around time) for manufacturing masks is a driving force for the LSI development competition. As an advanced feature is requested for this type of LSI chips, the product development requires more processes and a longer period. By contrast, the existing product becomes obsolete soon and the product life is short. It is expected to shorten a period for the product development and manufacture. Especially, a system LSI chip is subject to a high debug ratio for the wire layer. It is important to supply masks for wire layer in a short period and at a low cost for shortening a period and reducing costs for the LSI development. Accordingly, a significant problem is how to efficiently manufacture masks used for this product manufacture in a short time.

Third, no sufficient consideration is given concerning reduction of mask costs. Elements and wires are further fined along with a request to increase integration of elements in a semiconductor integrated circuit device and to increase an operation speed. In addition, strict accuracy is requested for processing mask patterns. An increase in the amount of pattern data remarkably increases mask production costs. Generally, as mentioned above, a plurality of masks is used for one type of semiconductor integrated circuit device. An increase in mask production costs is a serious problem. The technological development progresses with the intention of shortening the exposure light wavelength along with fining of elements and wires. However, shortening the wavelength requires rare and precious lens materials such as $CaF_2$ and the like. Moreover, optical members are subject to great irradiation damage, shortening the parts life. Hence, the short-wavelength exposure is expensive. When the exposure process for semiconductor integrated circuit devices simply uses a mask having the opaque pattern comprising the above-mentioned resist layer, the ArF excimer laser exposure needs to be used in many cases. Consequently, though the mask cost decreases, the total production cost rather increases.

BRIEF SUMMARY OF THE INVENTION

It is an object of the present invention to provide a technique capable of efficiently printing a specified pattern even if the exposure process using a resist mask uses exposure light with a wavelength over 200 nm.

It is another object of the present invention to provide a technique capable of shortening a period for developing semiconductor devices.

It is still another object of the present invention to provide a technique capable of shortening a period for manufacturing semiconductor devices.

It is yet another object of the present invention to provide a technique capable of decreasing semiconductor device costs.

These and other objects and new features will become more apparent as the description in this specification proceeds when considered in connection with the accompanying drawings.

The following summarizes representative inventions disclosed in this specification.

Namely, the present invention comprises a process of printing a specified pattern on a semiconductor wafer by exposing the semiconductor wafer through the use of a photomask provided with an opaque pattern comprising a photoabsorptive organic layer in reaction to exposure light with a wavelength over 200 nm.

Further, according to the present invention, the organic layer comprises a photosensitive organic layer formed on a photoabsorptive organic layer in reaction to exposure light with a wavelength over 200 nm.

Moreover, the present invention selectively uses a photomask provided with an opaque pattern comprising a first photoabsorptive organic layer in reaction to exposure light with the wavelength of 200 nm or shorter and a photomask provided with an opaque pattern comprising a second photoabsorptive organic layer in reaction to exposure light with a wavelength over 200 nm according to a pattern to be exposed.

Furthermore, according to the present invention, the first organic layer is a photoabsorptive photosensitive organic layer reactive to exposure light with the wavelength of 200 nm or shorter. The second organic layer comprises a photosensitive organic layer formed on the photoabsorptive organic layer reactive to exposure light with a wavelength over 200 nm.

Still further, the present invention selectively uses a photomask provided with an opaque pattern comprising a metal layer and a photomask provided with an opaque pattern comprising a photosensitive organic layer formed on the photoabsorptive organic layer reactive to exposure light with a wavelength over 200 nm, according to a pattern to be exposed.

BRIEF DESCRIPTION OF THE SEVERAL VIEWS OF THE DRAWING

FIG. 24 is a graph showing absorbance characteristics of a photoabsorptive organic layer for i-line;

FIG. 30(a) is a detailed plan view of an example of the photomask used for rewriting data on the mask ROM in FIG. 29;

FIG. 30(b) is a detailed plan view of the memory area after data is rewritten through the use of the photomask in FIG. 30(a);

FIG. 30(c) is a circuit diagram of the memory area in FIG. 30(b);

FIG. 30(d) is a cross sectional view taken on the line A—A of FIG. 30(b);

DETAILED DESCRIPTION OF THE EMBODIMENTS

Figure 1:
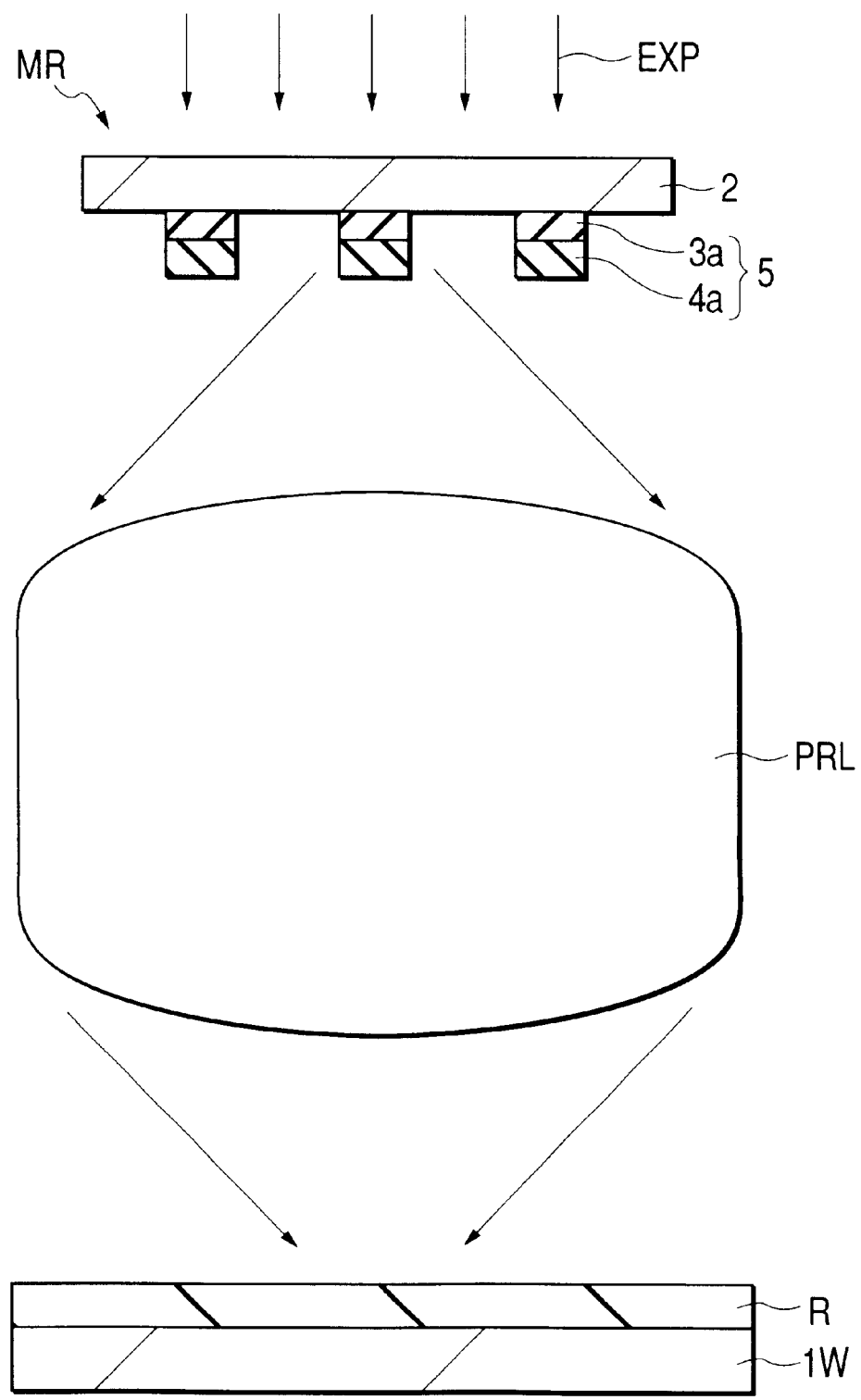
FIG. 1 illustrates the exposure, during a manufacturing process, of a semiconductor device, according to an embodiment of the present invention.

Before describing the present invention in detail, the following explains, the meaning of the terms used in this specification.

1. Mask (optical mask): A pattern formed on a mask plate for shielding light or changing light phases. A mask includes a reticle forming a pattern several times larger than the actual size. The mask's first principal surface forms a pattern for shielding light or changing light phases, as mentioned above. The mask's second principal surface is opposite to the first principal surface, namely-the rear side of the first principal surface.

2. Ordinary mask or binary mask: One of the above-mentioned masks. An ordinary mask or binary mask is a general mask comprising an opaque pattern made of a metal layer and a clear pattern both formed on a mask plate.

3. Resist mask: One of the above-mentioned masks. A resist mask includes the opaque (opaque layer, opaque pattern, opaque area) comprising an organic layer on the mask plate. The organic layer may comprise a single layer or a plurality of layers.

4. With respect to the above-mentioned ordinary mask and resist mask, the pattern surface is divided into the following areas. Namely, a "printable area" is used for arranging an integrated circuit pattern or the like to be printed. There is a "peripheral area" on an external periphery of the printable area.

5. Terms "dim area", "dim layer", and "dim pattern" refer to optical characteristics, of transmitting 25% or less of exposure light, irradiated to these portions. Generally, a dimness of less than 15% is used. The terms "opaque area", "opaque layer", and "opaque pattern" refer to optical characteristics of transmitting 2% or less of exposure light irradiated to these portions. Generally, opaqueness of 1% or less is used. On the other hand, terms "clear", "clear layer", and "clear pattern" refer to optical characteristics of transmitting 60% or more of exposure light irradiated to these portions. Generally, clearness of 90% or more is used.

6. It is possible to express $k=(\lambda/4\pi)\alpha \log_e 10$, where k is an extinction coefficient of the organic layer to the exposure light; and $\lambda$ is an exposure light wavelength; and $\alpha$ is the absorbance. Further, it is possible to express $T=\exp(-4\pi k d/\lambda)$, where T is the organic layer's transmissivity; and d is a layer thickness. When the organic layer comprises a photoabsorptive organic layer and a resist layer, it is possible to express $T=\exp(-4\pi K1 d1/\lambda \times \exp(-4\pi k2 d2/\lambda)$. In this expression, K1 is an extinction coefficient of the photoabsorptive organic layer; d1 is a photoabsorptive organic layer thickness; K2 is an extinction coefficient of the resist layer; and d1 is a resist layer thickness.

7. Print pattern: A pattern printed on a wafer through the mask. Specifically, the print pattern is a photoresist pattern or an actual pattern formed on a wafer by using the photoresist pattern as a mask.

8. A photoresist pattern is a layer pattern formed by patterning a photosensitive organic layer through the photolithography. This pattern includes a simple resist layer having no aperture in relevant portions. Besides light, photosensitive sources include an electron beam, an X-ray, and a charged particle beam. Some photosensitive organic layers comprise only organic substance and others contain inorganic substance such as silicon (Si) and the like.

9. Ordinary illumination: Non-oblique illumination. Namely, illumination with relatively uniform distribution of light intensity of a secondary light source.

10. Oblique illumination: Illumination with decreased illumination at the center of a secondary light source. The oblique illumination includes off-axis illumination, annular illumination, multi-pole illumination such as dipole illumination, quadropole illumination, and the like or equivalent super-resolution technologies using pupil filters.

11. Scanning exposure: This exposure method uses an exposure zone in the shape of a thin slit. The exposure zone is continuously moved for scanning in the direction orthogonal to a longer direction of the slit and relative to a wafer and a mask. It may be preferable to move the exposure zone diagonally. Through this operation, a mask's circuit pattern is printed to a specified location on the wafer. An apparatus used for this exposure method is called a scanner.

12. Step-and-repeat exposure: This exposure method prints a mask's circuit pattern to a specified location on the wafer by repeatedly stepping the wafer corresponding to a projected image of the mask's circuit pattern. An apparatus used for this exposure method is called a stepper.

Depending on needs, the following description is divided into a plurality of sections or embodiments. Unless explicitly specified, they are associated with each other to maintain a relationship that one section or embodiment is a modification example, detail, supplementary explanation, and the like for all or part of the others.

The following embodiments refer to the number of elements including the number of items, values, quantity, ranges, and the like. In such a case, the present invention is not limited to the specified value. The present invention is applicable to any value greater or smaller than or equal to the specified value unless explicitly stated or unless the specified value must be necessarily used on principle.

In the embodiments described below, it is believed obvious that composing elements including constituent steps are not necessarily required unless explicitly stated or unless considered to be apparently required on principle.

Likewise, the following embodiments refer to shapes, positional relations, and the like about composing elements. In such a case, the present invention shall include practically approximate or similar shapes, positional relations, and the like unless explicitly stated or unless there are obvious reasons for eliminating exceptions. This also applies to the above-mentioned values and ranges.

In all drawings for explaining the embodiments, the same, functions are depicted by the same reference numerals and a repetitious description is omitted.

In drawings used for the embodiments, hatching is applied to opaque portions such as an opaque layer, opaque pattern, opaque area, and the like, and a resist layer for improved readability of drawings even including plan views.

In the embodiments, a representative field effect transistor MISFET (Metal Insulator Semiconductor Field Effect Transistor) is abbreviated as MIS. A p-channel type MISFET is abbreviated as pMIS. An n-channel type MISFET is abbreviated as nMIS.

Embodiments of the present invention will be described in further detail with reference to the accompanying drawings.

Embodiment 1

As shown in FIG. 1 for exposure according to this embodiment of the present invention, exposure light EXP generated from an exposure light source is irradiated onto a mask MR's second principal surface. The exposure light is transmitted through the mask MR. Then, via a projection lens PRL, the exposure light is irradiated to a resist layer R on a wafer 1W mainly comprising silicon single crystal and the like. Here, the above-mentioned ordinary illumination is used. The exposure method may be the scanning exposure or the step-and-repeat exposure as mentioned above. In this embodiment, a plurality of opaque patterns 5 is provided on the first principal surface of a mask plate 2 for the mask MR. Each opaque pattern 5 comprises a layered set of a photoabsorptive organic layer 3a and a resist layer (photosensitive organic layer) 4a. The photoabsorptive organic layer 3a comprises a photoabsorptive or dimming material in reaction to exposure light with a wavelength over 200 nm. The resist layer 4a comprises a photosensitive material in reaction to an energy beam such as an electron beam, laser beam, or the like for printing a pattern thereon. The applicants' Japanese Patent Application No. 1999-185221 (filed on Jun. 30, 1999) contains description about the technique for forming an opaque pattern using a resist layer.

Figure 2A:
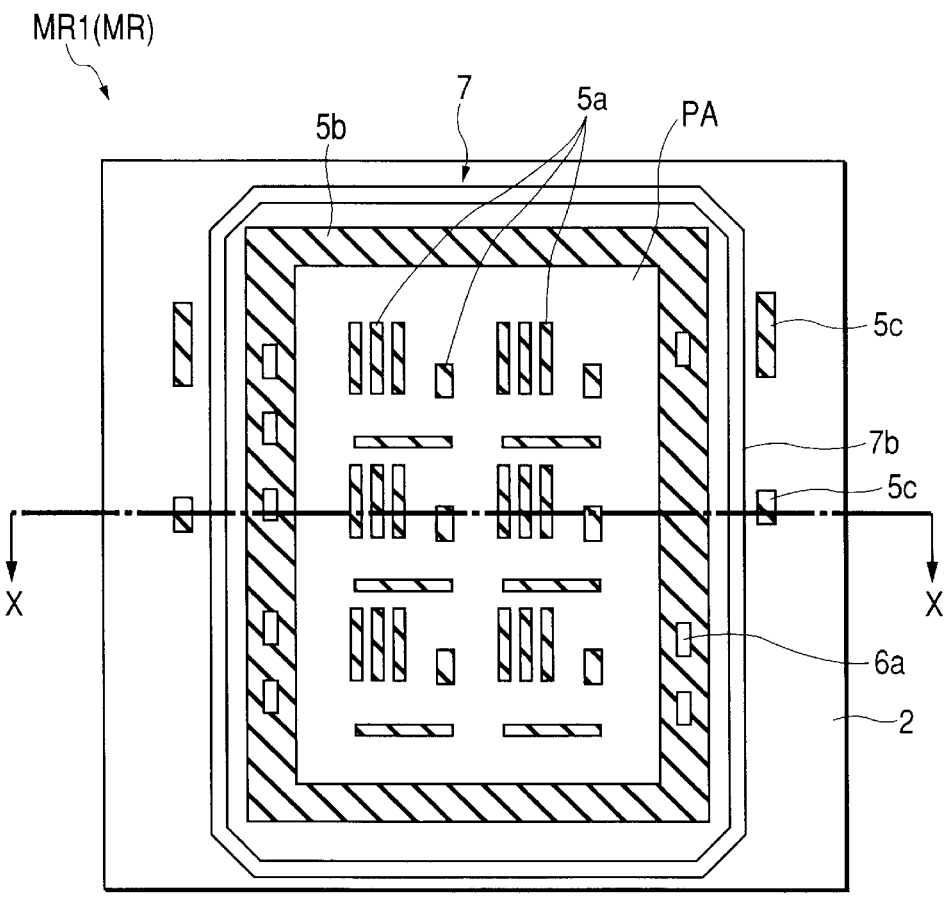
FIG. 2(a) is an overall plan view of a photomask used for the exposure in FIG. 1.
Figure 2B:
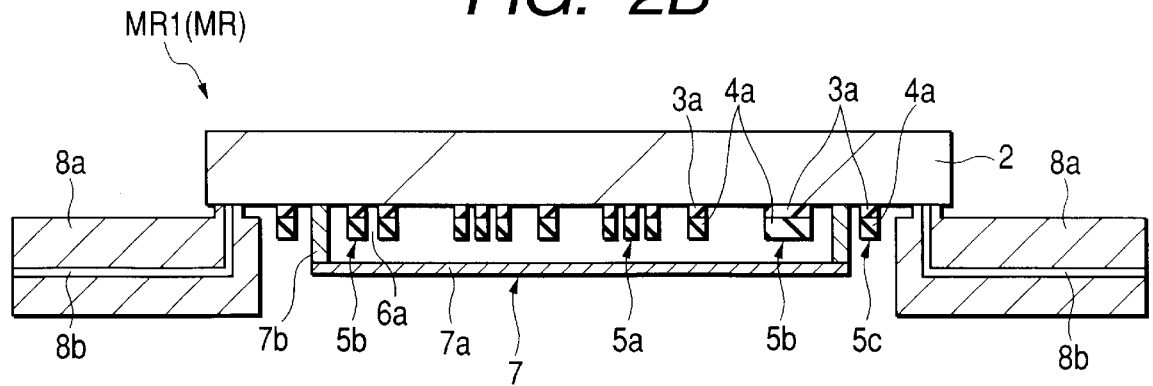
FIG. 2(b) is a cross sectional view taken on the line X—X of FIG. 2(a) when the photomask in FIG. 2(a) is mounted on a photolithography machine.

An example of the mask MR used here will be described in detail with reference to FIG. 2. FIG. 2 exemplifies a mask MR1 (MR) fabricated according to this method. FIG. 2(a) is an overall plan view of the mask MR1. FIG. 2(b) is a cross sectional view taken on the line X—X of FIG. 2(a) when the mask MR1 is mounted on a photolithography machine.

The mask MR1 shows a reticle for printing a circuit pattern to a wafer 1W and the like through the reduction projection optics and the like. The circuit pattern is sized approximately one to ten times as large as the actual size. An opaque pattern is formed with the organic layer structure providing sufficient opaqueness for exposure light with a wavelength over 200 nm such as a KrF excimer laser beam, i-line, g-line, and the like.

A mask plate 2 constituting the mask MR1 comprises synthetic quartz or the like formed, for example, in a flat rectangular shape. A plurality of opaque patterns 5a is arranged in a flat and rectangular printable area PA at the center of the first principal surface on the mask plate 2. This opaque pattern 5a is an example of the above-mentioned opaque pattern 5. Like the opaque pattern 5, the opaque pattern 5a comprises a layered set of photoabsorptive organic layer 3a and the resist layer 4a. The opaque pattern 5a is used for printing an integrated circuit pattern.

The printable area PA is surrounded by a band-shaped opaque pattern 5b. The opaque pattern 5b shows another example of the above-mentioned opaque pattern 5. Like the opaque pattern 5, the opaque pattern 5b comprises a layered set of photoabsorptive organic layer 3a and the resist layer 4a. However, the opaque pattern 5b is not used for printing an integrated circuit pattern, but is formed on an area equivalent to a cutting area such as a scribing area, a dicing area, or the like. A plurality of clear patterns 6a is arranged on the band-shaped opaque pattern 5b. The clear pattern 6a is a wafer alignment mark for alignment between layers and is formed by removing part of the opaque pattern 5b to expose the mask plate 2.

A plurality of opaque patterns 5c is formed around the band-shaped opaque pattern 5b. The opaque pattern 5c shows yet another example of the above-mentioned opaque pattern 5. Like the opaque pattern 5, the opaque pattern 5c also comprises a layered set of photoabsorptive organic layer 3a and the resist layer 4a. The opaque pattern 5c is a reticle alignment mark for accurately positioning the mask MR1.

A pellicle 7 is provided on the first principal surface of the mask plate 2. The pellicle 7 is a member having a pellicle film 7a for protecting the resist mask MR1 against foreign particles and the like and preventing a foreign particle from being printed on the wafer 1W and the like. Its frame 7b is mounted in direct contact with the mask plate 2.

The mask MR1 is mounted with the first principal surface of the mask plate 2 directed to a reticle stage 8a of the photolithography machine and is held by means of, for example, vacuum suction. A reference numeral 8b denotes a vacuum chuck line. It is important to avoid placing the photoabsorptive organic layer 3a and the resist layer 4a on portions where members such as the frame 7b of the pellicle 7, the reticle stage 8a, the reticle handling system, and the like contact with the mask MR1. There may be organic substances such as the photoabsorptive organic layer 3a, the resist layer 4a, and the like on the portions where the above-mentioned members contact. In this case, the organic substance peels off due to contact with the member because these organic substances are more fragile than metal, causing generation of a foreign particle. It is possible to prevent generation of a foreign particle by not providing an organic layer on the portions where the above-mentioned members contact. This can also prevent a print defect due to the foreign particle. Consequently, a highly reliable exposure is available.

During the exposure, the exposure light EXP is irradiated to the second principal surface of the mask plate 2 from the top of FIG. 2(b). The exposure light EXP is then irradiated to the wafer 1W and the like via the projection lens PRL of the photolithography machine installed below the mask plate 2 and its first principal surface (see FIG. 1). Accordingly, the exposure light EXP is irradiated along the direction from the photoabsorptive organic layer 3a to the resist layer 4a. The photoabsorptive organic layer 3a is easily destroyed by light irradiation. According to this embodiment, the resist layer 4a is formed on the photoabsorptive organic layer 3a to restrict presence of the reaction gas such as oxygen affecting the light resistance. Namely, the resist layer 4a works as a type of protective layer for the photoabsorptive organic layer 3a. Therefore, it is possible to improve exposure irradiation resistance for the photoabsorptive organic layer 3a.

An absorbance coefficient of the photoabsorptive organic layer 3a against the exposure light is set to a value greater than the absorbance coefficient of the resist layer 4a for ensuring the opaqueness which can be insufficient on the resist layer 4a. Here, the absorbance coefficient is an extinction coefficient which is equivalent to the imaginary part of a complex refractive index. The opaque pattern 5b for an opaque area and the opaque pattern 5c for a reticle alignment mark each comprise a layered set of the photoabsorptive organic layer 3a and the resist layer 4a. It may be preferable to use a metal layer such as, for example, chromium (Cr) for forming these patterns. Especially, for the purpose of protection against contamination due to the photolithography machine, it is desirable to use a metal layer for the opaque pattern 5c which is formed outside the frame 7b and works as a reticle alignment mark. This is because gas is generated from the photoabsorptive organic layer 3a and the resist layer 4a due to exposure light irradiation and contaminates a photolithography machine lens outside the pellicle's frame 7b. By contrast, inside the pellicle's frame 7b, the pellicle works as a protective film to prevent the photolithography machine from being contaminated by gas generated from the photoabsorptive organic layer 3a and the resist layer 4a.

Figure 3A:
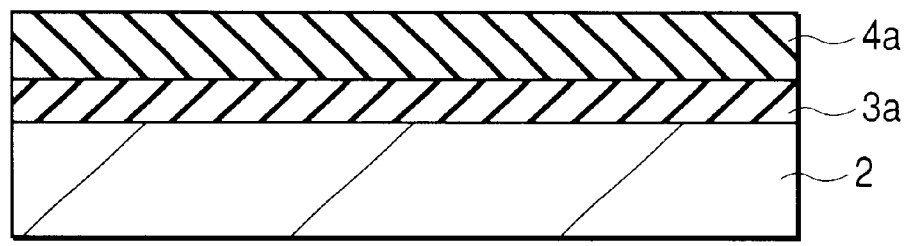
FIGS. 3(a) to 3(c) are detailed sectional views during a manufacturing process of the photomask in FIG. 2.
Figure 3B:
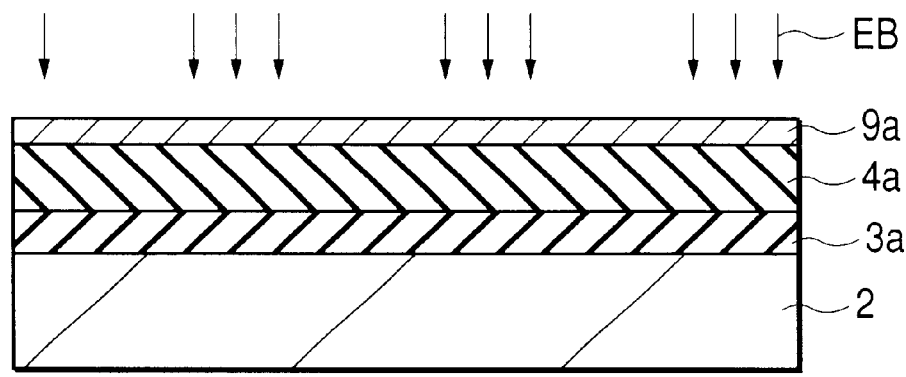
Figure 3C:
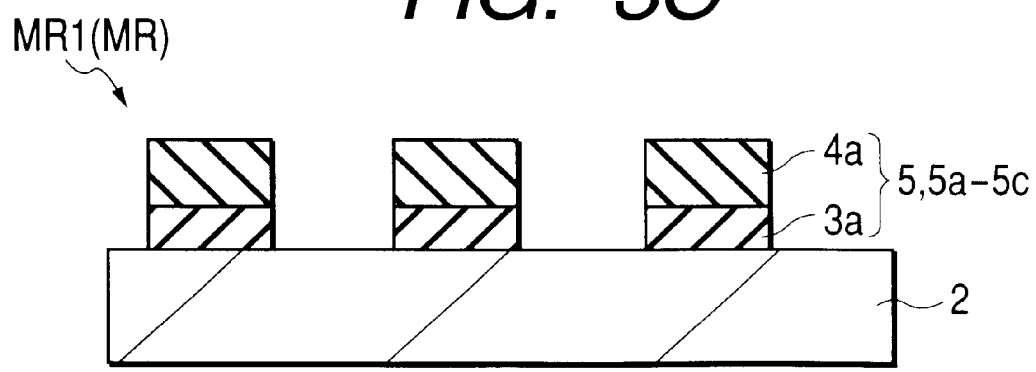

The following describes how to manufacture the mask MR1 in FIG. 2 with reference to FIG. 3. FIGS. 3(a) to 3(c) are detailed sectional views of a printable area during a manufacturing process of the mask MR1.

First, as shown in FIG. 3(a), the photoabsorptive organic layer 3a is coated on the first principal surface of the mask plate 2. After baking, the resist layer 4a sensitive to an electron beam is coated and formed. Here, the photoabsorptive organic layer 3a uses, for example, a polyamide material highly absorptive of KrF excimer laser beam. This material is highly soluble in tetramethylammonium hydroxide (TMAH) water solution. The photoabsorptive organic layer 3a dims or shields the exposure light. The photoabsorptive organic layer is used because just using the resist layer 4a cannot provide a sufficient shielding effect. Accordingly, an extinction coefficient (absorbance coefficient) of the photoabsorptive organic layer 3a against the exposure light needs to be higher than that of the resist layer 4a. The extinction coefficient for the photoabsorptive organic layer 3a used here is 0.28 against the KrF excimer laser beam. The extinction coefficient is desirable to be as high as possible. This can increase the absorbance. Further, it is possible to thin the photoabsorptive organic layer 3a and improve the accuracy of finishing this layer.

The resist layer 4a is made of an electron beam sensitive, positive resist layer containing novolac resin as a base resin. The base resin can be, for example, phenol or acrylic resin. The resist layer 4a indicated the extinction coefficient of 0.04 against the KrF excimer laser beam. The photoabsorptive organic layer 3a more effectively absorbs light because its extinction coefficient is 0.28. The photoabsorptive organic layer 3a supplements absorbance insufficiency due to the resist layer 4a. A large extinction coefficient increases optical reflection on the surface based on the optical principle. The reflected light becomes light shielding in the photolithography machine, causing resolution deterioration. However, this structure can provide an excellent effect of decreasing harmful reflected light. This is because the resist layer 4a is formed on the photoabsorptive organic layer 3a whose extinction coefficient is larger than that of the resist layer 4a.

Thereafter, as shown in FIG. 3(b), the resist layer 4a was coated with a water-soluble conductive layer 9a. An electron beam EB was irradiated to write a desired pattern. This water-soluble conductive layer 9a can prevent a charge-up damage during electron beam writing and a write position misalignment due to a charge-up damage. On the mask MR1, the mask plate 2 is insulating quartz glass. Further, the opaque pattern 5 (see FIG. 1) is formed of the insulating material. Accordingly, the charge-up prevention was very effective.

Thereafter, as shown in FIG. 3(c), a developing treatment was performed using, for example, tetramethylammonium hydroxide (TMAH) water solution to pattern the resist layer 4a and the photoabsorptive organic layer 3a. The photoabsorptive organic layer 3a used here is characteristically wet-etched by the TMAH water solution at a proper etching rate. Accordingly, it is possible to process the photoabsorptive organic layer 3a while developing the resist layer 4a. After the wet etching, heat treatment is performed to improve resistance to the exposure light. In this embodiment, the heat treatment temperature was set to 120° C. This value is just an example and depends on materials for the resist layer 4a. It is desirable to perform the heat treatment at as high temperature as possible so long as the pattern of the resist layer 4a is not deformed. For preventing pattern deformation of the resist layer 4a, it is most effective to irradiate ultraviolet light such as DUV light with the wavelength of, for example, 254 nm and the like during the heat treatment. At this time, the heat treatment temperature can be increased up to, for example, 250° C. This is advantageous because it is possible to improve resistance to the exposure light and decrease transmissivity thereof.

The mask MR1 is thus fabricated. This mask MR1 can be fabricated by coating, exposing, developing, and wet-etching of the organic layers (the photoabsorptive organic layer 3a and the resist layer 4a). The mask MR1 showed a high manufacturing yield because there is no sputtering through the use of a vacuum apparatus needed for coating a metal layer such as chromium (Cr) and the like. The mask MR1 was fabricated more easily and in a shorter period than for the above-mentioned ordinary mask. Just the organic layers (the photoabsorptive organic layer 3a and the resist layer 4a) are formed on the mask plate 2. After use, the mask MR1 can be completely recycled to mask blanks by means of ashing or solvent treatment. This was also effective for recycling of resources. While the embodiment used the wet etching for processing organic layers, the dry etching is also available. This allows the photoabsorptive organic layer 3a to be formed almost perpendicularly without side etching, making it possible to form the opaque pattern 5 with high dimensional accuracy. The use of dry etching can thicken the photoabsorptive organic layer 3a, producing an effect of providing the mask MR1 with a wide range of opaqueness.

In this embodiment, the resist layer 4a uses an electron beam sensitive resist layer. An electron beam writing technique is used to write an integrated circuit pattern on the mask MR1. Instead of the electron beam sensitive resist layer, it is also possible to use the photoresist sensitive to light with the wavelength of 365 nm and write an integrated circuit pattern on the mask MR1 by means of laser exposure. In this case, no charge-up damage occurs during writing, making it possible to omit a process of coating the water-soluble conductive layer in the above-mentioned process. The photoabsorptive organic layer 3a functions as an anti-reflection film against a write laser beam, improving the dimensional accuracy during writing by means of a laser beam.

According to the above-mentioned configuration, the opaque patterns 5 and 5a each comprise a stacked or layered set of the photoabsorptive organic layer 3a and the resist layer 4a, and the present invention is not limited thereto. For example, it may be preferable to form the opaque patterns 5 and 5a with a single photoabsorptive organic layer. In this case, the photoabsorptive organic layer can be configured by adding a material absorptive of exposure light with a wavelength over 200 nm such as a g-line, i-line, KrF, or the like.

As mentioned above, the embodiment forms an opaque pattern comprising an organic layer on the mask, and the present invention is not limited thereto. For example, the photoabsorptive organic layer 3a can be configured with a material or a structure which dims exposure light with a wavelength over 200 nm such as a g-line, i-line, KrF excimer laser beam, or the like. It may be preferable to form a halftone pattern by using a stacked or layered set of the photoabsorptive organic layer 3a and the resist layer 4a or a single layer of the photoabsorptive organic layer 3a.

Figure 4:
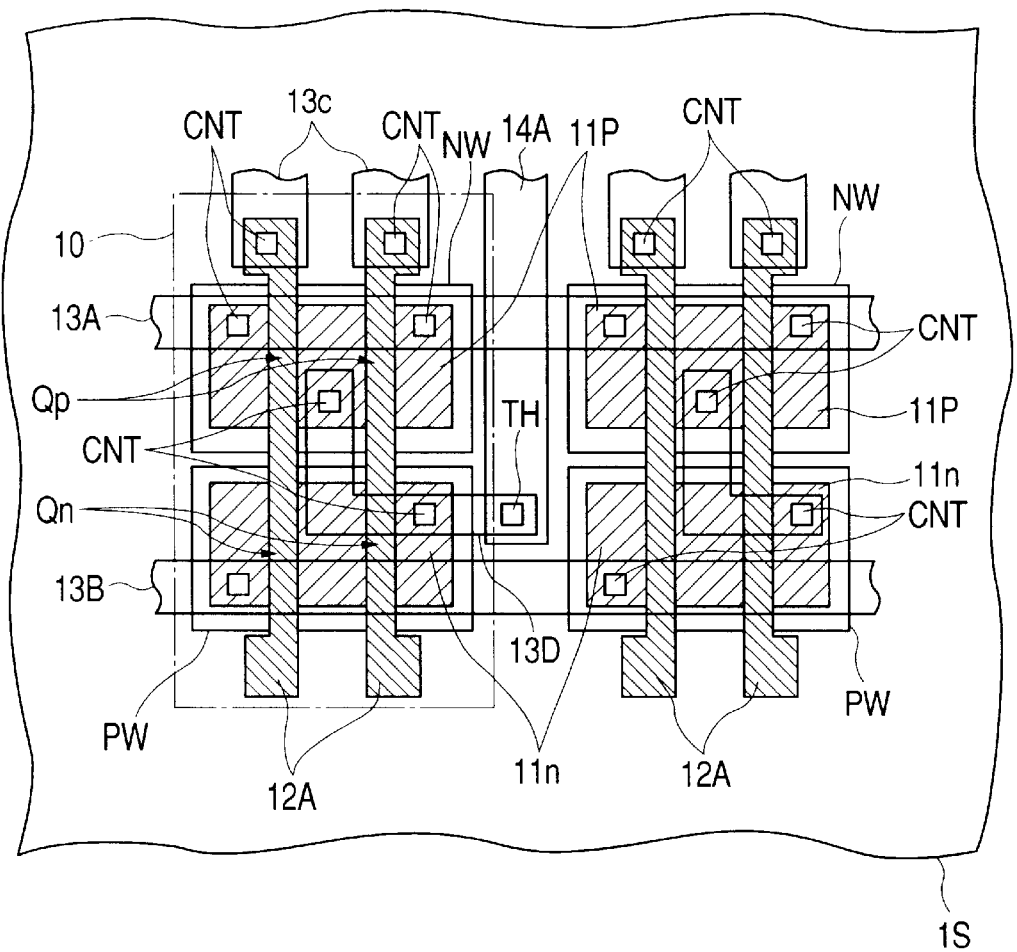
FIG. 4 is a detailed plan view of a semiconductor device according to an embodiment of the present invention.

The following describes a method of manufacturing a semiconductor integrated circuit device using the above-mentioned mask MR1. Here, the present invention is applied to a method of manufacturing, for example, a semiconductor integrated circuit device such as a gate array, a standard cell, or the like manufactured in a semi-custom manner and a semiconductor integrated circuit device having a custom I/O (input/output) circuit, a custom logical circuit, or an I/F (interface) control circuit on a semiconductor substrate. FIG. 4 is a plan view partially showing logical elements in the semiconductor integrated circuit device.

The logical element comprises a unit cell 10 (an area enclosed in a dashed line of FIG. 4). The unit cell 10 comprises, for example, two nMIS Qn transistors and two pMIS Qp transistors. Each nMISQn is formed on an n-type semiconductor area (diffusion layer) 11n on the surface of a p-type well area PW formed on a semiconductor substrate 1S. Each pMISQp is formed on a p-type semiconductor area (diffusion layer) 11p on the surface of an n-type well area NW. A gate electrode 12A is shared between nMIS Qn and pMIS Qp. The gate electrode 12A has, for example, a polycide structure, a polymetal structure, or a damascene gate electrode structure. The polycide structure comprises a single low-resistance polycrystal silicon film or a silicide layer formed on a low-resistance polycrystal silicon film. The polymetal structure comprises a metal layer such as tungsten or the like deposited on a low-resistance polycrystal silicon film through the intermediation of a barrier layer such as tungsten nitride or the like. The damascene gate electrode structure is formed by depositing a barrier layer such as titanium nitride or the like in a trench on an insulation layer and filling a metal layer such as copper or the like thereon. In the semiconductor substrate 1S, the bottom part of the gate electrode 12A is used as a channel area.

A wire 13A is a power supply wire, for example, at the high-potential side (e.g., approximately 3.3 V or 1.8 V) and is electrically connected to a p-type semiconductor area 11p for two pMIS Qp transistors via a contact hole CNT. A wire 13B is a power supply wire, for example, at the low-potential side (e.g., approximately 0 V) and is electrically connected to a p-type semiconductor area 11p for one nMIS Qn transistor via the contact hole CNT. The wire 13C is an input wire for a dual-input NAND gate circuit and is electrically connected to the gate electrode 12A at its wide portion via the contact hole CNT. The wire 13D is electrically connected to both the n-type semiconductor area 11n and the p-type semiconductor area 11p via the contact hole CNT. The wire 14A is electrically connected to the wire 13D via a through-hole TH.

Figure 5:
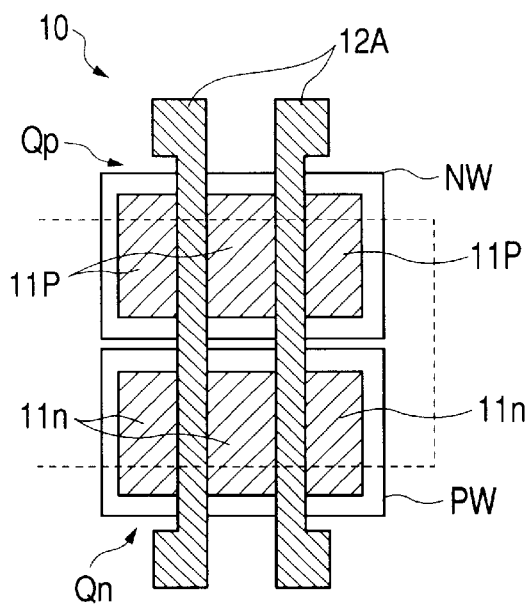
FIG. 5 is a plan view of a unit cell in FIG. 4.

FIG. 5 is a plan view of the unit cell 10 before formation of the wires 13A to 13D and 14A. The unit cell 10 is a basic, common configuration section for configuring logical elements such as a NAND or NOR gate circuit, and the like. The unit cell 10 is so configured as to efficiently form the above-mentioned logical circuits by appropriately selecting the wires following the unit cell 10. The present invention can be enhanced to a configuration for connecting many CMIS (Complementary MIS) circuits.

For example, four types of ordinary masks MK1 to MK4 as shown in FIG. 6 are used for fabricating the unit cell 10 as the basic configuration section. Japanese Patent Application No. 2000-246466 (filed on Aug. 15, 2000) describes a technique of manufacturing semiconductor integrated circuit devices by using an ordinary mask and a resist mask.

Figure 6A:
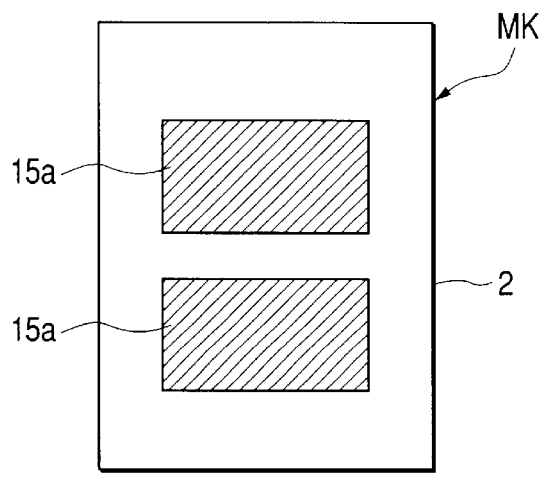
FIGS. 6(a) to 6(d) are detailed plan views of various photomasks used for manufacturing the semiconductor device in FIG. 4.

The mask MK1 in FIG. 6(a) is used for forming an isolation area and an active area in the unit cell 10 on the wafer 1W (semiconductor substrate 1S). On the principal surface of the mask plate 2, two flat rectangular opaque patterns 15a are parallel formed with a specified distance therebetween. The opaque pattern 15a comprises a metal layer such as, for example, chromium and is formed for light shielding of the active area on the wafer 1W (see FIG. 1).

Figure 6B:
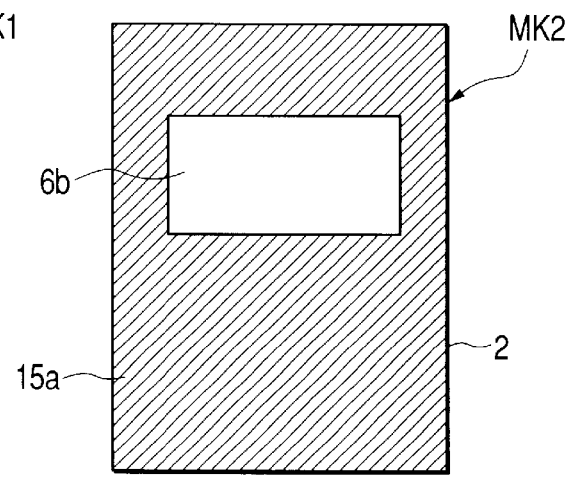

The mask MK2 in FIG. 6(b) is used for forming an n-type well area NW in the unit cell 10. On the principal surface of the mask plate 2, there are formed the opaque pattern 15a and a flat rectangular clear pattern 6b, for example. The opaque pattern 15a is formed for light shielding of areas other than the n-type well area on the wafer 1W.

Figure 6C:
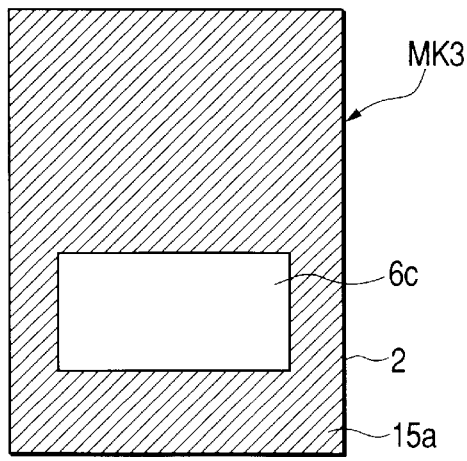

The mask MK3 in FIG. 6(c) is used for forming a p-type well area PW in the unit cell 10. On the principal surface of the mask plate 2, there are formed the opaque pattern 15a and a flat rectangular clear pattern 6c, for example. The opaque pattern 15a is formed for light shielding of areas other than the p-type well area on the wafer 1W.

Figure 6D:
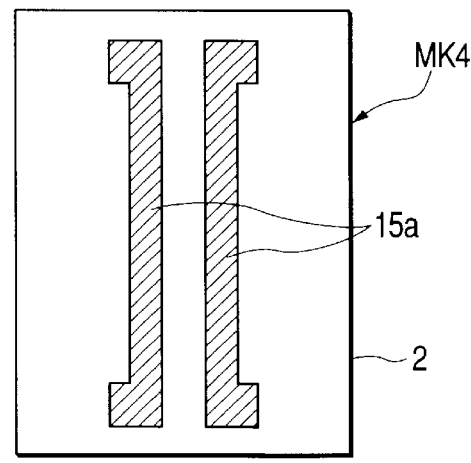

The mask MK4 in FIG. 6(d) is used for forming a gate electrode 12A in the unit cell 10. On the principal surface of the mask plate 2, there are parallel-formed two band-shaped opaque patterns 15a with wide sections at both ends. The opaque pattern 15a is formed for light shielding of a gate electrode formation area on the wafer 1W.

The following describes a process of forming nMISQn and pMISQp transistors with reference to FIGS. 7 to 16, which are cross sectional views taken along the broken line in FIG. 5.

Figure 7:
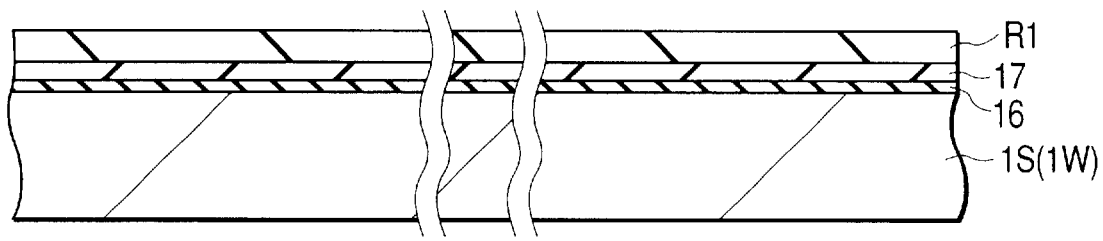
FIG. 7 is a detailed sectional view during a manufacturing process of the semiconductor device in FIG. 4.
Figure 8:
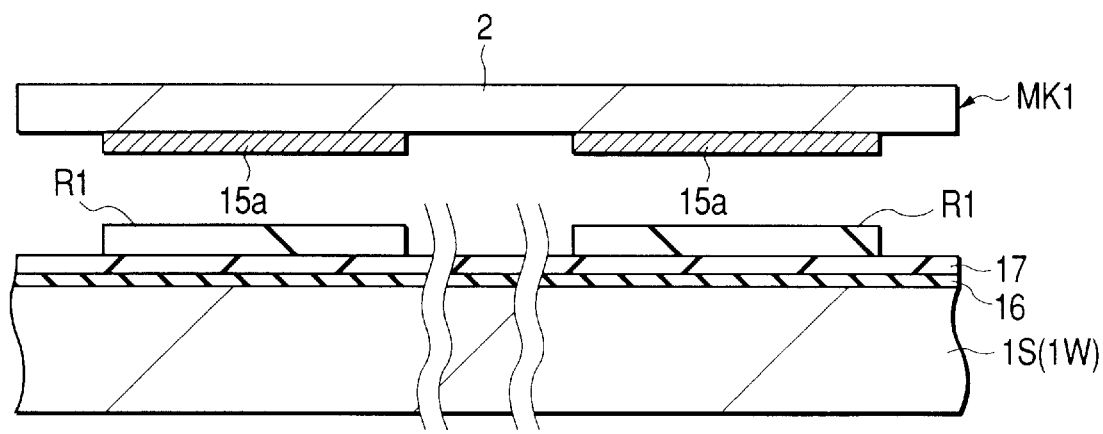
FIG. 8 is a detailed sectional view following FIG. 7 during a manufacturing process of the semiconductor device in FIG. 4.
Figure 9:
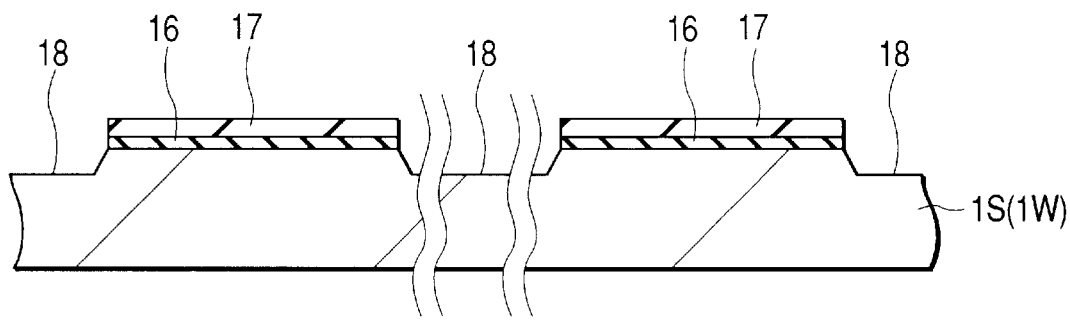
FIG. 9 is a detailed sectional view following FIG. 8 during a manufacturing process of the semiconductor device in FIG. 4.

For example, a flat and approximately circular wafer 1W is prepared first. The wafer 1W has the semiconductor substrate 1S comprising, for example, a p-type silicon single crystal. An oxidation method is used to form an insulation layer 16 comprising, for example, a silicon oxide film on the principal surface (for device formation) of the semiconductor substrate 1S. A CVD method or the like is used to deposit an insulation layer 17 comprising, for example, a silicon nitride film thereon. Further, a resist layer R1(R) is coated thereon (FIG. 7). Thereafter, the above-mentioned mask MK1 (see FIG. 6) is used to expose the wafer 1W. By applying a developing process or the like, a pattern for the resist layer R1 is formed on the principal surface of the semiconductor substrate 1S (FIG. 8). The pattern for the resist layer R1 is formed flat so that an element separation area is exposed and the active area is covered. The pattern for the resist layer R1 is then used as an etching mask to remove the exposed insulation layers 17 and 16 in order. Further, the principal surface of the semiconductor substrate 1S is removed to form a trench 18 on the principal surface of the semiconductor substrate 1S. Then, the pattern for the resist layer R1 is removed (FIG. 9).

Figure 10:
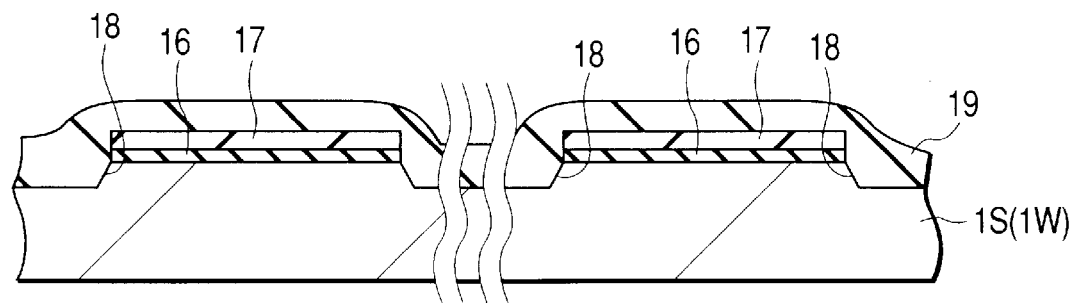
FIG. 10 is a detailed sectional view following FIG. 9 during a manufacturing process of the semiconductor device in FIG. 4.
Figure 11:
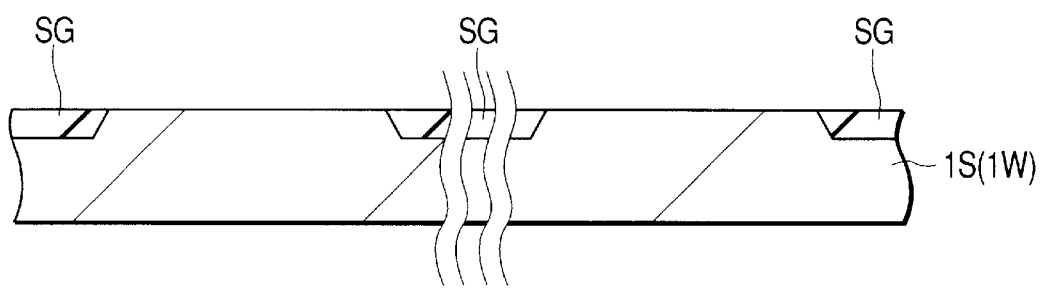
FIG. 11 is a detailed sectional view following FIG. 10 during a manufacturing process of the semiconductor device in FIG. 4.

A CVD (Chemical Vapor Deposition) method or the like is used to deposit an insulation layer 19 comprising, for example, silicon oxide on the principal surface of the semiconductor substrate 1S (FIG. 10). A CMP (Chemical Mechanical Polish) method or the like is used to flatten the semiconductor substrate 1S, and finally form, for example, a trench-type isolation area SG (FIG. 11). According to this embodiment, the isolation area SG is based on the trench isolation, but is not limited thereto. For example, it may be preferable to form the isolation area SG with a field insulation layer according to the LOCOS (Local Oxidization of Silicon) method.

Figure 12:
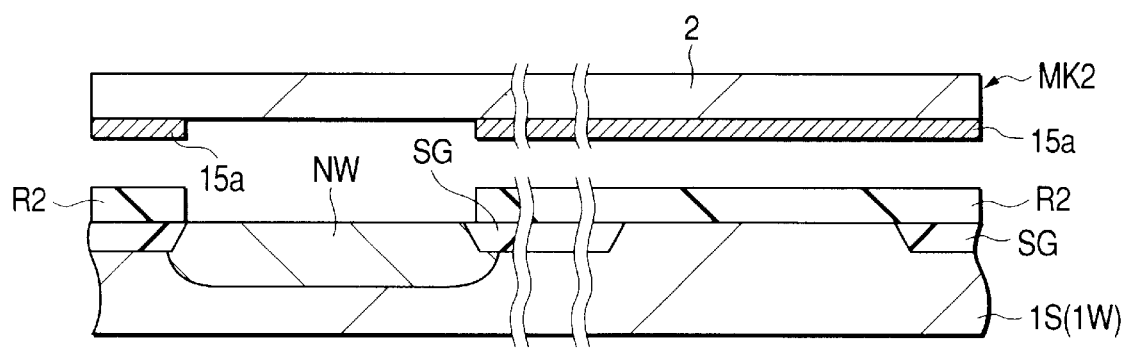
FIG. 12 is a detailed sectional view following FIG. 11 during a manufacturing process of the semiconductor device in FIG. 4.

Subsequently, a resist layer is coated on the principal surface of the wafer 1W. Then, an exposure process is performed on the wafer 1W by using the mask MK2 (see FIG. 6) to form a pattern for the resist layer R2(R) on the principal surface of the wafer 1W. The pattern for the resist layer R2 is formed flat so that the n-type well area NW is exposed and the other areas are covered. The pattern for the resist layer R2 is then used as an ion implantation mask for ion-implanting phosphorus, arsenic, or the like onto the semiconductor substrate 1S to form the n-type well area NW (FIG. 12). Thereafter, the pattern for the resist layer R2 is removed.

Figure 13:
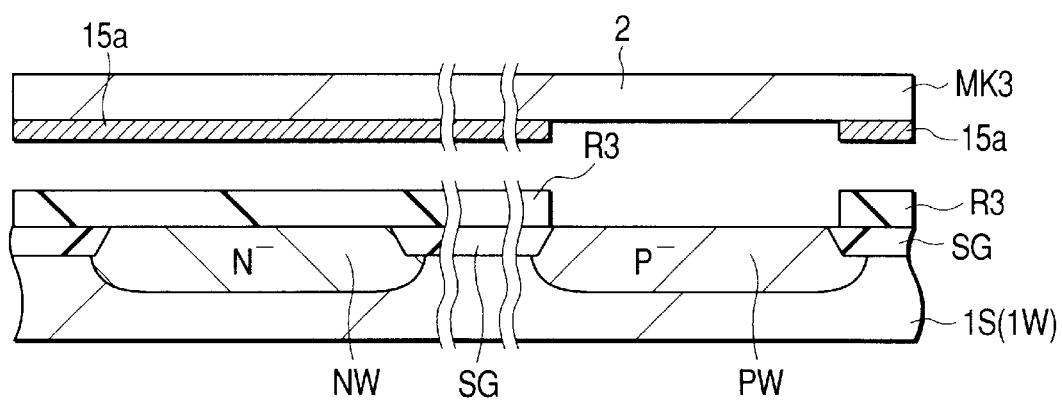
FIG. 13 is a detailed sectional view following FIG. 12 during a manufacturing process of the semiconductor device in FIG. 4.

Similarly, a resist layer is coated on the principal surface of the wafer 1W. Then, an exposure process is performed using the mask MK3 (see FIG. 6). A pattern for the resist layer R3(R) is formed on the principal surface of the wafer 1W so that the p-type well area PW is exposed and the other areas are covered. The pattern for the resist layer R3 is then used as an ion implantation mask for ion-implanting boron or the like onto the semiconductor substrate 1S to form a p-type well area NW (FIG. 13). Thereafter, the pattern for the resist layer R3 is removed.

Figure 14:
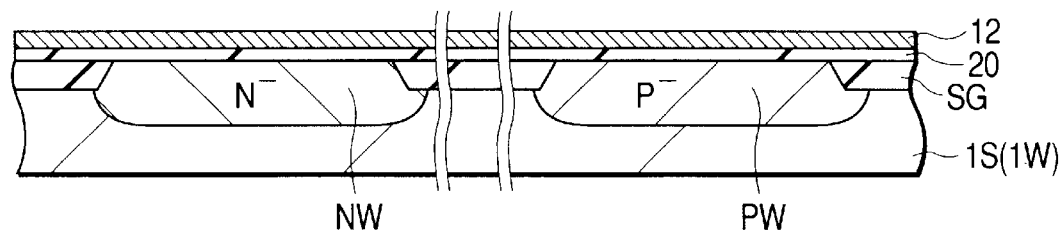
FIG. 14 is a detailed sectional view following FIG. 13 during a manufacturing process of the semiconductor device in FIG. 4.
Figure 15:
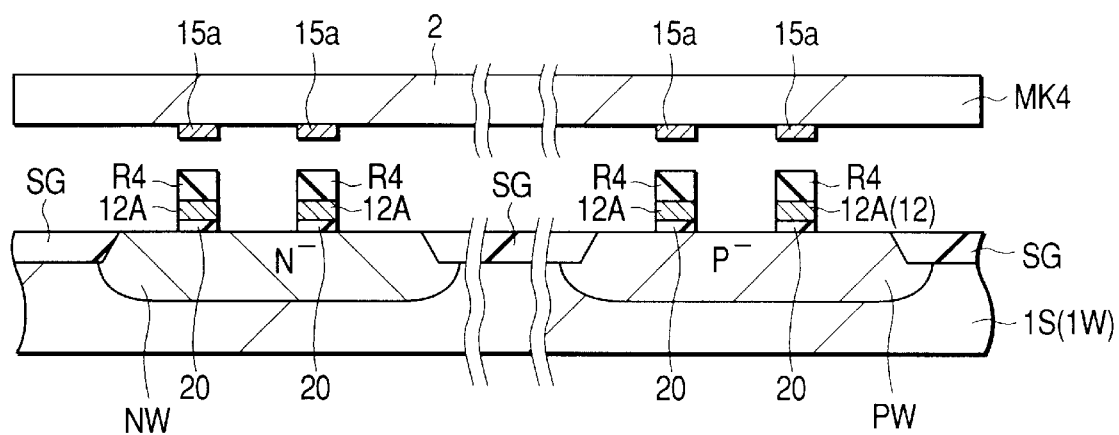
FIG. 15 is a detailed sectional view following FIG. 14 during a manufacturing process of the semiconductor device in FIG. 4.
Figure 16:
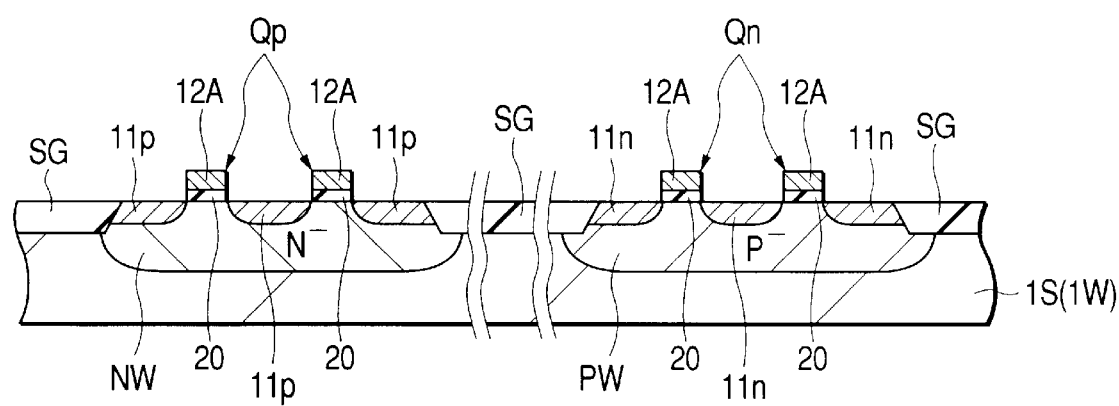
FIG. 16 is a detailed sectional view following FIG. 15 during a manufacturing process of the semiconductor device in FIG. 4.

The thermal oxidation method or the like is used to form a gate insulation layer 20 comprising, for example, a silicon oxide film on the principal surface of the wafer 1W. The gate insulation layer is approximately 3 nm (equivalent thickness of silicon dioxide). The CVD method or the like is used to deposit a conductive layer 12 comprising polycrystal silicon and the like thereon (FIG. 14). Subsequently, the conductive layer 12 is coated with a resist layer. Then, the mask MK4 is used to perform an exposure process (see FIG. 6). A pattern for the resist layer R4(R) is formed on the conductive layer 12 so that the gate electrode formation area is covered and the other areas are exposed. The pattern for the resist layer R4 is then used as an etching mask for etching the conductive layer 12 to form the gate electrode 12A (FIG. 15). After that, the ion implantation or diffusion method is used to form an n-type semiconductor area 11n for nMIS Qn with a high impurity density and a p-type semiconductor area 11p for pMIS Qp with a high impurity density in a manner of self-alignment to the gate electrode 12A (FIG.

16). The n-type semiconductor area 11n also functions as a source area, a drain area, or a wire layer. For example, a positive-type pattern is used for the above-mentioned resist layers R1 to R4.

Figure 17A:
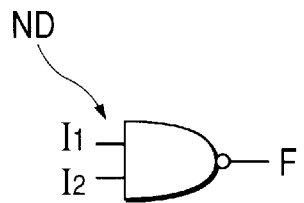
FIG. 17(a) is a symbol diagram of a NAND gate circuit constituting the semiconductor device in FIG. 4.
Figure 17B:
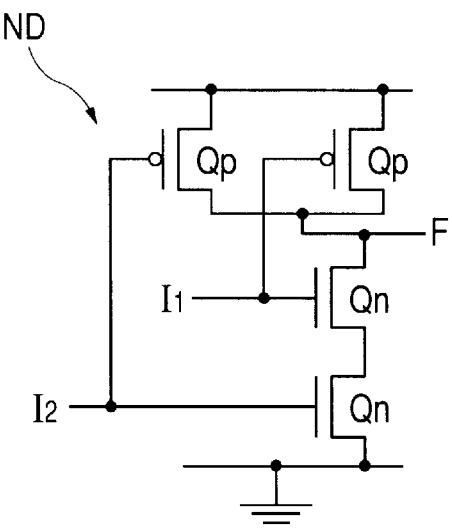
FIG. 17(b) is a circuit diagram of FIG. 17(a)
Figure 17C:
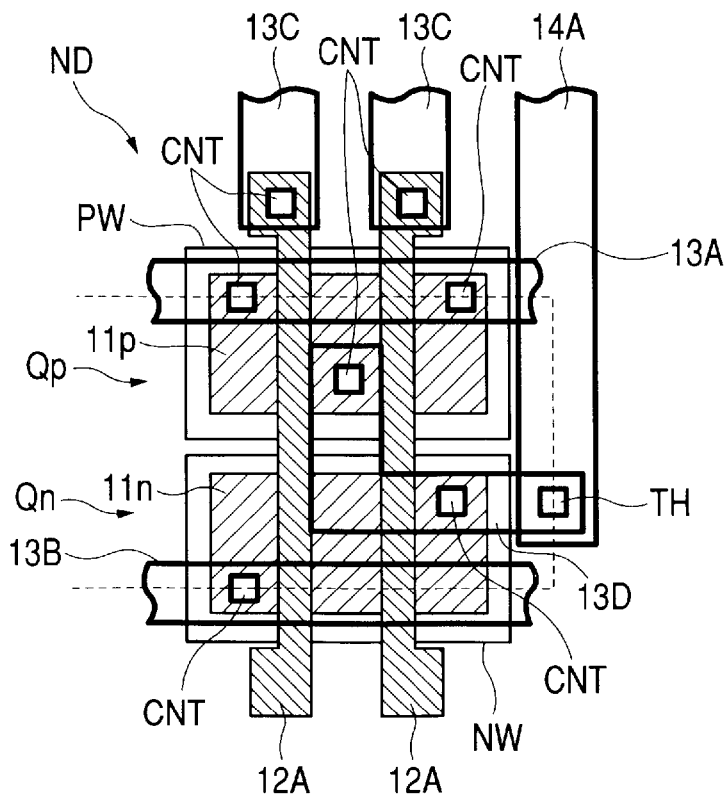
FIG. 17(c) is a plan view showing a pattern layout of FIG. 17(a)

During processes to follow, appropriately selecting wires enables to form a NAND gate circuit or a NOR gate circuit. In this embodiment, for example, a NAND gate circuit ND in FIG. 17 is fabricated. FIG. 17(a) is a symbol diagram of this NAND gate circuit ND. FIG. 17(b) is its circuit diagram. FIG. 17(c) is a plan view of the circuit layout. The example here shows a NAND gate circuit ND with two inputs 11 and 12 and one output F.

Figure 18A:
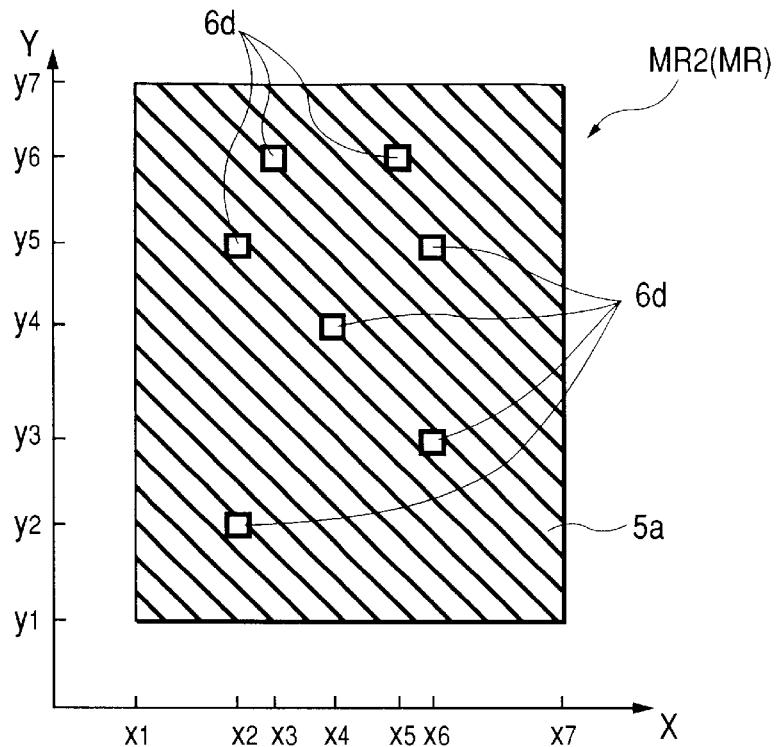
FIG. 18(a) is a detailed plan view of an example of the photomask used for printing a hole pattern of the NAND gate in FIG. 17.

FIGS. 18(a) and (b) show detailed plan views of patterns on masks for printing patterns of contact holes and wires in this NAND gate circuit ND. FIG. 18 uses X and Y axes for easy understanding of positional relations for both masks in FIGS. 18(a) and (b).

FIG. 18(a) shows a pattern of a mask MR2(MR) for printing the contact holes CNT in FIG. 17(c) onto the wafer 1W. As mentioned above, the opaque pattern 5a here is formed of a stacked or layered set of the photoabsorptive organic layer 3a and the resist layer 4a. A fine clear pattern 6d on the flat rectangle is used for printing the contact hole CNT.

Figure 18B:
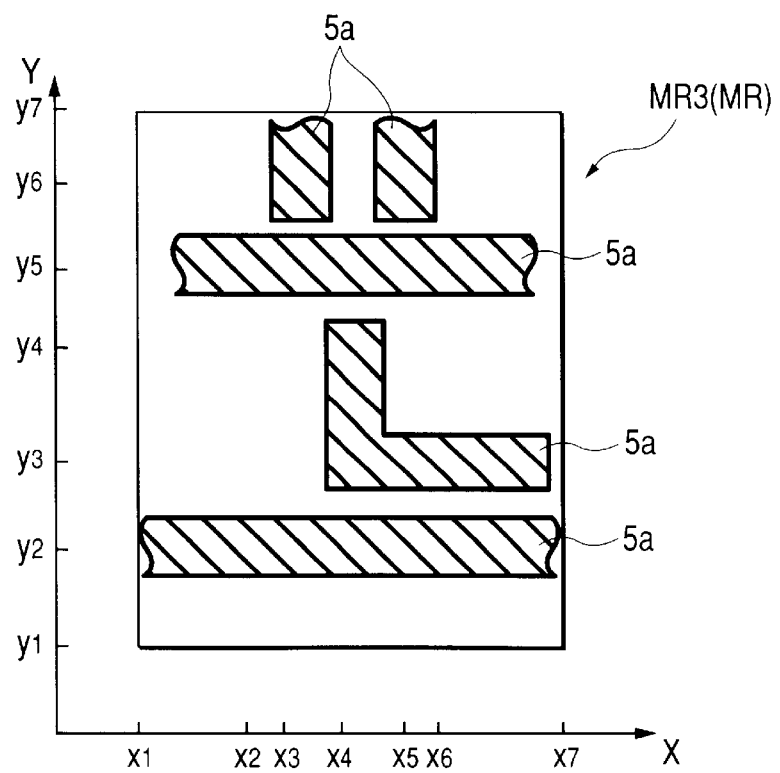
FIG. 18(b) is a detailed plan view of an example of the photomask used for printing a line pattern of the NAND gate in FIG. 17.

FIG. 18(b) shows a pattern of a mask MR3(MR) for printing the wires 13A to 13D in FIG. 17(c) onto the wafer 1W. The opaque pattern 5a here is also formed of a stacked or layered set of the photoabsorptive organic layer 3a and the resist layer 4a. The opaque patterns 5a are used for forming the wires 13A to 13D.

The following describes processes of manufacturing a semiconductor integrated circuit device using the masks MR2, and MR3 with reference to FIGS. 19 to 23. These figures are cross sectional views taken along the broken line in FIG. 17(c).

Figure 19:
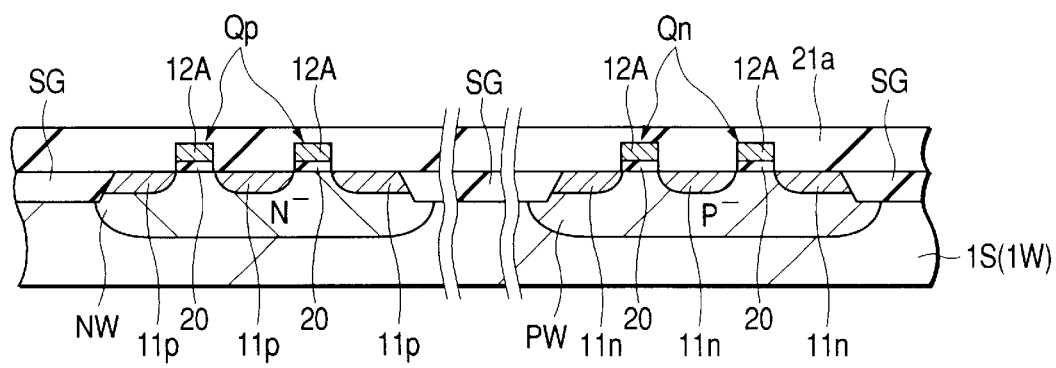
FIG. 19 is a detailed sectional view during a manufacturing process of the semiconductor device for forming the NAND gate circuit in FIG. 17.
Figure 20:
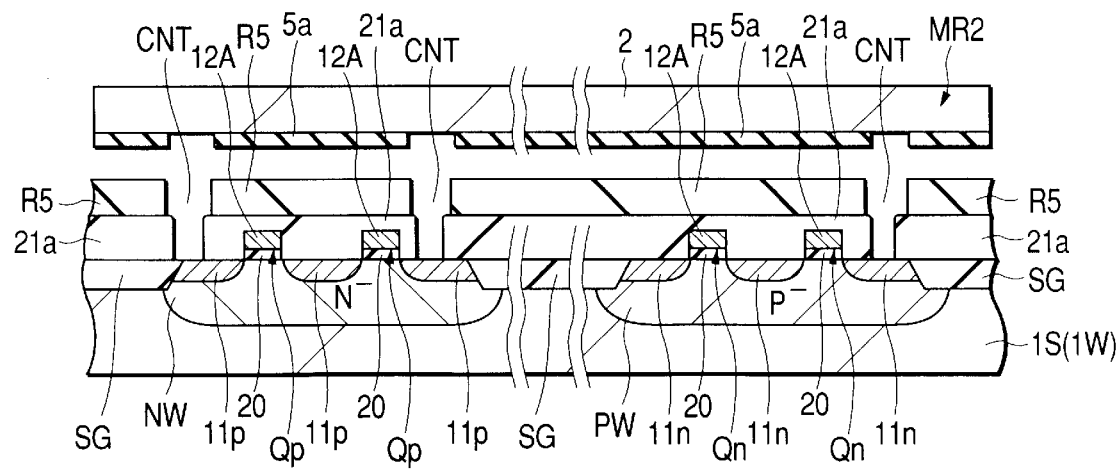
FIG. 20 is a detailed sectional view following FIG. 19 during a manufacturing process of the semiconductor device.

First, nMIS Qn and pMIS Qp transistors are formed on the principal surface of the wafer 1W as mentioned above. Then, the CVD method or the like is used to deposit an inter-layer insulation layer 21a comprising a phosphorus-doped silicon oxide film on that principal surface (FIG. 19). A resist layer is coated on the inter-layer insulation layer 21a. Then, an exposure process is performed by using the mask MR2 to form a pattern for a resist layer R5(R) so as to expose a flat and approximately circular area for contact hole formation and cover the other areas. Thereafter, the pattern for the resist layer R5 is used as an etching mask to form contact holes CNT on the inter-layer insulation layer 21a (FIG. 20).

Figure 21:
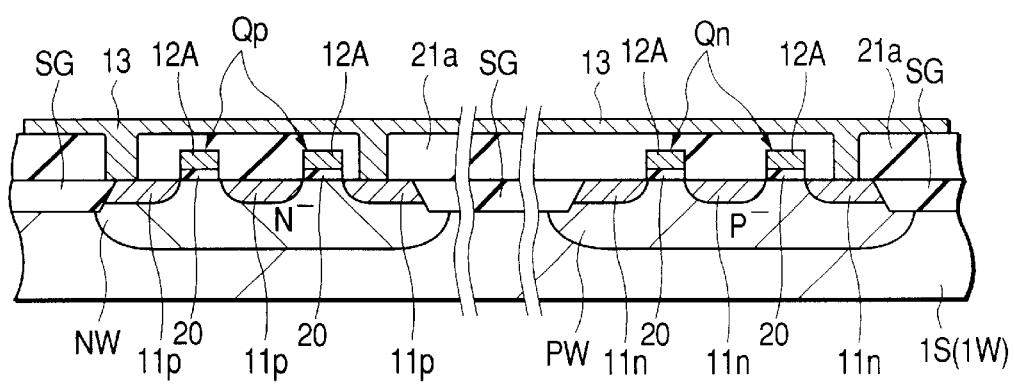
FIG. 21 is a detailed sectional.,view following FIG. 20 during a manufacturing process of the semiconductor device.
Figure 22:
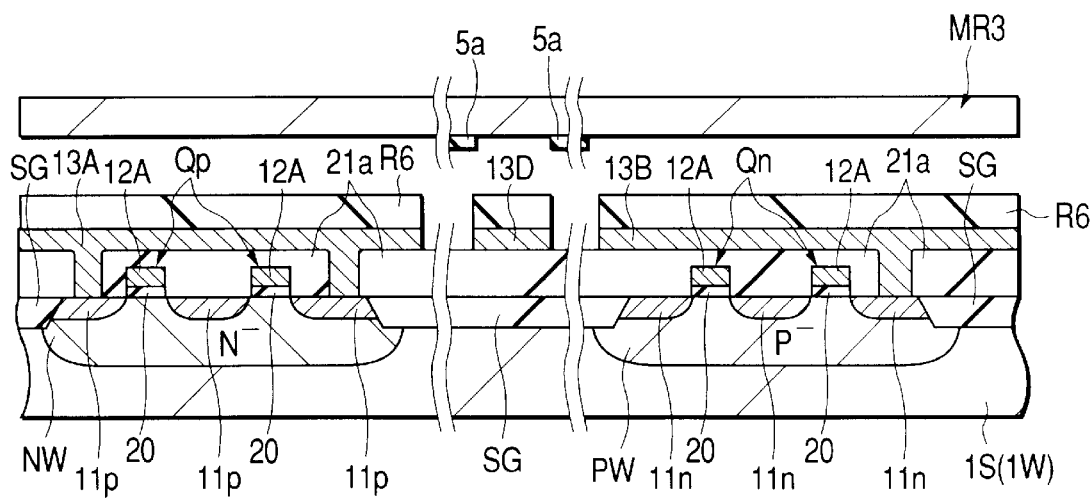
FIG. 22 is a detailed sectional view following FIG. 21 during a manufacturing process of the semiconductor device.

The pattern for the resist layer R5 is removed. Then, the sputtering or the like is used to deposit a conductive layer 13 such as aluminum, aluminum alloy, copper, or the like on the principal surface of the wafer 1W (FIG. 21). A resist layer is coated on the conductive layer 13. Then, an exposure process is performed using the mask MR2 to form a pattern for a resist layer R6(R) so as to cover the wire formation area and expose the other areas. Thereafter, the pattern for the resist layer R6 is used as an etching mask to etch the conductive layer 13 and form wires 13A to 13D (FIG. 22). For example, a positive-type pattern is used for the resist layers R5 and R6.

Figure 23:
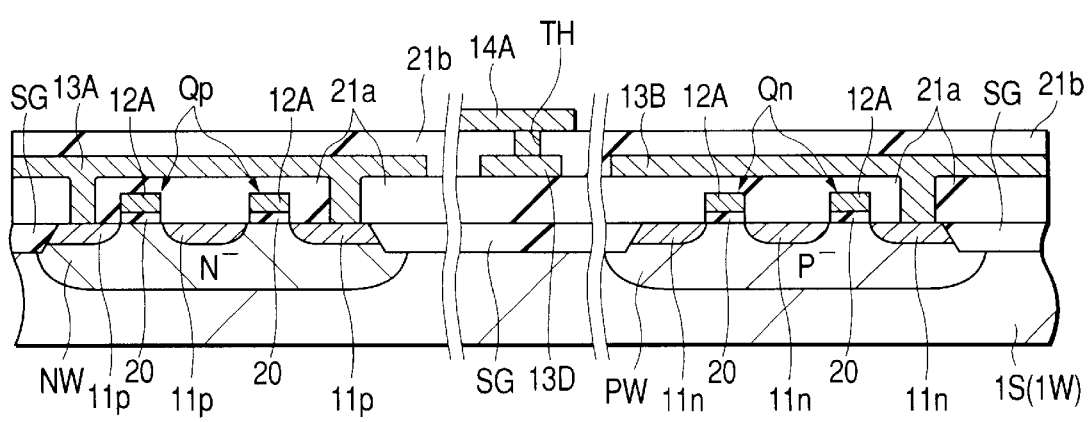
FIG. 23 is a detailed sectional view following FIG. 22 during a manufacturing process of the semiconductor device.

Subsequently, the CVD method or the like is used to deposit an inter-layer insulation layer 21b on the principal surface of the wafer 1W. Further, another mask is used to form a through-hole TH and a wire 14A for an upper layer (FIG. 23). Similar processes for pattern formation are repeated as needed to provide wire connection between parts, fabricating the semiconductor integrated circuit device.

The above description provides an example of fabricating the NAND gate circuit with two inputs. It is also possible to easily fabricate a NOR gate circuit by changing pattern shapes for the masks MR2 and MR3 in FIG. 18. Namely, the ordinary masks MK1 to MK4 are used to manufacture many unit cells 10 in FIG. 5 as a common pattern. The contact holes CNT, the through-hole TH, the wires 13A to 13D, 14A, and the like formed thereon are subject to changes in shapes according to a desired logical circuit. The above-mentioned contact holes CNT and the like are manufactured by using the masks MR (MR2 and MR3) whose opaque pattern comprises the organic material (a stacked or layered set of the photoabsorptive organic layer and the resist layer).

The above-mentioned method makes it possible to efficiently manufacture and operate masks used for a series of processes of manufacturing a semiconductor integrated circuit device. For example, the KrF excimer laser beam is used for exposure here. This method is also applicable to exposure of the i-line by adjusting absorbance characteristics of the photoabsorptive organic layer 3a so that the wavelength of 365 nm provides a large absorbance. FIG. 24 shows absorbance characteristics of the photoabsorptive organic layer 3a for the i-line. It is understood that the wavelength of 365 nm provides a large extinction coefficient. A mask using an organic layer as the opaque has been just applicable to exposure light with the wavelength of 200 nm or shorter. However, the present invention enables good printing by using exposure light with the wavelength of 248 or 365 nm. This method allows simple processes of manufacturing masks MR, short TAT for mask manufacturing, and low manufacturing cost The method also fabricates the semiconductor integrated circuit device at a low cost and shortens the development TAT.

Embodiment 2

This embodiment describes how the technological concept of the present invention is applied to the manufacture of mask ROM chips.

The mask ROM is characterized by providing large-capacity memory because single MIS forms a memory cell and simplifying the entire circuit configuration because no write operation is needed. However, there are problems, too. For example, the mask ROM requires the longer TAT than other ROM chips such as EEPROM (Electric Erasable Programmable Read Only Memory) because memory contents depend on customer requests. Further, different masks must be created according to various customer-based ROM codes, increasing product costs for a small-lot production. In this embodiment, various mask ROM chips with different write data were fabricated as follows. The above-mentioned ordinary mask is used to print a pattern of base data comprising a basic configuration section common to various mask ROM chips. In order to rewrite data, the above-mentioned resist mask is used to print a pattern for the memory cell area.

Figure 25A:
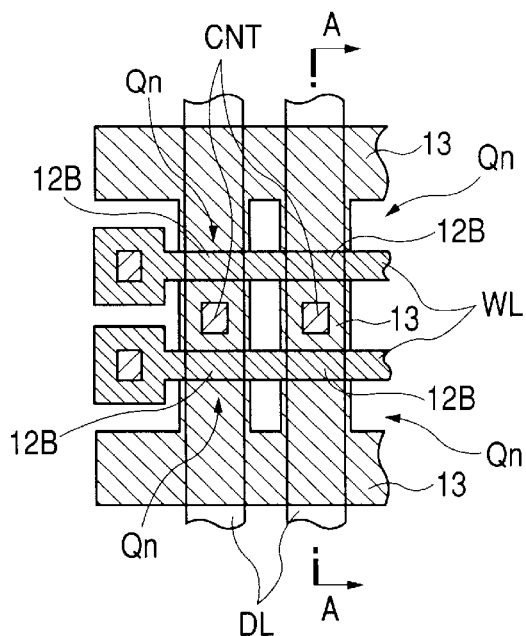
FIG. 25(a) is a detailed plan view of a memory area on the mask ROM as a semiconductor device according to another embodiment of the present invention.
Figure 25B:
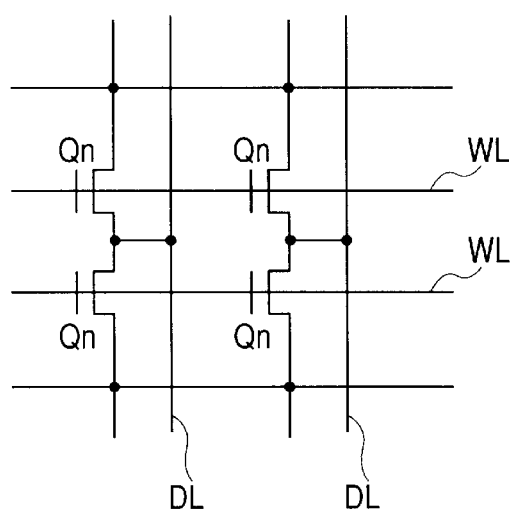
FIG. 25(b) is a circuit diagram of the memory area in FIG. 25(a)
Figure 25C:
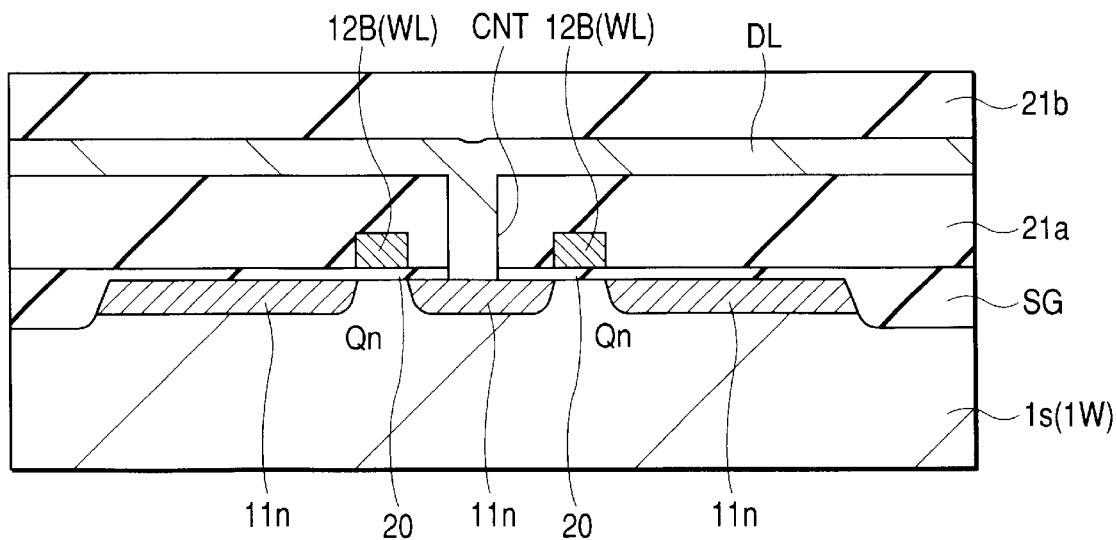
FIG. 25(c) is a cross sectional view taken on the line A—A of FIG. 25(a)

FIG. 25 shows mask ROM base data. FIG. 25(a) is a plan view of a memory cell area layout. FIG. 25(b) is a circuit diagram of the memory cell area. FIG. 25(c) is a cross sectional view taken on the line A—A of FIG. 25(a). The example here shows the mask ROM according to the ion implantation program method. A data line DL is electrically connected to an n-type semiconductor area 11n via a contact hole CNT. Part of a word line WL forms a gate electrode 12B. There is an nMIS Qn transistor near an intersection point between the data line DL and the word line WL. This single nMIS Qn forms one memory cell. The ion implantation program method fabricates different types of mask ROM depending on whether or not to implant impurities into a channel area for nMIS Qn constituting the memory cell. These types of mask ROM are characterized by a high threshold voltage and a low threshold voltage for nMIS Qn. The high threshold voltage type corresponds to information "0" and remains off even if the word line WL is set to the high level. The low threshold voltage type corresponds to information "1" and turns on when the word line WL is set to the high level. The above-mentioned ordinary mask is used for printing this base data pattern.

This common base data is used to fabricate three types of mask ROM for a required amount as shown in FIGS. 26 to 28. In each of these figures, (a) is a detailed plan view of an integrated circuit pattern area on the mask used; (b) is a layout plan view of a mask ROM's memory cell area showing a data writing pattern; and (c) is a sectional view taken along the line A—A in FIG. 25(a) during a process of writing data.

Figure 26A:
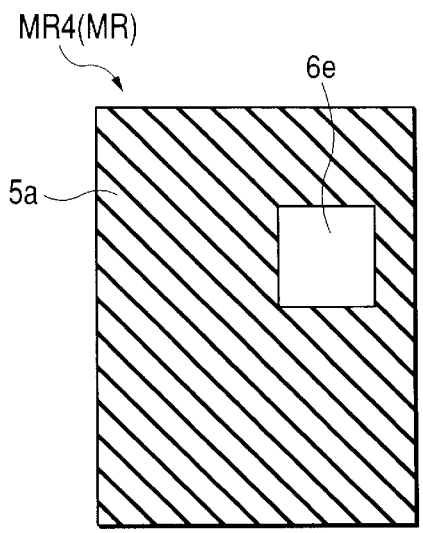
FIG. 26(a) is a detailed plan view of an example of the photomask used for rewriting data on the mask ROM in FIG. 25.
Figure 26B:
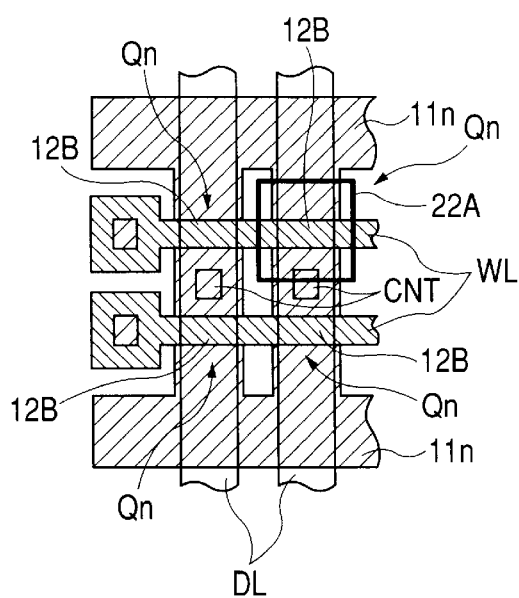
FIG. 26(b) is a detailed plan view of a semiconductor wafer showing a data rewriting pattern printed through the photomask in FIG. 26(a)
Figure 26C:
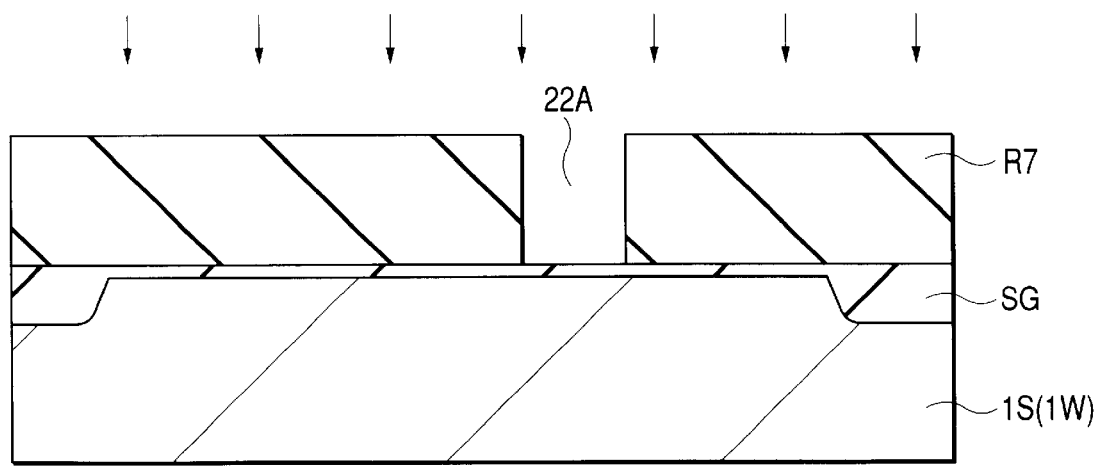
FIG. 26(c) is a detailed sectional view of the semiconductor wafer during a process of rewriting data.

A mask MR4(MR) in FIG. 26(a) is used to form an aperture pattern 22A in FIG. 26(b) on the database. FIG. 26(c) shows how data is written by ion-implanting impurities in a semiconductor substrate 1S exposed from the aperture pattern 22A. The mask MR4 is the above-mentioned resist mask. As mentioned above, its opaque pattern 5a also comprises a stacked or layered set of the photoabsorptive organic layer 3a and the resist layer 4a. A flat square clear pattern 6e forms the aperture pattern 22A for the resist layer R7(R) on the wafer 1W. In this example, the pattern for the resist layer R7 is used as an impurity implantation mask to implant impurities for data writing into one nMIS Qn channel area. An impurity implantation process for data writing should occur before formation of the gate electrode 12B, namely the work line WL. As impurities, boron is implanted to increase a nMIS Qn threshold value. Phosphorus or arsenic is implanted to decrease that value.

Figure 27A:
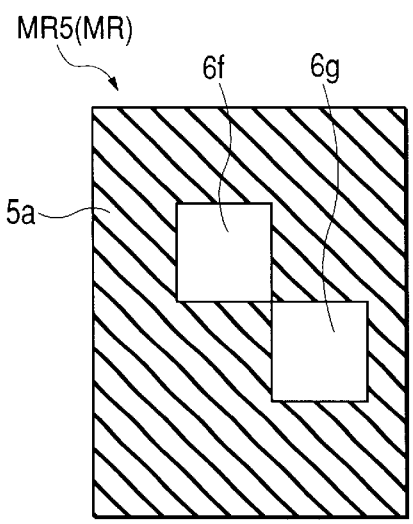
FIG. 27(a) is a detailed plan view of another example of the photomask used for rewriting data on the mask ROM in FIG. 25.
Figure 27B:
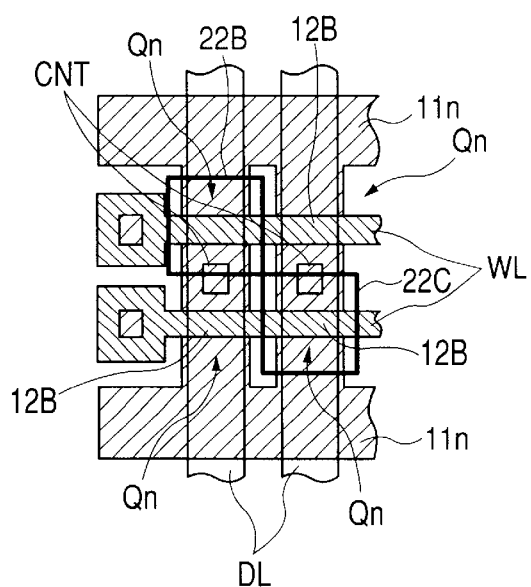
FIG. 27(b) is a detailed plan view of a semiconductor wafer showing a data rewriting pattern printed through the photomask in FIG. 27(a)
Figure 27C:
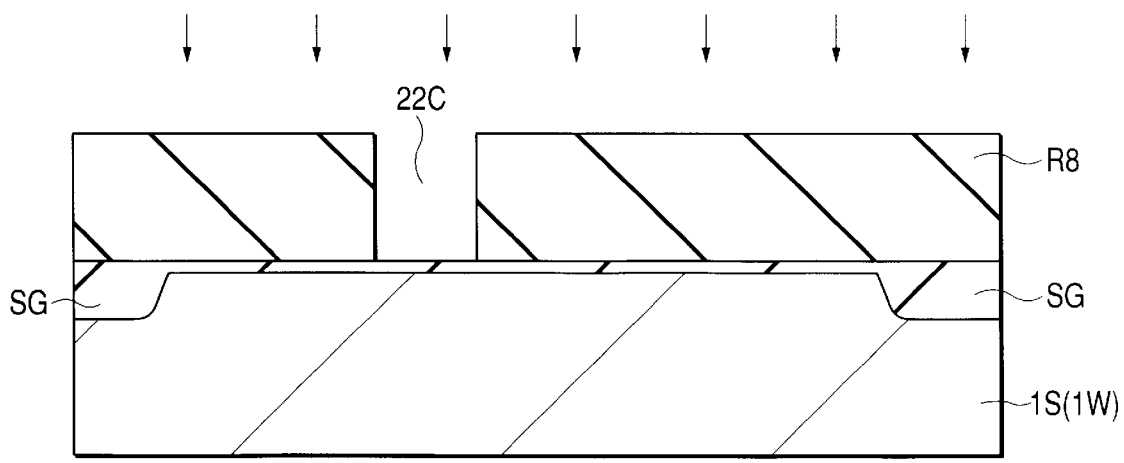
FIG. 27(c) is a detailed sectional view of the semiconductor wafer during a process of rewriting data.

Then, a mask MR5(MR) in FIG. 27(a) is used to form aperture patterns 22B and 22C in FIG. 27(b) on the database. FIG. 27(c) shows how data is written by ion-implanting impurities in a semiconductor substrate 1S exposed from the aperture patterns 22B and 22C. The mask MR5 is the above-mentioned resist mask. Two flat rectangular clear patterns 6f and 6g are opened. The clear patterns 6f and 6g form two aperture patterns 22B and 22C for a resist layer R8(R) on the wafer 1W. In this example, the pattern for the resist layer R8 is used as an impurity implantation mask to implant impurities for data writing into two nMIS Qn channel areas.

Figure 28A:
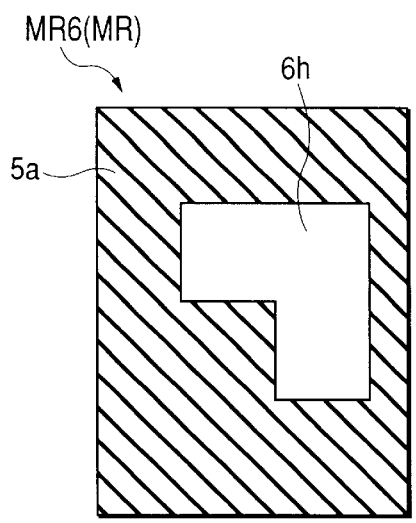
FIG. 28(a) is a detailed plan view of yet another example of the photomask used for rewriting data on the mask ROM in FIG. 25.
Figure 28B:
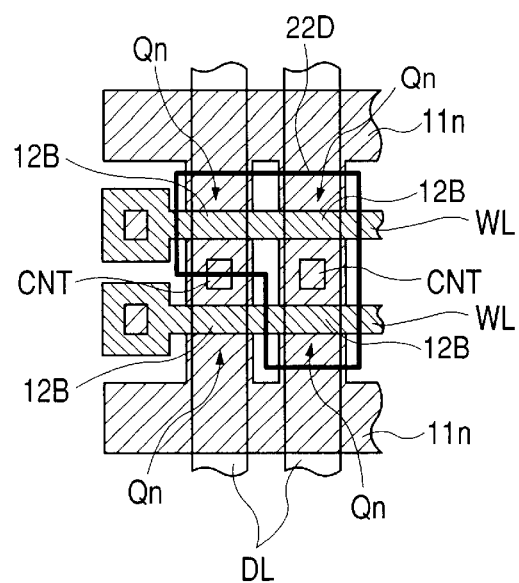
FIG. 28(b) is a detailed plan view of a semiconductor wafer showing a data rewriting pattern printed through the photomask in FIG. 28(a)
Figure 28C:
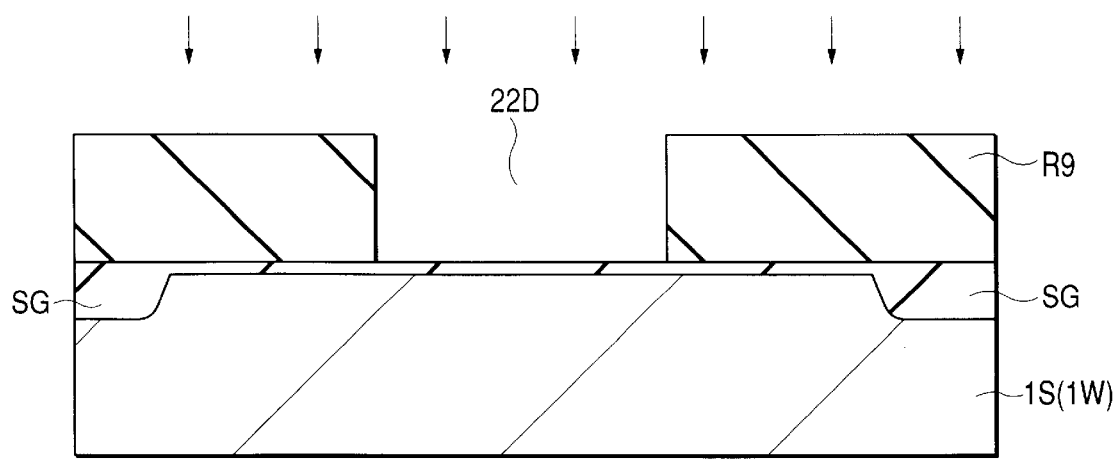
FIG. 28(c) is a detailed sectional view of the semiconductor wafer during a process of rewriting data.

Then, a mask MR6(MR) in FIG. 28(a) is used to form an aperture pattern 22D in FIG. 28(b) on the database. FIG. 28(c) shows how data is written by ion-implanting impurities in a semiconductor substrate 1S exposed from the aperture pattern 22D. The mask MR6 is the resist mask. A clear pattern 6h forms the aperture pattern 22D for the resist layer R9 on the wafer 1W. In this example, the pattern for the resist layer R7 is used as an impurity implantation mask to implant impurities for data writing into one nMIS Qn channel area. For example, a positive-type pattern is used for the resist layers R7 to R9.

The above-mentioned processes from data rewriting up to device mounting are same as those for the manufacturing process of ordinary semiconductor integrated circuit devices. In this example, the size of aperture patterns 22A to 22D each is, for example, 0.8 ⌐m (converted on the wafer). Based on this, the g-line exposure (wavelength of 436 nm) is used for forming these aperture patterns.

As mentioned above, it has become possible to manufacture various types of mask ROM efficiently as follows. Namely, an ordinary mask is used for patterning in order to create base data. A mask for forming the rewrite layer is a resist mask having the above-mentioned opaque pattern comprising a layered set of the photoabsorptive organic layer and the resist layer. It has become possible to greatly shorten the TAT for developing and manufacturing various types of mask ROM. It has become possible to rewrite data using an existing apparatus. It has become possible to save material, process, and fuel costs. Accordingly, it has become possible to greatly save mask ROM costs for a small-lot production.

This embodiment has described the case of configuring the entire rewrite layer pattern with an organic layer (a layered set of the photoabsorptive organic layer and the resist layer or a single photoabsorptive organic layer) in the resist mask. The present invention is not limited thereto. Of patterns on the rewrite layer, it may be preferable to use an organic layer for configuring patterns to be modified and use a metal layer such as chromium for configuring the other patterns which need not to be modified. In this case, it is possible to shorten the time for writing patterns during the mask manufacture by decreasing an area of the opaque section comprising the organic layer on the mask. Consequently, it is possible to shorten the time for manufacturing the resist mask.

Embodiment 3

This embodiment 3 is a modification of the above-mentioned embodiment 2. Embodiment 3 explains a case of applying the present invention to a method of manufacturing the mask ROM according to the data rewriting system which differs from the above-mentioned embodiment 2.

Figure 29A:
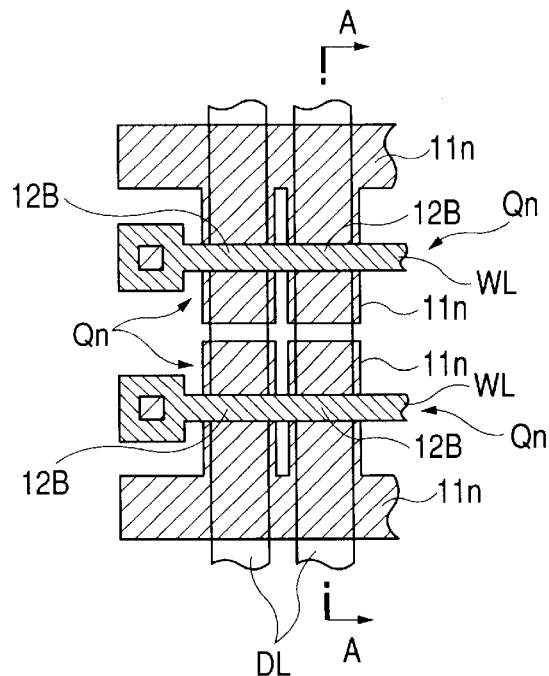
FIG. 29(a) is a detailed plan view of a memory area on the mask ROM of another system as a semiconductor device according to another embodiment of the present invention.
Figure 29B:
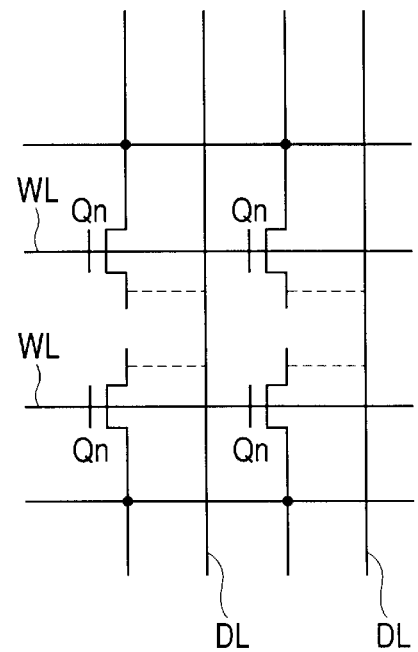
FIG. 29(b) is a circuit diagram of the memory area in FIG. 29(a)
Figure 29C:
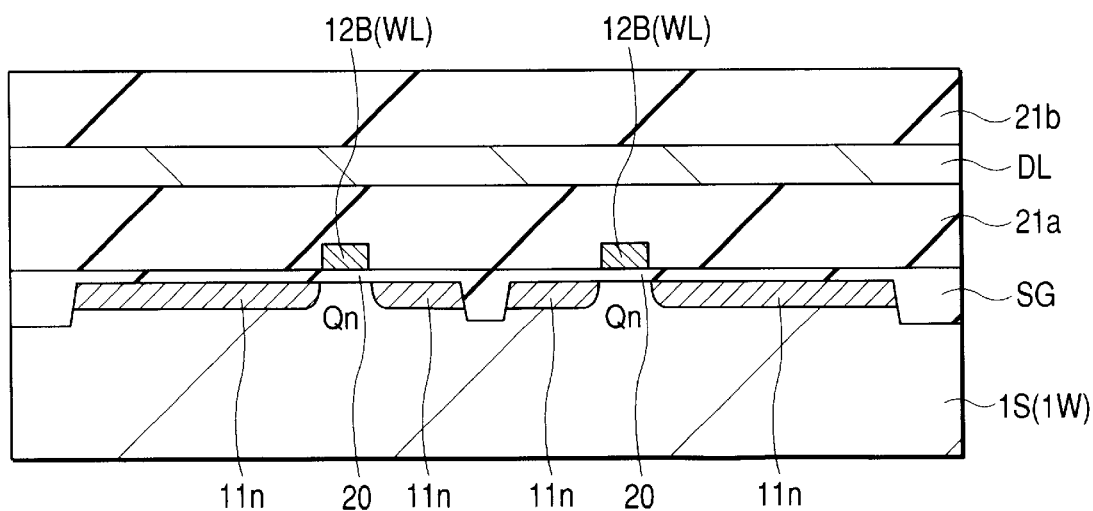
FIG. 29(c) is a cross sectional view taken on the line A—A of FIG. 29(a)

FIG. 29 shows mask ROM base data according to this embodiment. FIG. 29(a) is a layout plan view of the memory cell area. FIG. 29(b) shows its circuit diagram. FIG. 29(c) shows a cross sectional view taken on the line A—A of FIG. 29(a). This example shows mask ROM according to the contact hole program system. The mask ROM according to the contact hole program system performs programming according to a layout of a contact hole (broken lines in FIG. 29(b)) connecting between the semiconductor area 11n and the data line DL. This embodiment also uses the above-mentioned ordinary mask to print the base data pattern.

Before forming the data line DL with the base data in common, the following rewrite contact hole is formed. Then, three types of mask ROM are fabricated for a required amount. This process is described below with reference to FIGS. 30 to 32. In each of these figures, (a) is a detailed plan view of an integrated circuit pattern area on the mask used; (b) is a layout plan view of a mask ROM's memory cell area showing a data writing pattern; (c) is its circuit diagram; and (d) is a sectional view taken along the line A—A in (b).

According to the example in FIG. 30, a mask MR7(MR) in FIG. 30(a) is used to form a contact hole CNT on the database so as to expose an n-type semiconductor area 11n as shown in FIG. 30(b). Then, as shown in FIGS. 30(c) and (d), a connection is made between the semiconductor area 11n for a specified nMIS Qn transistor and the data line DL to write data. The mask MR7 is provided with the opaque pattern 5a comprising an organic layer and a plurality of flat, rectangular, and fine clear patterns 6i. The organic layer can be a stacked or layered set of the photoabsorptive organic layer 3a and the resist layer 4a or a single photoabsorptive organic layer. The clear pattern 6i is used for forming an aperture pattern for forming a contact hole CNT in the resist layer on the wafer 1W. The method of forming this contact hole CNT is same as that described for the above-mentioned embodiment 1. The description thereof is omitted.

Figure 31A:
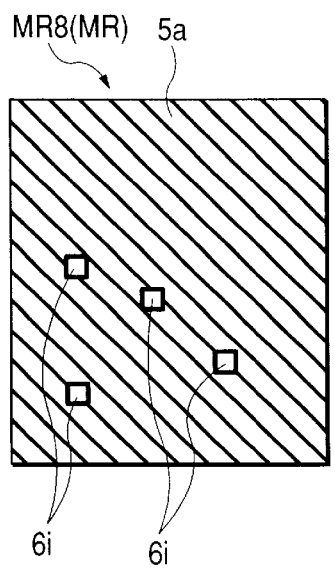
FIG. 31(a) is a detailed plan view of an example of the photomask used for rewriting data on the mask ROM in FIG. 29.
Figure 31B:
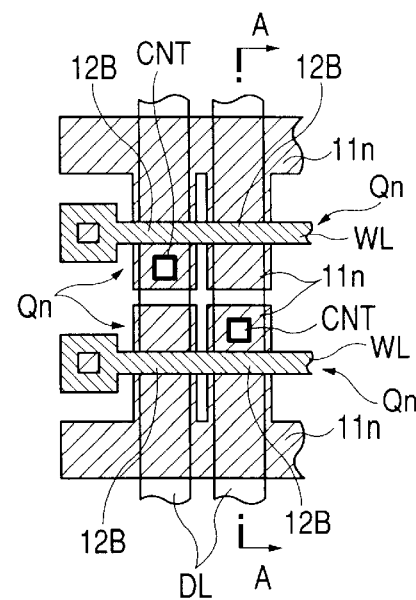
FIG. 31(b) is a detailed plan view of the memory area after data is rewritten through the use of the photomask in FIG. 31(a)
Figure 31C:
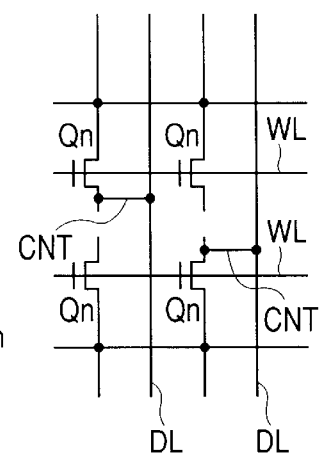
FIG. 31(c) is a circuit diagram of the memory area in FIG. 31(b)
Figure 31D:
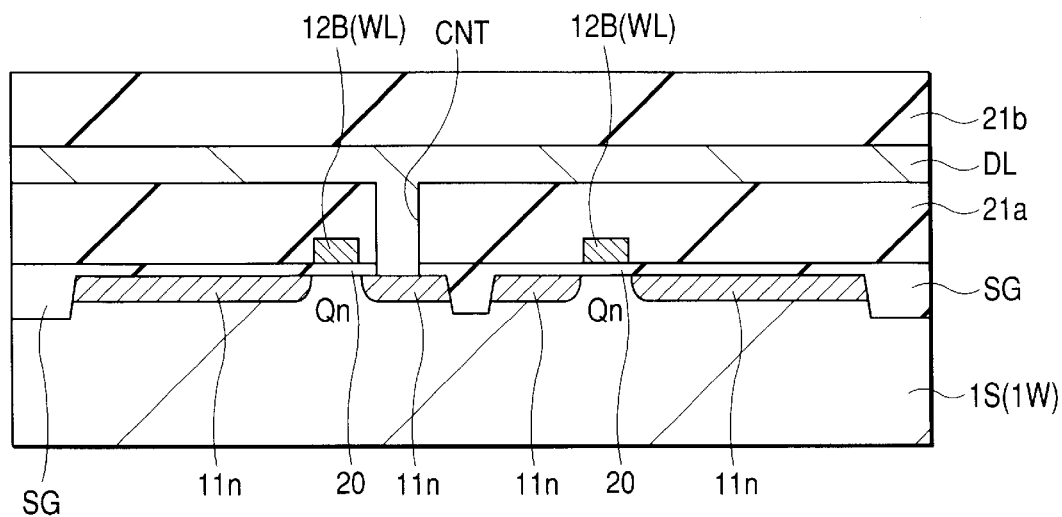
FIG. 31(d) is a cross sectional view taken on the line A—A of FIG. 31(b)

According to the example in FIG. 31, a mask MR8(MR) in FIG. 31(a) is used to form a contact hole CNT on the database as shown in FIG. 31(b). Then, as shown in FIGS. 31(c) and (d), a connection is made between the semiconductor area 11n for a specified nMISQn transistor and the data line DL at two locations to write data. The clear pattern 6i is used for printing a data writing contact hole in the mask MR8 and is arranged at two locations different from the location in FIG. 30.

Figure 32A:
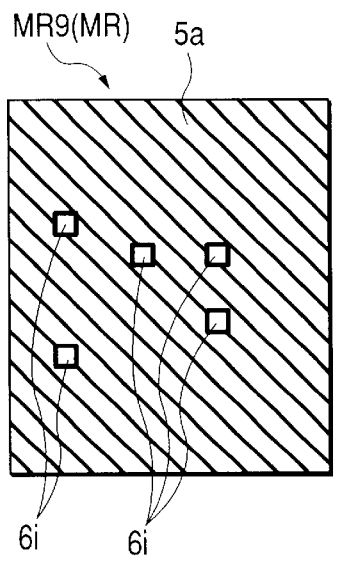
FIG. 32(a) is a detailed plan view of an example of the photomask used for rewriting data on the mask ROM in FIG. 29.
Figure 32B:
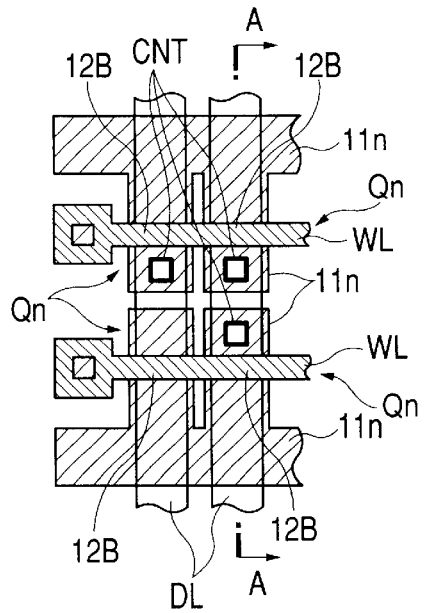
FIG. 32(b) is a detailed plan view of the memory area after data is rewritten through the use of the photomask in FIG. 32(a)
Figure 32C:
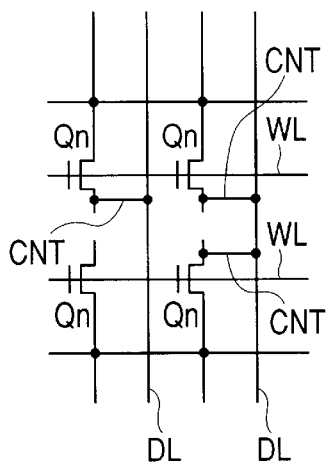
FIG. 32(c) is a circuit diagram of the memory area in FIG. 32(b)
Figure 32D:
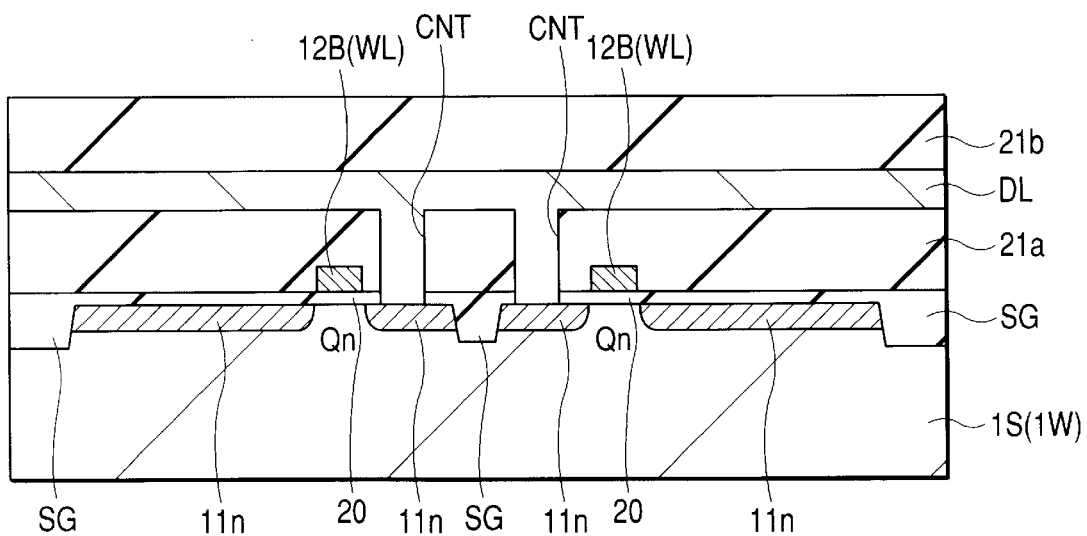
FIG. 32(d) is a cross sectional view taken on the line A—A of FIG. 32(b)

According to the example in FIG. 32, a mask MR9(MR) in FIG. 32(a) is used to form a contact hole CNT on the database as shown in FIG. 32(b). Then, as shown in FIGS. 32(c) and (d), a connection is made between the semiconductor area 11n for a specified nMIS Qn transistor and the data line DL at three locations to write data. The clear pattern 6i is used for printing a data writing contact hole in the mask MR9 and is arranged at three locations, namely one location added to the locations in FIG. 31.

The aperture size (converted on the wafer) of the contact hole is as small as approximately 0.2 ⌴m. Accordingly, the exposure process using the masks MR7 to MR9 uses, for example, KrF excimer laser as an exposure light source.

This embodiment can provide effects equivalent to those for the above-mentioned embodiment 2.

Embodiment 4

A circuit pattern must be fined for large-scale integration and high-speed operations of the semiconductor integrated circuit device. According to this requirement, the technological development proceeds in order to shorten an exposure light wavelength. Shortening the waveform requires a rare and expensive lens material such as $CaF_2$. Moreover, optical members are subject to great irradiation damage, shortening the parts life. Hence, the short-wavelength exposure is expensive. For cost saving, it is desirable to apply the short-wavelength exposure to processes for which fining patterns are more advantageous than a cost increase and to apply more economical exposures to the other processes.

This embodiment changes exposure light sources for an exposure process during a manufacturing process of semiconductor integrated circuit devices according to integrated circuit patterns and an economical viewpoint. Namely, when exposing an integrated circuit pattern, the exposure process is performed by selectively using a g-line, an i-line, a KrF excimer laser, or an ArF excimer laser for the exposure light source according to conditions of the pattern (such as a size, adjacent pitch, shape, accuracy, requested electrical characteristics, etc.) and an economical viewpoint.

Figure 33A:
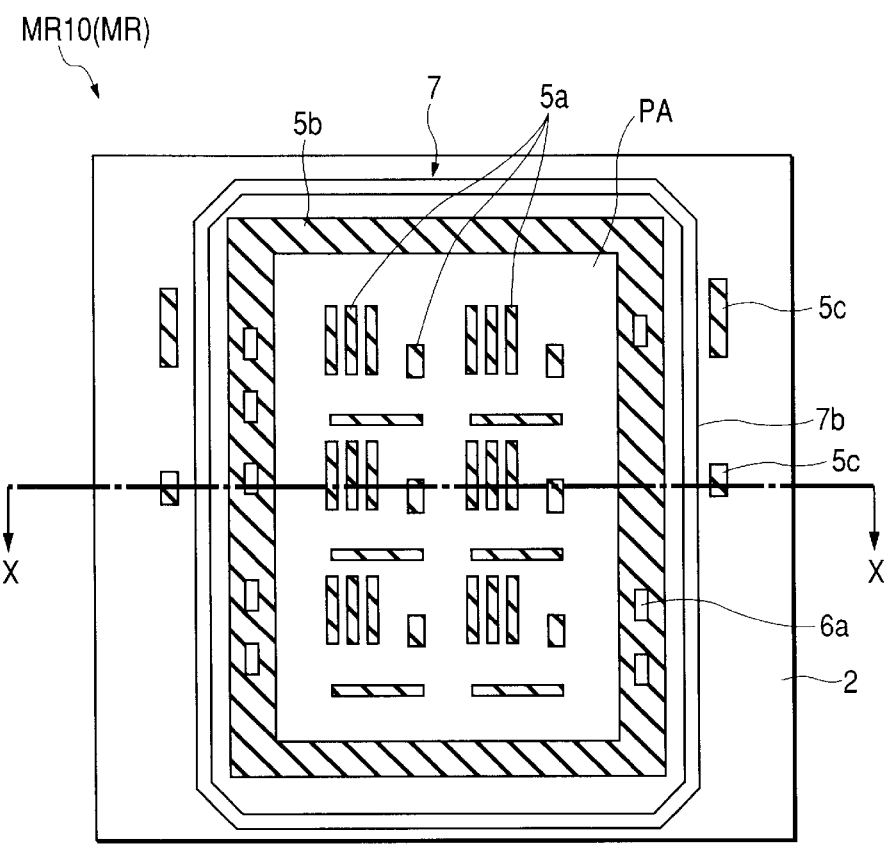
FIG. 33(a) is an overall plan view of a photomask used for the exposure during a manufacturing process of a semiconductor device according to another embodiment of the present invention.
Figure 33B:
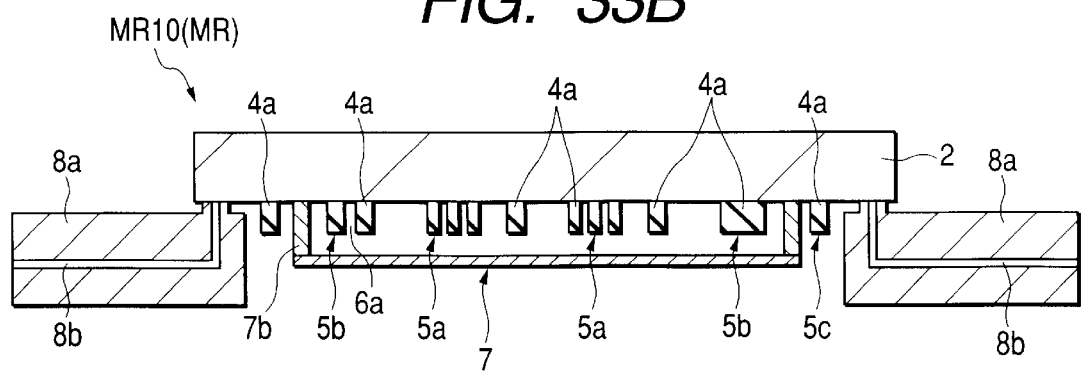
FIG. 33(b) is a cross sectional view taken on the line X—X of FIG. 33(a) when the photomask in FIG. 33(a) is mounted on a photolithography machine.

First, the following describes a resist mask for ArF excimer laser used in this embodiment. FIG. 33 shows a mask MR10(MR) as an example. FIG. 33(a) is an overall-plan view of the mask MR10. FIG. 33(b) is a cross sectional view taken on the line X—X of FIG. 33(a) when the mask MR10 is mounted on a photolithography machine.

For simplifying the description, FIG. 33 shows the mask MR10 with almost the same structure as for the mask MR1 in FIG. 2 for the above-mentioned embodiment 1. The mask MR10 (FIG. 33) structurally differs from the mask MR1 (FIG. 2) in that opaque-patterns 5a to 5c for the mask MR10 are formed of a single resist layer 4a. The resist layer 4a comprises, for example, resist resin for completely absorbing electron beams. The following is a chemical formula example for this resin.

Figure 34:
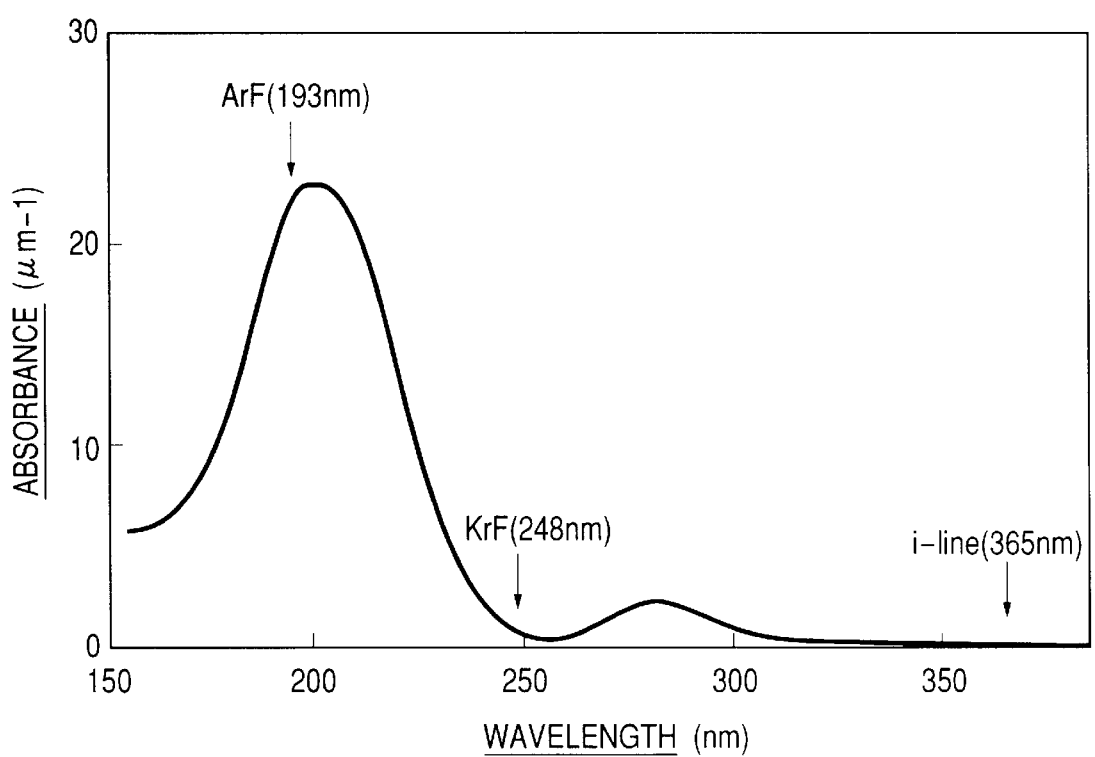
FIG. 34 is a graph showing absorbance characteristics of a resist layer.

FIG. 34 shows optical absorption characteristics of this resist resin. As seen from this figure, the resin shows a very strong absorbance of $20/\mu m$ or more against the ArF excimer laser beam with the wavelength of 193 nm. Namely, the mask MR10 in FIG. 33 exemplifies a resist mask optimally applicable to the exposure process using the ArF excimer laser beam as an exposure light source. Also when the resist layer 4a uses novolac resin as a base resin, characteristics are almost the same as in FIG. 34.

According to this embodiment, the resist layer 4a ensures sufficient opaqueness for exposure light with the wavelength of 200 nm or shorter. Accordingly, the mask MR10 having the resist layer 4a as the opaque is used for the exposure using the light with the wavelength of 200 nm or shorter. In this case, a process of coating a photoabsorptive organic layer becomes unneeded. No process for the photoabsorptive organic layer decreases factors to degrade the accuracy of pattern formation. Compared to ordinary masks, no process is needed for applying and processing a metal layer, eliminating factors to degrade the accuracy of pattern formation due to metal layer processing. Consequently, the mask cost decreases and the pattern accuracy increases. Especially, the pattern accuracy is critical to gate electrodes. The capability to form a mask opaque by using the resist layer only is particularly effective for manufacturing semiconductor integrated circuits.

Then, with reference to FIGS. 35 to 38, the following describes how the technological concept of the present invention is applied to a process of manufacturing a semiconductor integrated circuit device having a twin-well CMIS (Complimentary MIS) circuit.

Figure 35:
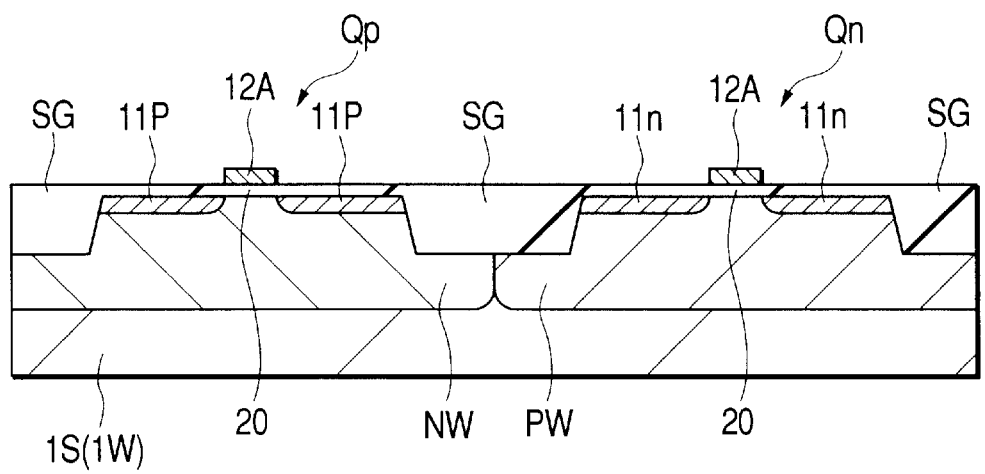
FIG. 35 is a detailed sectional view during a manufacturing process of the semiconductor device according to another embodiment of the present invention.

FIG. 35 is a detailed sectional view of the wafer 1W during the manufacturing process. This figure shows that pMISQp and nMISQn are formed in an element formation area enclosed in an isolation area SG. This embodiment uses the ArF excimer laser reduction stepper as a photolithography machine and a resist mask with the same structure as for the mask MR10 in FIG. 33 during the exposure for patterning the gate electrodes 12A of pMIS Qp and nMIS Qn.

The gate insulation layer 20 is formed on the principal surface of the wafer LW. On this layer, the CVD method or the like is used to deposit a gate formation layer comprising low-resistance polysilicon, then to deposit a resin layer in order. On this resist layer, for example, an ArF excimer laser beam is used as exposure light for the exposure process to print a mask pattern of the relevant resist mask. A developing process is then applied to the resist layer to form a resist pattern. The resist pattern is used as an etching mask to remove the gate formation layer exposed therefrom by etching, thus forming the gate electrode 12A. Especially, the resist mask using the single resist layer 4a as an opaque can eliminate an etching process for a metal layer such as chromium, etc. Compared to an ordinary mask, the resist mask can increase the dimensional accuracy of patterns on the mask. Accordingly, it has become possible to form the gate electrode 12A with the high dimensional accuracy of patterns.

The pattern for the resist layer is used as a mask for forming the n-type well area NW, the p-type well area PW, the n-type semiconductor area 11n, and the p-type semiconductor area 11p. It may be preferable to form this pattern by means of the exposure process using an i-line reduction stepper and the mask MR1 described in the above-mentioned embodiment 1 with reference to FIG. 2, etc. In these cases, the resist layer uses relatively large patterns. It is possible to decrease the total cost by using the i-line exposure which provides lower costs than for an exposure using the ArF or KrF excimer laser.

Figure 36:
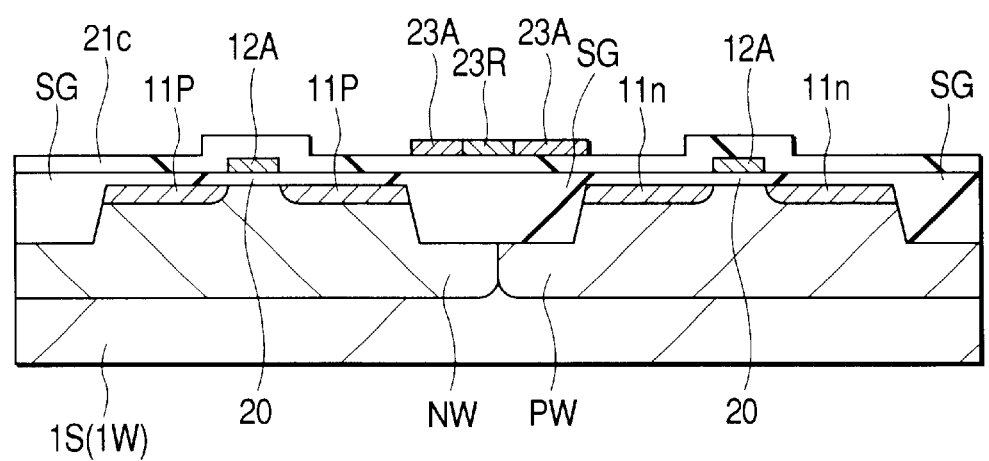
FIG. 36 is a detailed sectional view following FIG. 35 during a manufacturing process of the semiconductor device.

As shown in FIG. 36, the CVD method or the like is used to deposit the inter-layer insulation layer 21c comprising a silicon oxide film on the principal surface of the wafer 1W, and then to deposit a polysilicon layer thereon. A resist layer is then deposited on this polysilicon layer. Thereafter, the resist layer is lithographed by using a KrF excimer laser reduction stepper and the mask MR1 (see FIG. 2) with an opaque comprising a layered set of the photoabsorptive organic layer 3a and the resist layer 4a as described in the above-mentioned embodiment 1. A mask pattern of the relevant resist mask is printed on the resist layer. The resist pattern is used as an etching mask to remove the exposed polysilicon layer by etching and to form a wire 23A and a resistor 23R.

Here, the requested pattern dimension and dimensional accuracy are less strict than those for the gate electrode 12A. Costs are reduced by using the KrF excimer laser exposure which needs a lower exposure cost than the ArF excimer laser exposure. It is necessary to consider the required minimum dimension, the required dimensional accuracy, and costs for the process when determining whether to use the ArF excimer laser exposure or the KrF excimer laser exposure. For the i-line exposure or the KrF excimer laser exposure, just using the resist layer makes it difficult to provide sufficient opaqueness. Sufficient opaqueness was obtained by using the opaque comprising a layered set of the photoabsorptive organic layer 3a and the resist layer 4a as shown in FIG. 2, etc.

For example, the KrF excimer laser exposure has the following characteristics. First, a KrF excimer laser beam provides higher light transmissivity for the resist layer on the wafer 1W than an ArF excimer laser beam. For this reason, it is possible to use a relatively thick resist layer, for example, approximately 0.8 $\mu$m thick on the wafer 1W. Accordingly, it is desirable to use the KrF excimer laser beam when processing a thick layer or forming a resist mask for ion implantation. Second, the KrF excimer laser beam enables the use of phenol resin with high dry etching resistance as resist resin with respect to absorbance. This is advantageous for processing. Third, the KrF excimer laser is characterized by the long life and the high utilization rate of parts to be used. It is desirable to select the exposure light in consideration of these features.

Figure 37:
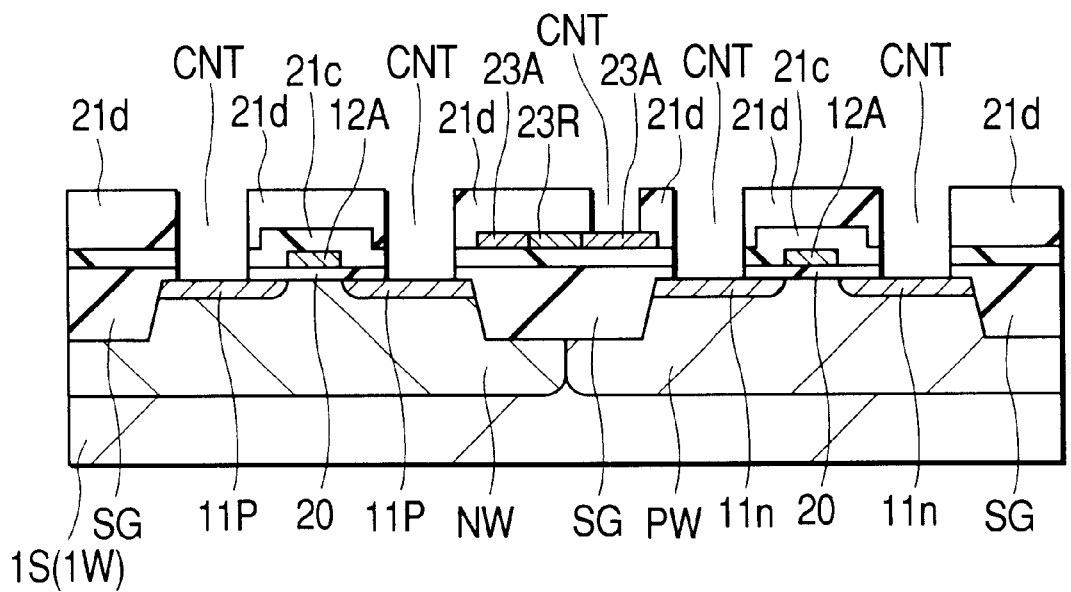
FIG. 37 is a detailed sectional view following FIG. 36 during a manufacturing process of the semiconductor device.

Thereafter, as shown in FIG. 37, the CVD method or the like is used to deposit an HLD (High Temperature Low Pressure Decomposition) layer 21d comprising a silicon oxide film on the principal surface of the wafer 1W. Then, a contact hole CNT is formed on the inter-layer insulation layer 21c and the HLD layer 21d so as to partially expose the semiconductor areas 11n and 11p, and the wire 23A. The lithography for forming the contact hole CNT uses the KrF excimer laser reduction stepper and the mask MR1 with an opaque comprising a stacked or layered set of the photoabsorptive organic layer 3a and the resist layer 4a.

Namely, the resist layer is deposited on the principal surface of the wafer 1W where the HLD layer 21d is already formed. Then, the exposure process is applied by using, for example, the above-mentioned resist mask and the KrF excimer laser beam as exposure light to print the mask pattern for the relevant resist mask on the resist layer. A developing process is then applied to the resist layer to form a resist pattern. The resist pattern is used as an etching mask for removing the HLD layer 21d and the inter-layer insulation layer 21c exposed therefrom by etching to form a contact hole CNT.

In this example, the KrF excimer laser exposure is used because the contact hole CNT is approximately 0.18 $\mu$m in diameter. The ArF excimer laser should be used for a diameter smaller than or equal to, for example, 0.15 $\mu$m. This is because the KrF excimer laser exposure makes it difficult to stably resolve a diameter smaller than or equal to approximately 0.15 nm. The use of the ArF excimer laser also needs to use the mask MR10 using the single resist layer 4a as an opaque shown in FIG. 33.

Figure 38:
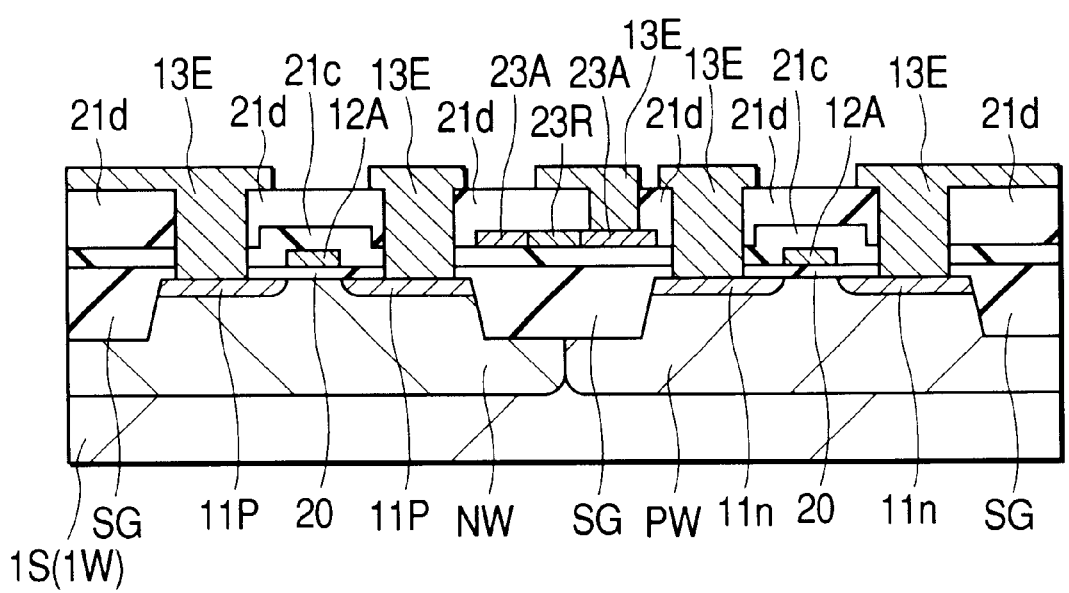
FIG. 38 is a detailed sectional view following FIG. 37 during a manufacturing process of the semiconductor device.

Then, as shown in FIG. 38, the sputtering and the CVD methods, etc. are used to consecutively deposit metal layers comprising titanium (Ti), titanium nitride (TiN), and tungsten (W) on the principal surface of the wafer 1W. The metal layer is patterned to form a wire 13E by means of lithography and dry etching. The lithography process uses the KrF excimer laser reduction stepper and the mask MR1 with an opaque comprising a stacked or layered set of the photoabsorptive organic layer 3a and the resist layer 4a described in the above-mentioned embodiment 1.

Namely, the resist layer is deposited on the principal surface of the wafer 1W where the above-mentioned metal layer is already formed. Then, the exposure process is applied by using, for example, the above-mentioned resist mask and the KrF excimer laser beam as exposure light to print the mask pattern for the relevant resist mask on the resist layer. A developing process is then applied to the resist layer to form a resist pattern. The resist pattern is used as an etching mask for removing the metal layer exposed therefrom by etching to form the wire 13E.

In this example, the KrF excimer laser exposure is used because the wire pitch is approximately 0.36 $\mu$m. However, the ArF excimer laser should be used to form a wire pitch pattern smaller than or equal to, for example, 0.30 $\mu$m. The use of the ArF excimer laser also needs to use the mask MR10 using the single resist layer 4a as an opaque shown in FIG. 33.

Subsequently, like the above-mentioned embodiment 1, a second-layer wire is formed to fabricate the semiconductor integrated circuit device.

In custom LSI (Large Scale Integrated circuit) products, a mask debug is often conducted chiefly on the first wire layer. The effective TAT for supplying masks to the first wire layer determines the product development capability and increases the number of masks needed. Applying the present invention to this process is especially effective. A second layer wire has the minimum pattern dimension of, for example, 0.35 $\mu$m (with a pattern pitch of, for example, 0.8 $\mu$m) which is sufficiently thicker than the exposure wavelength (0.248 $\mu$m). The present invention was also applied to the second layer, making it possible to shorten the TAT compared to ordinary masks. It has become possible to decrease the total cost for manufacturing a plurality of masks used for a series of processes to manufacture a semiconductor device.

Figure 39:
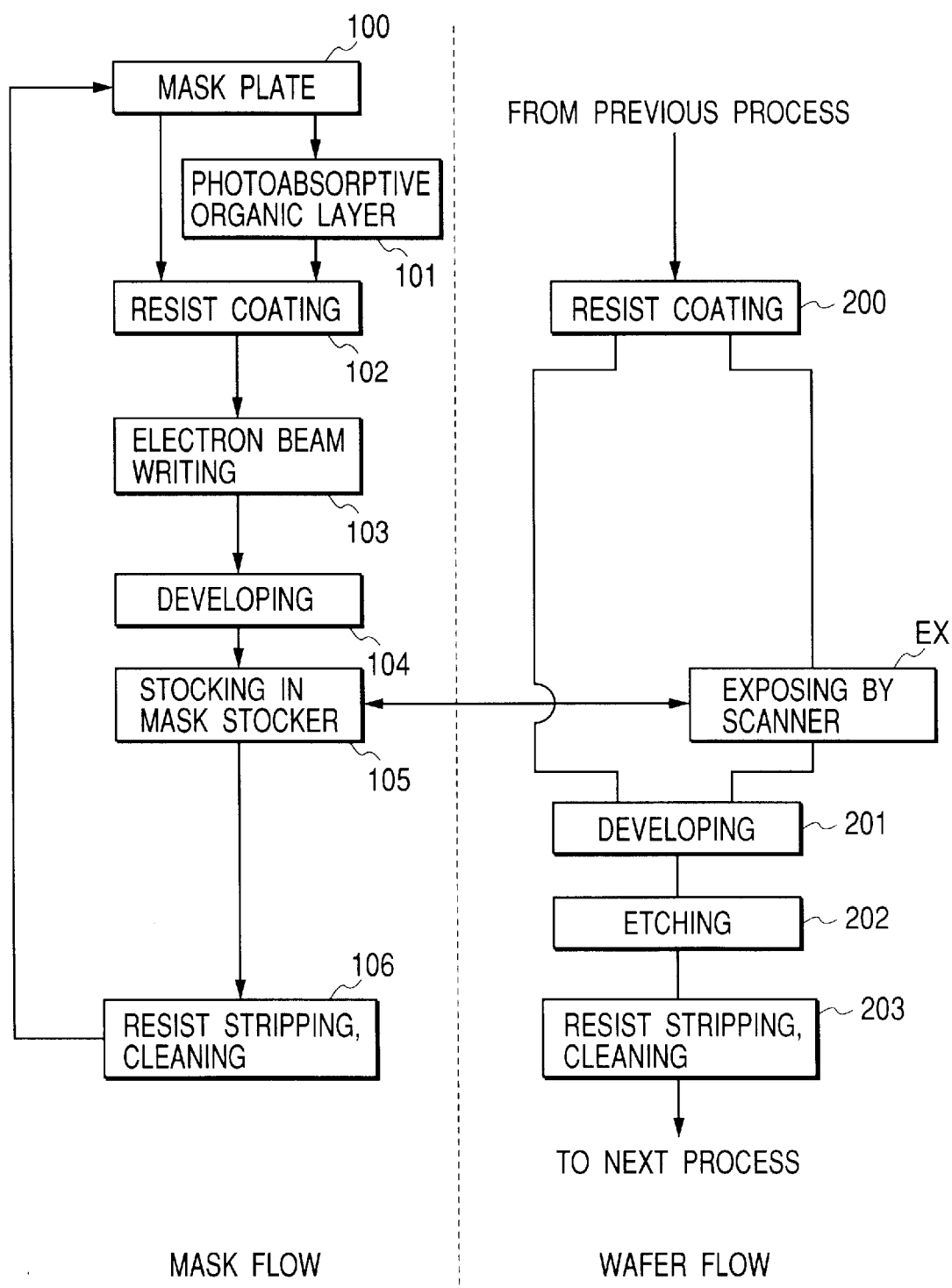
FIG. 39 is a flowchart showing processes for manufacturing a mask and semiconductor device according to another embodiment of the present invention.

The following describes a flow of mask manufacture (mask manufacturing process) and a flow of a wafer (semiconductor device manufacturing process) according to this embodiment with reference to FIG. 39. The flow in FIG. 39 is also applicable when using the resist mask described in the above-mentioned embodiments 1 to 3.

First, a mask flow (left part of FIG. 39) is described.

A mask plate 2 is prepared (process 100). The mask plate 2 is formed with a specified thickness and is made of flat, rectangular, transparent fused silica. This is a stage of mask blanks, namely no pattern formed on the first principal surface of the mask plate 2.

A resist mask to be manufactured may be used for an exposure process by using exposure light such as g-line, i-line, KrF excimer laser beam, etc. whose wavelength exceeds 200 nm. In this case, a coater is used to consecutively coat the photoabsorptive organic layer 3a and the resist layer on the first principal surface of the mask plate 2 (processes 101 and 102). On the other hand, a resist mask to be manufactured may use exposure light such as ArF excimer laser beam, etc. whose wavelength is 200 nm or shorter. In this case, the coater is used to coat only the resist layer 4a on the first principal surface of the mask plate 2 (process 102). After each layer is coated, the heat treatment is added.

For example, an electron beam writer is used to write an integrated circuit pattern onto the resist layer 4a on the first principal surface of the mask plate 2 (process 103). Then, a development apparatus is used for development (process 104). The completed resist mask is stored in a stocker (process 105). The stocked resist mask is transferred to the scanner or the stepper as needed. The used resist mask is stripped off the organic layer on the first principal surface of the mask plate 2. The organic layer comprises a stacked or layered set of the photoabsorptive organic layer 3a and the resist layer 4a or the single resist layer 4a. That resist mask is cleaned and is reused as the mask plate 2. An asher and solvent are used to remove the resist (process 106). When recycling the resist mask, the integrated circuit pattern exposure may use light with the exposure wavelength over 200 nm. In this case, the opaque pattern should be formed of a layered set of the photoabsorptive organic layer 3a and the resist layer 4a. When the integrated circuit pattern exposure uses light with the exposure wavelength of 200 nm or less such as an ArF excimer laser beam, a $F_2$ laser beam, etc., it is possible to exemplify formation of the opaque pattern using the single resist layer 4a.

Next, a wafer flow (right part of FIG. 39) is described.

After the wafer 1W is subject to film formation, etc. in the previous process (wafer process), a coater is used to coat a resist layer on the principal surface of the wafer 1W (process 200). The above-mentioned resist mask is then used to conduct a scanning exposure or a step-and-repeat exposure (process EX). The development is conducted to form a resist pattern on the principal surface of the wafer 1W (process 201). Thereafter, that resist pattern is used as mask to etch films on a lower layer (process 202) or implant impurities into the semiconductor substrate 1S, etc. Then, the wafer 1W is stripped of the resist pattern (process 203) and is cleaned to proceed the next process.

Embodiment 5

Figure 40:
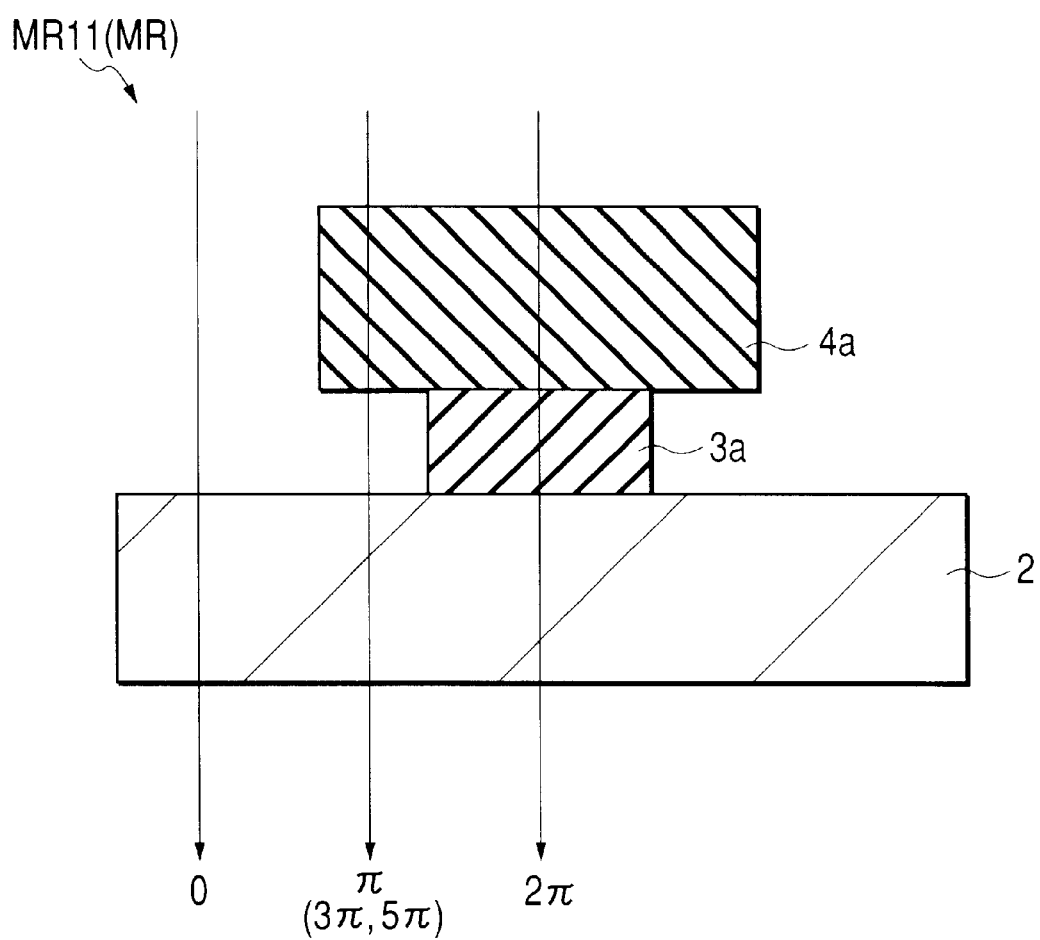
FIG. 40 is a detailed sectional view of a photomask used for the exposure during a manufacturing process of a semiconductor device according to another embodiment of the present invention.

FIG. 40 shows a detailed sectional view of a mask MR11(MR) according to this embodiment. The mask MR11 (MR) has a structure of the photoabsorptive organic layer 3a and the resist layer 4a consecutively layered on the first principal surface of the mask plate 2. This structure is same as for the mask MR1 described in the above-mentioned embodiment 1. A difference is that a pattern for the photoabsorptive organic layer 3a is thinner than that for the resist layer 4a, providing an caved structure due to the resist layer 4a. The resist layer 4a uses a half-tone pattern which dims exposure light. Namely, the mask MR11 functions as a half-tone phase shift resist mask. Here, the thickness of the resist layer 4a is set to $(2m+1)\cdot\lambda/(2n-1)$, where $\lambda$ is a exposure light wavelength, and n is a refractive index for the exposure light on the resist layer 4a. In this formula, m is an integer greater than or equal to 0. Phase differences of the exposure light transmitting respective areas are represented as 0, π (180 degrees), 3π (540 degrees), 5π (900 degrees), and 2π (360 degrees) in FIG. 40.

Figure 41:
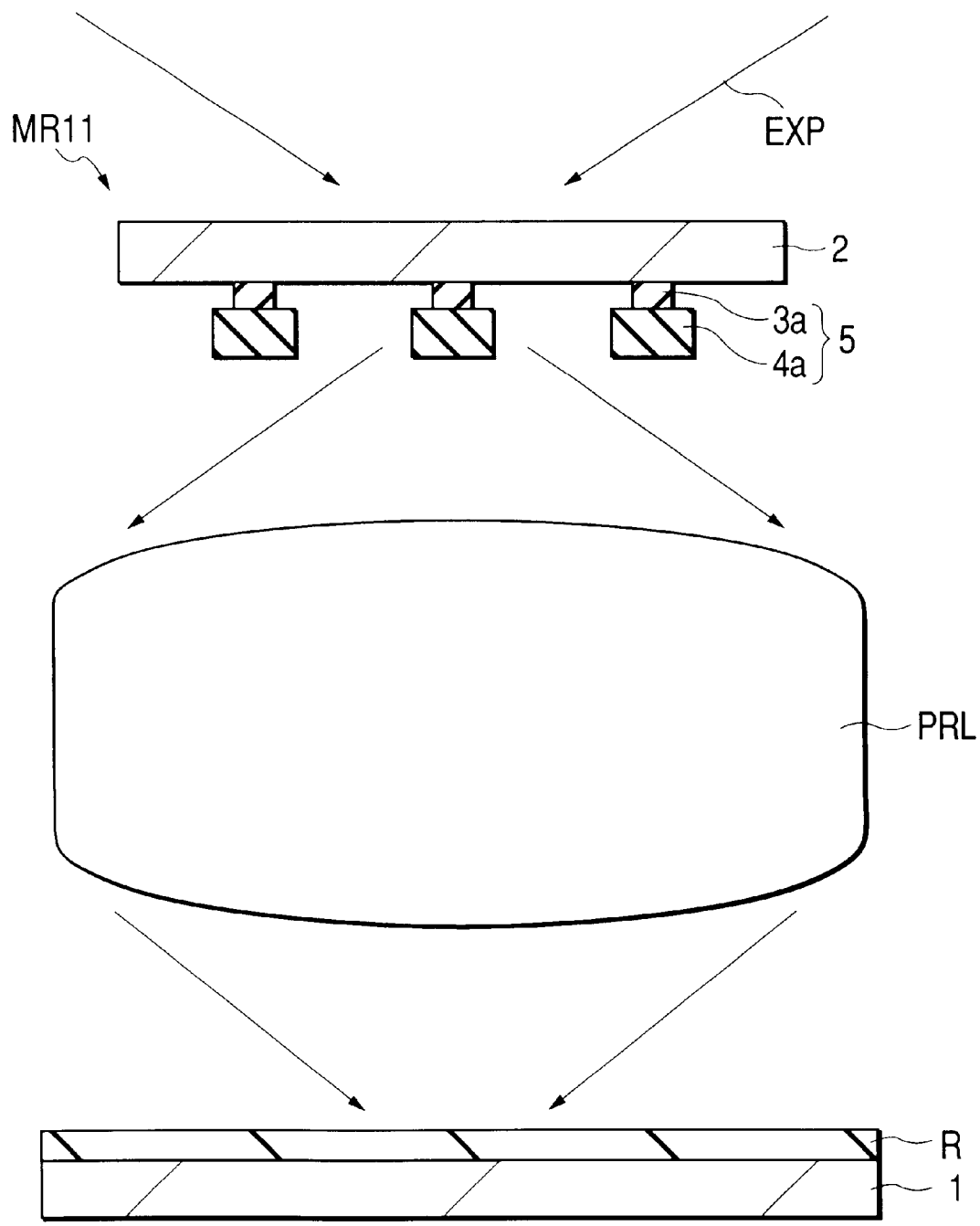
FIG. 41 illustrates the exposure using the photomask in FIG. 40.
Figure 42A:
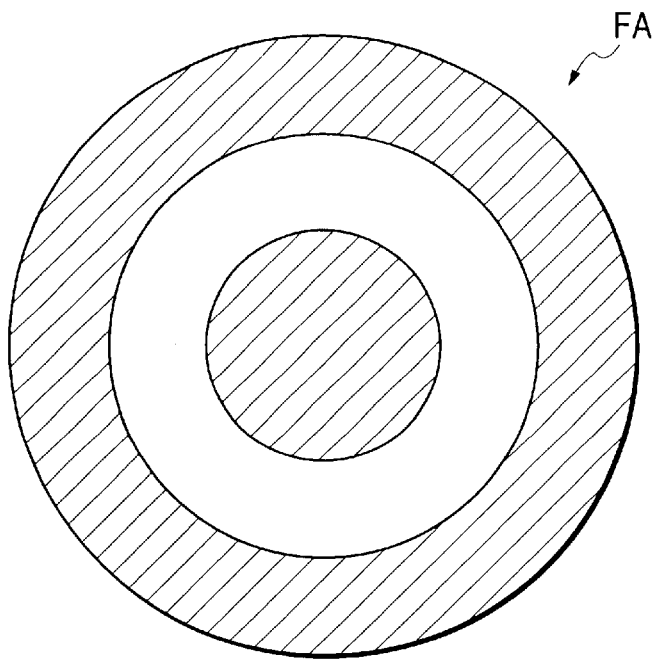
FIGS. 42(a) and (b) illustrate illumination methods used for the exposure in FIG. 41.

FIG. 41 illustrates a state of the exposure using the mask MR11. This example uses oblique illumination such as off-axis illumination, etc. According to this type of illumination, exposure light EXP is obliquely irradiated against the second principal surface of the mask plate 2 for the mask MR11. FIGS. 42(a) and (b) provide examples of illumination apertures FA and FB used for the oblique illumination. In either case, hatching is applied to opaque areas. An area without hatching corresponds to a clear area.

Figure 42B:
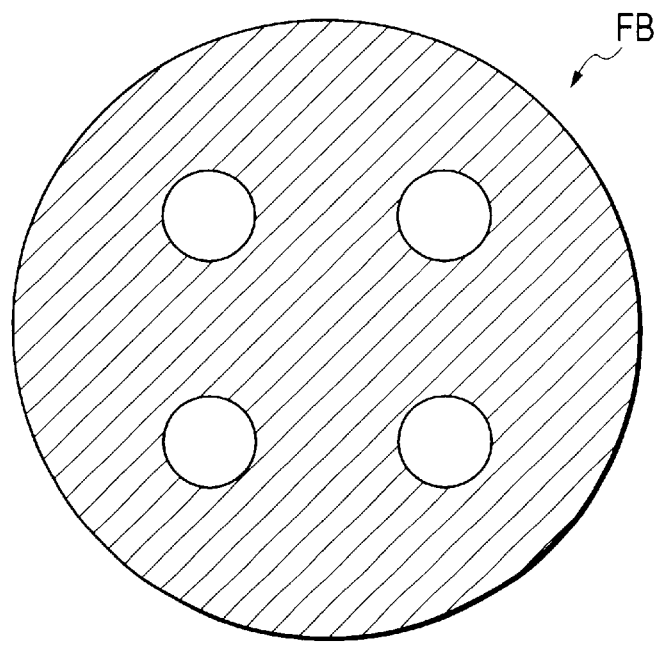

The illumination aperture FA in FIG. 42(a) illustrates annular illumination. The illumination aperture FB in FIG. 42(b) illustrates quadropole illumination. Further, it may be preferable to use dipole illumination. Of the above-mentioned off-axis illuminations, the annular illumination provides the best pattern fidelity. Especially, it is preferable to use the annular illumination when various patterns have different sizes and fine patterns are directed at any angle (for example, 45 degrees). It is preferable to use the quadropole illumination when there are only patterns crossing each other just in two directions (X and Y directions) and only fine patterns are available with no large patterns. Further, it is preferable to use the dipole illumination when only fine patterns are available and patterns are arranged only in one of crossing directions (X and Y directions).

According to this embodiment, it is possible to increase a focal depth owing to a phase shift effect at the half-tone pattern edge and an off-axis illumination effect. It is further possible to decrease a dimensional variation against the exposure amount and increase an exposure allowance. Accordingly, it is possible to manufacture a semiconductor device with high performance and reliability.

This embodiment has described the resist layer 4a with eaves formed at its ends. It may be preferable to eliminate eaves and to level the end of the resist layer 4a with the end of the photoabsorptive organic layer 3a. Also in this case, the same effects are available.

Embodiment 6

This embodiment describes a resist mask having a printable area provided with both an opaque pattern comprising metal and an opaque pattern comprising an organic layer. It is to be noted that Japanese Patent Application No. 2000-206728 (filed on Jul. 7, 2000) describes a semiconductor integrated circuit device using a resist mask having a printable area partially provided with an opaque pattern comprising an organic layer and the characteristic adjustment technology for that semiconductor integrated circuit device.

Figure 43A:
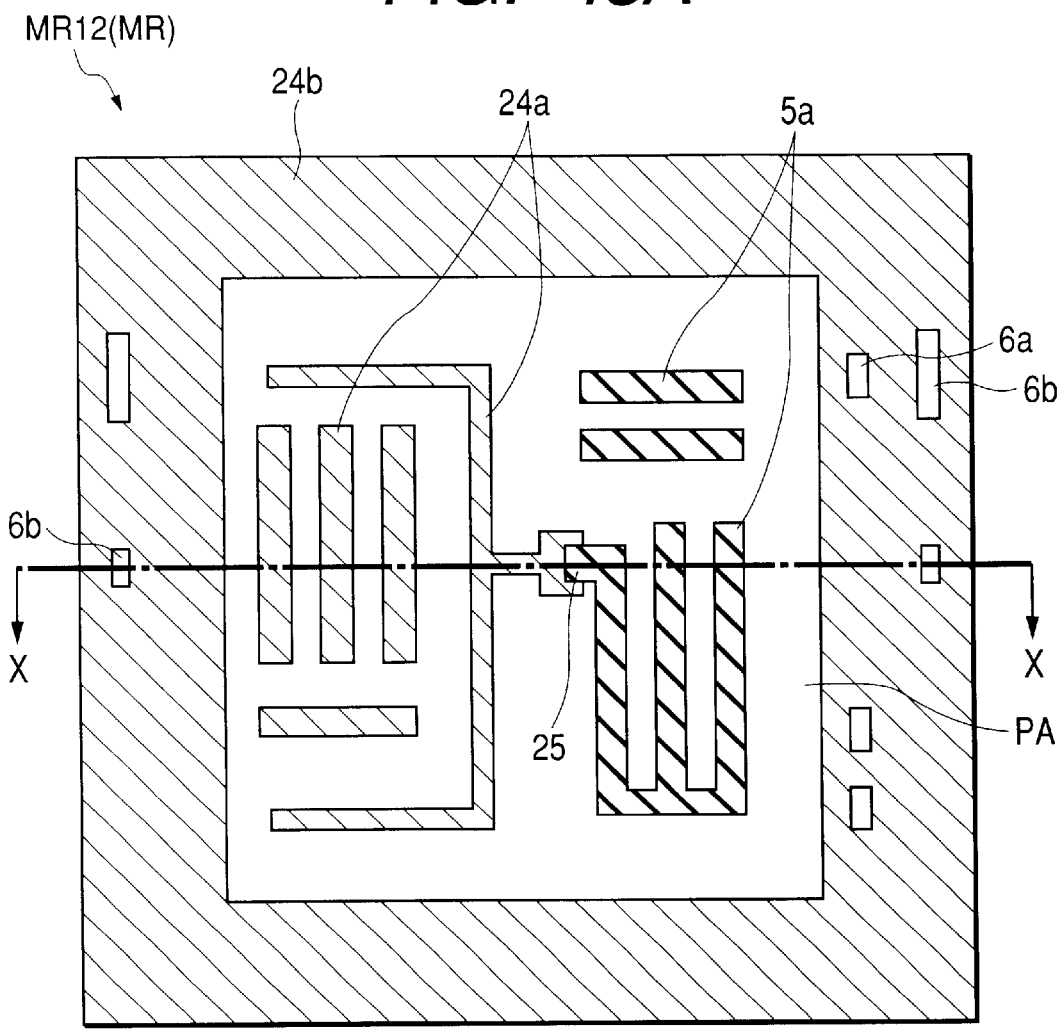
FIG. 43(a) is an overall plan view of an example of the photomask according to another embodiment of the present invention.
Figure 43B:
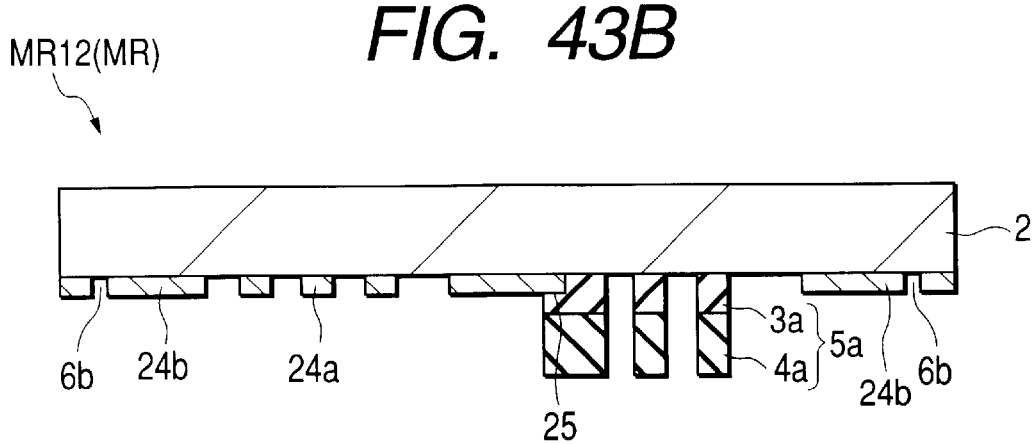
FIG. 43(b) is a cross sectional view taken on the line X—X thereof.

FIG. 43(a) is an overall plan view of a mask MR12(MR) according to this embodiment. FIG. 43(b) is a cross sectional view taken on the line X—X thereof. There are formed opaque patterns 5a and 24a for printing an integrated circuit pattern in a printable area PA on the first principal surface of the mask plate 2. A frame-like opaque pattern 24b is formed in a peripheral area on the first principal surface of the mask plate 2.

The opaque patterns 24a and 24b comprise, for example, a metal layer such as chromium (Cr), etc., high-melting point metal such as tungsten, molybdenum, tantalum, titanium, etc., nitride such as tungsten nitride, etc., high-melting point metal silicide (compound) such as tungsten silicide ($WSi_x$), molybdenum silicate ($MoSi_x$), etc., or a layered film of these materials. After the opaque pattern 5a comprising an organic material is removed from the resist mask, the mask plate 2 needs to be cleaned and recycled. It is desirable to use highly peel-resistant and wear-resistant materials for the opaque patterns 24a and 24b. The high-melting point metal such as tungsten is an appropriate material for the opaque patterns 24a and 24b because of high oxidation resistance, wear resistance, and peel resistance. The opaque patterns 24a and 24b are formed during the same patterning process. The opaque pattern 5a comprising two organic layers is formed after formation of the above-mentioned opaque patterns 24a and 24b comprising the metal layer.

The opaque pattern 24a comprising such a metal layer is used for a general-purpose pattern or an integrated circuit pattern at locations with a few modifications. The opaque pattern 5a comprising the organic substance is used for an optionally used pattern or a circuit pattern with many modifications. When the mask MR12 becomes a used mask, the opaque pattern 5a is removed from the organic layer to re-form a desired opaque pattern 5a comprising the organic substance (a layered set of the photoabsorptive organic layer and the resist layer or the single resist layer). This recycle process enables to reuse the metal opaque patterns 24a and 24b unchanged, and hence to greatly decrease the number of processes for creating a mask and the time for writing an integrated circuit pattern. A connection section 25 is provided between a set of opaque patterns 24a and 24b and the opaque pattern 5a comprising the organic substance. The connection section 25 preferably uses a pattern large enough for an overlap in consideration of misalignment during writing or is laid out in consideration of an overlap width.

Like the above-mentioned embodiment 1, the clear pattern 6a is a wafer alignment mark between different layers on the wafer. The clear pattern 6b is a reticle alignment mark for accurately locating the mask MR12. Some photolithography machines detect various marks including a reticle alignment mark by using a halogen lamp, red diode, red semiconductor laser, or helium-neon (He-Ne) laser beam. An exposure light opaque comprising a layered set of the photoabsorptive organic layer 3a and the resist layer 4a cannot provide sufficient opaqueness against these types of long-wavelength light. It may be difficult to detect various marks including a reticle alignment mark by means of a sufficient contrast. This embodiment forms these marks by using a clear pattern enclosed in the metal opaque pattern 24b. In this case, it is possible to provide sufficient opaqueness against the above-mentioned long-wavelength light, allowing a sufficient contrast for detecting various marks such as a reticle alignment mark, etc.

The following describes how to conduct a characteristic adjustment for the semiconductor integrated circuit device by using the mask MR12 according to this embodiment.

Figure 44:
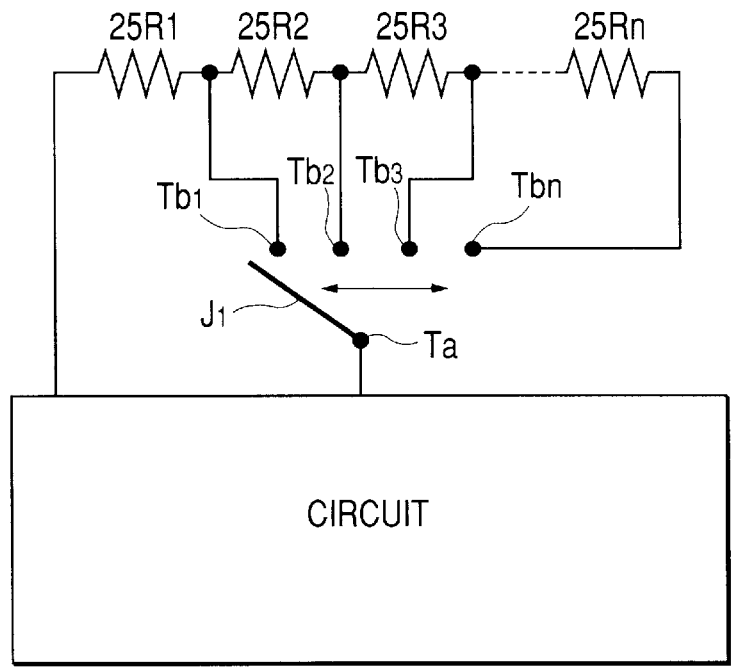
FIG. 44 is a circuit diagram for characteristic adjustment using a plurality of serially connected resistors.
Figure 45:
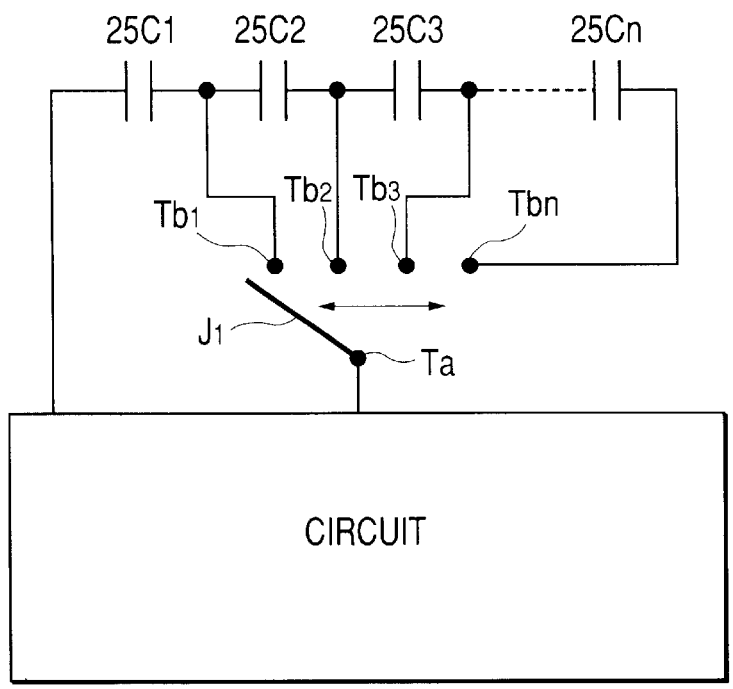
FIG. 45 is a circuit diagram for characteristic adjustment using a plurality of serially connected capacitors.

FIGS. 44 and 45 exemplify characteristic adjustment circuits in the semiconductor integrated circuit device formed on the wafer 1W.

FIG. 44 diagrams a characteristic adjustment circuit comprising a plurality of serially connected resistors 25R1 to 25Rn. A terminal Ta is connected to a circuit such as the semiconductor integrated circuit device's CPU, etc. Terminals Tb1 to Tbn are connected to the resistors 25R1 to 25Rn. The resistance of the entire circuit can be changed by using a connection section J1 to select a connection between the terminal Ta and any one of the terminals Tb1 to Tbn.

FIG. 44 diagrams a characteristic adjustment circuit comprising a plurality of serially connected capacitors 25C1 to 25Cn. A terminal Ta is connected to a circuit. Terminals Tb1 to Tbn are connected to the capacitors 25C1 to 25Cn. The resistance of the entire circuit can be changed by using the connection section J1 to select a connection between the terminal Ta and any one of the terminals Tb1 to Tbn.

The development of semiconductor integrated circuit device, etc. may conduct characteristic adjustment for the semiconductor integrated circuit device such as signal timing adjustment by variously changing the above-mentioned resistance or capacitance. When an ordinary mask is used for printing this pattern, a change (connection section J1) itself is small as seen from FIGS. 44 and 45. However, the mask must be re-manufactured for each adjustment. Accordingly, the mask manufacture becomes time-consuming, extending the development period for the semiconductor integrated circuit device. This technique is uneconomical and increases not only material and process costs, but also semiconductor integrated circuit device costs.

Figure 46A:
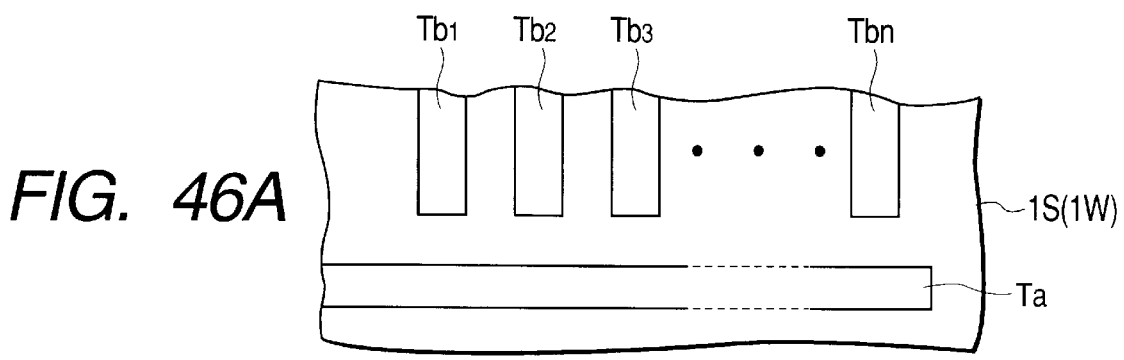
FIG. 46(a) is a composite plan view of terminals formed on a semiconductor wafer.
Figure 46B:
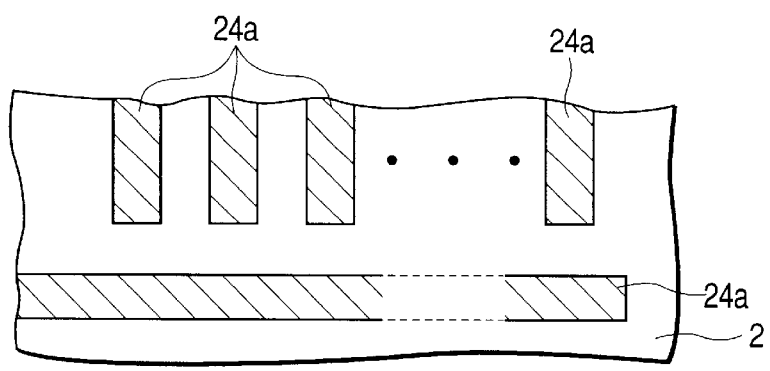
FIG. 46(b) is a plan view showing an opaque pattern on the mask plate for printing the terminals in FIG. 46(a)
Figure 47A:
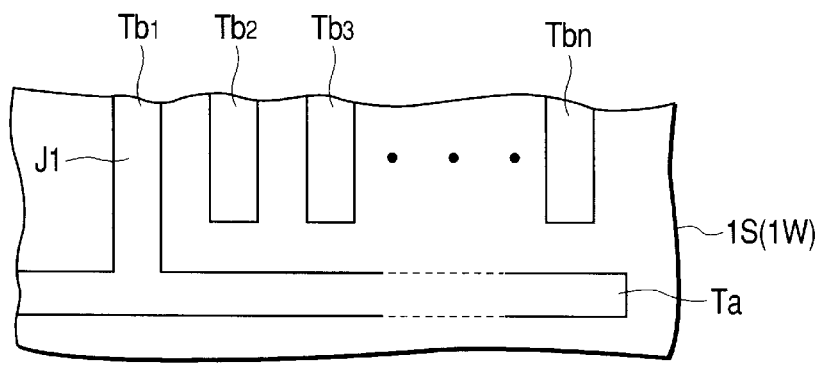
FIG. 47(a) is a composite plan view of terminals formed on a semiconductor wafer.
Figure 47B:
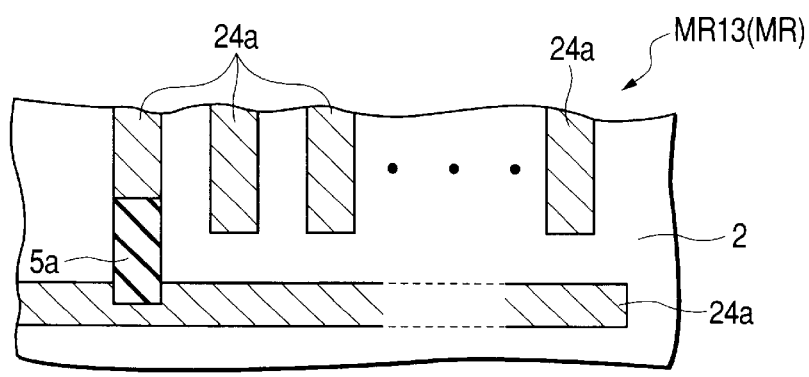
FIG. 47(b) is a plan view showing an opaque pattern on the photomask for printing the terminals in FIG. 47(a)

This embodiment uses an opaque pattern comprising an organic layer to form a portion for printing the connection section J1 on the mask. The opaque pattern may be a layered set of the photoabsorptive organic layer 3a and the resist layer 4a or the single resist layer 4a. FIG. 46(a) is a plan view schematically showing the terminals Ta, and Tb1 to Tbn formed on the wafer 1W. Here, the terminal Ta is connected to none of the terminals Tb1 to Tbn. FIG. 46(b) shows the opaque pattern 24a on the mask plate 2 for printing the terminals Ta, and Tb1 to Tbn in FIG. 46(a). The opaque pattern 24a comprises a metal layer and is used as base data. When a connection needs to be made between the terminals Ta and Tb1 as shown in FIG. 47(a), for example, the opaque pattern 5a just needs to be formed at a location corresponding to the connection section J1 as shown in FIG. 47(b). This connection section J1 is used for the terminals Ta and Tb1 on the principal surface of the mask plate 2 for a mask MR13(MR). The principal surface is where the opaque pattern 24a of the metal layer is formed. As mentioned above, the opaque pattern 5a comprises a stacked or layered set of photoabsorptive organic layer 3a and the resist layer 4a or the single photoabsorptive organic layer 3a when using exposure light such as g-line, i-line, KrF excimer laser beam, etc. whose wavelength exceeds 200 nm. Alternatively, the opaque pattern 5a comprises the single resist layer 4a when using exposure light with the exposure wavelength of 200 nm or less such as ArF excimer laser beam, etc. The opaque pattern 5a is formed and modified in the same manner as explained in the above-mentioned embodiment 1. It is possible to change a connection between the terminal Ta and any one of terminals Tb1 to Tbn easily, in a short time, and at low cost. On the whole, there are relatively a few terminals like these. Accordingly, it is possible to greatly shorten the development period for semiconductor integrated circuit devices. Further, it is possible to decrease costs for semiconductor integrated circuit devices.

Embodiment 7

Figure 48:
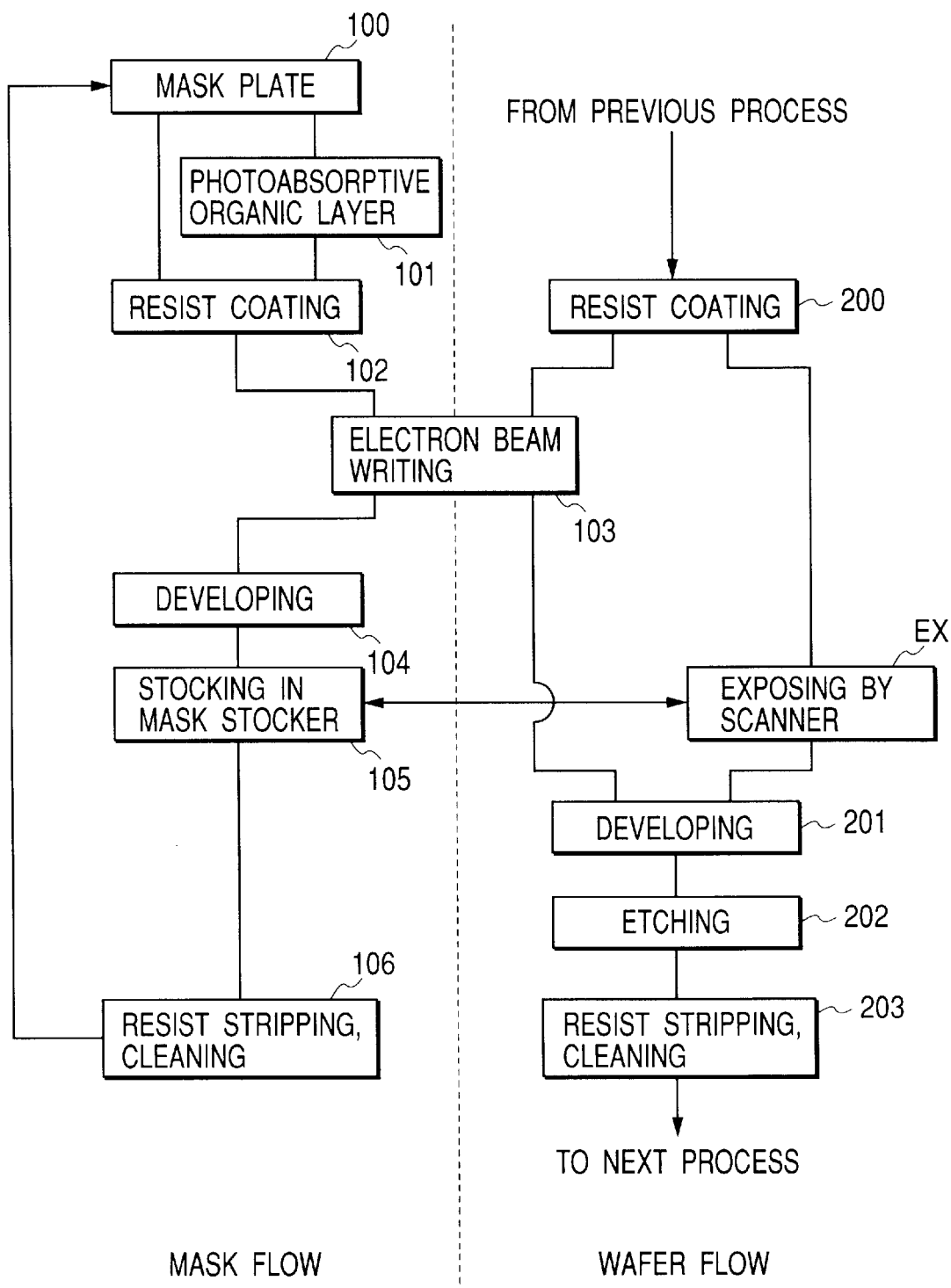
FIG. 48 is a flowchart showing processes for manufacturing a mask and semiconductor device according to yet another embodiment of the present invention.

This embodiment describes a technique for sharing the configuration by the mask flow (process for manufacturing a mask) and the wafer flow (process for manufacturing a semiconductor integrated circuit device). The example here shows that the mask and the wafer are processed in a same clean room. This is described with reference to FIG. 48. For example, Japanese Patent Application No. 2000-316965 (filed on Oct. 17, 2000) describes a technique to handle processes for manufacturing masks and semiconductor integrated circuit devices in the same clean room.

Flows of manufacturing the mask and the semiconductor integrated circuit device are almost same as for the above-mentioned embodiment 4 with reference to FIG. 39. Differences are as follows. First, an electron beam writer is shared by processes for manufacturing the mask and the semiconductor integrated circuit device. Further, stripping agent and cleaning fluid for a resist layer are managed in a shared manner because the same clean room is used for manufacturing the mask and the semiconductor integrated circuit device. There is a flow difference in the process of manufacturing semiconductor integrated circuit devices. Namely, processes for printing an integrated circuit pattern include an additional process (process 103) for directly writing an integrated circuit pattern on the wafer 1W by using the electron beam writer in addition to the above-mentioned exposure process (process EX). For example, this additional process is employed when there is a very small amount of exposure processing (exposure chips) for mask debugging or initial development or when one wafer or a very small number of wafers are processed.

As mentioned above, this embodiment uses the direct writing process using an electron beam writer as well as the ordinary exposure process in the manufacturing process for semiconductor integrated circuit devices. It is possible to concurrently realize mass production of semiconductor integrated circuit devices and a process requiring fine-tuned pattern formation for debugging, development, or small modifications. When the electron beam writer is not used for the mask manufacturing process, that electron beam writer is used for the semiconductor integrated circuit device manufacturing process, improving a utilization rate of the electron beam writer. It is possible to further decrease manufacturing costs for semiconductor integrated circuit devices. The same clean room is used for manufacturing masks and semiconductor integrated circuit devices, enabling shared management of the stripping agent and the cleaning fluid for resist layers. It is possible to decrease costs for masks and semiconductor integrated circuit devices and save labor for processing waste liquid due to the shared management.

Figure 49:
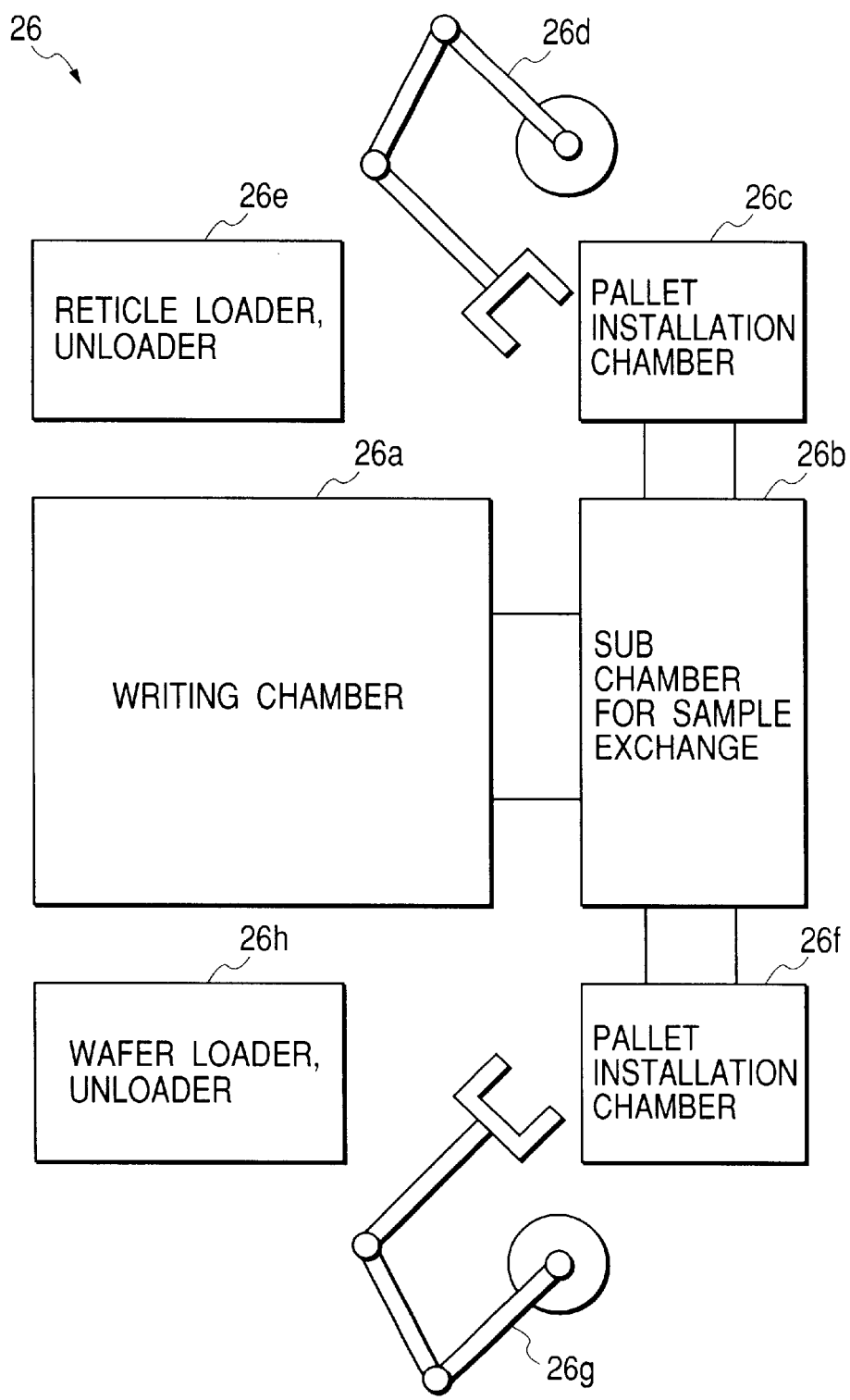
FIG. 49 is an explanatory drawing illustrating an example of an electron beam writer used for the manufacturing process in FIG. 48.

FIG. 49 shows a configuration example of the electron beam writer used here. The electron beam writer 26 comprises a work chamber 26a, a sub-chamber for sample exchange 26b, a pallet installation chamber for reticle 26c, a reticle handling system 26d, a reticle loader and unloader 26e, a pallet installation chamber for wafer 26f, a wafer handling system 26g, and a wafer loader and unloader 26h.

The work chamber 26a is connected to the sub-chamber for sample exchange 26b via a vacuum system. The sub-chamber for sample exchange 26b works as a type of load lock chamber. A wafer and a reticle (mask) are supplied respectively from the reticle loader and unloader 26e and the wafer loader and unloader 26h for exclusive use, are mounted on respective dedicated palettes in the palette installation chambers 26c and 26f, and are transported to the sub-chamber for sample exchange 26b. Dedicated pallets are used for reticles and wafers independently because of a material difference between a glass substrate (mask plate) and a semiconductor substrate as well as differences in shapes and dimensions. Namely, a reticle is rectangular and approximately 6 mm thick; a wafer is circular and approximately 0.8 mm thick. This is because the glass substrate differs from the semiconductor substrate in charge-up levels and manners of losing charges. It has become possible to share an apparatus between processes for writing reticles and wafers by using dedicated pallets and using dedicated ports for reticles and wafers independently.

While there have been described specific preferred embodiments of the present invention made by the inventors, it is to be distinctly understood that the present invention is not limited thereto. It is further understood by those skilled in the art that various changes and modifications may be made in the present invention without departing from the spirit and scope thereof.

For example, the above-mentioned embodiments have described the ordinary wire structure which patterns wires for a semiconductor integrated circuit device by etching a conductive layer. The present invention is not limited thereto. It may be preferable to form wires by means of the damascene or dual damascene method. This method bores a trench or hole for wires in, for example, an insulation layer and fills a conductive layer in that trench or hole to form a wire.

The above-mentioned embodiments 1 to 4, 6, and 7 have explained the exposure process using ordinary illumination. The present invention is not limited thereto. It may be preferable to use oblique illumination for the exposure process in the above-mentioned embodiments 1 to 4, 6, and 7.

The above-mentioned embodiments have explained the use of electron beams for printing an integrated circuit pattern on the mask plate. The present invention is not limited thereto. Various changes and modifications may be made in the present invention. For example, it may be preferable to use laser beams.

In the above-mentioned description, the invention made by the inventors is applied to our field of application, namely the method of manufacturing a semiconductor device. The present invention is not limited thereto and is applicable variously. The present invention is also applicable to the method of manufacturing a semiconductor device having memory circuits such as DRAM (Dynamic Random Access Memory), SRAM (Static Random Access Memory), flash memory (EEPROM: Electric Erasable Programmable Read Only Memory), etc. The present invention is further applicable to the method of manufacturing a semiconductor device having a logical circuit such as a microprocessor. The present invention is furthermore applicable to the method of manufacturing another type of semiconductor device such as an embedded semiconductor device which provides the memory circuit and the logical circuit on the same semiconductor substrate. Moreover, the present invention is applicable to the method of manufacturing a disk, a liquid crystal display, or a micromachine which needs to print a specified pattern by means of the exposure using a mask.

Advantage of the Invention

The following summarizes representative effects of the present invention disclosed in the application concerned.

(1) The present invention applies exposure treatment to a semiconductor wafer against exposure light with the exposure wavelength over 200 nm by using a photomask provided with an opaque pattern comprising a photoabsorptive organic layer. It is possible to well print a specified pattern even when the exposure treatment using a resist mask utilizes exposure light with the exposure wavelength over 200 nm.

(2) The present invention applies exposure treatment to a semiconductor wafer against exposure light with the exposure wavelength over 200 nm by using a photomask provided with an opaque pattern comprising a photoabsorptive organic layer. Even when exposure light with the exposure wavelength over 200 nm is used, it is possible to use a resist mask and shorten the development period of a semiconductor device.

(3) The present invention applies exposure treatment to a semiconductor wafer against exposure light with the exposure wavelength over 200 nm by using a photomask provided with an opaque pattern comprising a photoabsorptive organic layer. Even when exposure light with the exposure wavelength over 200 nm is used, it is possible to use a resist mask and shorten the manufacture period of a semiconductor device.

(4) The present invention applies exposure treatment to a semiconductor wafer against exposure light with the exposure wavelength over 200 nm by using a photomask provided with an opaque pattern comprising a photoabsorptive organic layer. Even when exposure light with the exposure wavelength over 200 nm is used, it is possible to use a resist mask and decrease semiconductor device costs.

What is claimed is:

1. A method of manufacturing a semiconductor device comprising the step of printing a specified pattern on a semiconductor wafer by conducting an exposure treatment using a photomask provided with an opaque pattern comprising an organic layer that is photoabsorptive in reaction to exposure light with a wavelength over 200 nm.

2. The method of manufacturing a semiconductor device according to claim 1, wherein said opaque pattern comprises a layered set of a photoabsorptive organic layer in reaction to exposure light with a wavelength over 200 nm and photosensitive organic layer.

3. The method of manufacturing a semiconductor device according to claim 2, wherein an absorbance coefficient of said photoabsorptive organic layer against exposure light is greater than an absorbance coefficient of said photosensitive organic layer.

4. The method of manufacturing a semiconductor device according to claim 1, wherein said exposure treatment is a process for printing a resist pattern used as a mask for implanting specified impurities in said semiconductor wafer.

5. The method of manufacturing a semiconductor device according to claim 1, wherein said specified pattern is a wire pattern.

6. A method of manufacturing a semiconductor device comprising the steps of:
   (a) printing a first pattern on a semiconductor wafer by conducting a first exposure treatment through the use of a first photomask provided with a first opaque pattern comprising a first organic layer that is photoabsorptive in reaction to a first exposure light, and
   (b) printing a second pattern on said semiconductor wafer by conducting a second exposure treatment through the use of a second photomask provided with a second opaque pattern comprising a second organic layer that is photoabsorptive in reaction to a second exposure light whose wavelength is longer than said first exposure light and over 200 nm.

7. The method of manufacturing a semiconductor device according to claim 6, wherein said first opaque layer is structured as a single photoabsorptive organic layer.

8. The method of manufacturing a semiconductor device according to claim 6, wherein said second opaque layer is structured as a layered set of an organic layer that is photoabsorptive in reaction to said second exposure light and a photosensitive organic layer.

9. The method of manufacturing a semiconductor device according to claim 8, wherein an absorbance coefficient of said photoabsorptive organic layer against exposure light is greater than an absorbance coefficient of said photosensitive organic layer.

10. The method of manufacturing a semiconductor device according to claim 6, wherein a wavelength of said second exposure light exceeds 200 nm.

11. The method of manufacturing a semiconductor device according to claim 6, wherein said first pattern is a gate electrode pattern of a field effect transistor constituting a semiconductor device.

12. The method of manufacturing a semiconductor device according to claim 6, wherein the exposure treatment using said second exposure light is a process of printing a resist pattern as a mask for implanting impurities on said semiconductor wafer.

13. A method of manufacturing a semiconductor device comprising the steps of:
   (a) during an exposure treatment for printing a first pattern including a pattern whose dimension is smaller than or equal to a specified value, printing said first pattern on a semiconductor wafer by conducting a first exposure treatment through the use of a first photomask provided with a first opaque pattern comprising a first organic layer that is photoabsorptive in reaction to a first exposure light;
   (b) during an exposure treatment for printing a second pattern including a pattern whose dimension exceeds said specified value, printing said second pattern on said semiconductor wafer by conducting a second exposure treatment through the use of a second photomask provided with a second opaque pattern comprising a second organic layer that is photoabsorptive in reaction to a second exposure light whose wavelength is longer than that of said first exposure light and over 200 nm.

14. The method of manufacturing a semiconductor device according to claim 13, wherein said second opaque pattern comprises a photosensitive organic layer formed on said second photoabsorptive organic layer in reaction to said second exposure light.

15. The method of manufacturing a semiconductor device according to claim 14, wherein an absorbance coefficient of said second photoabsorptive organic layer against said second exposure light is greater than an absorbance coefficient of said photosensitive organic layer.

16. The method of manufacturing a semiconductor device according to claim 13, wherein a wavelength of said second exposure light exceeds 200 nm.

17. A method of manufacturing a semiconductor device comprising the steps of:
   (a) conducting a first exposure treatment during formation of a gate electrode by using a first photomask provided with a first opaque pattern comprising a metal layer to print a first pattern on a semiconductor wafer; and
   (b) conducting a second exposure treatment after formation of said gate electrode by using a second photomask provided with an opaque pattern comprising a photosensitive organic layer formed on a second opaque organic layer that is photoabsorptive in reaction to an exposure light with a wavelength over 200 nm.

18. The method of manufacturing a semiconductor device according to claim 17, wherein an absorbance coefficient of said photoabsorptive organic layer against exposure light is greater than an absorbance coefficient of said photosensitive organic layer.

19. The method of manufacturing a semiconductor device according to claim 17, wherein said specified wavelength exceeds 200 nm.

20. A method of manufacturing a semiconductor device comprising the step of printing a specified pattern on a semiconductor wafer by conducting an exposure treatment using a photomask provided with a dim pattern comprising an organic layer which dims in reaction to exposure light with a wavelength over 200 nm, wherein said dim pattern comprises a photosensitive organic layer formed on an organic layer that is photoabsorptive in reaction to said exposure light for said exposure treatment.

21. The method of manufacturing a semiconductor device according to claim 20, wherein said organic layer comprises a photosensitive organic layer formed on a photoabsorptive organic layer in reaction to exposure light for said exposure treatment.

22. The method of manufacturing a semiconductor device according to claim 21, wherein a pattern width of said photoabsorptive organic layer is smaller than a pattern width of said photosensitive organic layer so that said photosensitive organic layer has a pattern with protruding ends.

23. The method of manufacturing a semiconductor device according to claim 1, wherein said exposure treatment uses oblique illumination.

24. A method of manufacturing a semiconductor device comprising the steps of illuminating photomasks having opaque patterns, and repeatedly conducting a projection exposure for printing said patterns on a semiconductor wafer via projection optics to consecutively form specified opaque patterns, wherein:

the projection exposure is conducted by using an exposure light with a wavelength over 200 nm through the use of said photomasks having said opaque patterns at least partially comprising an organic layer that is photoabsorptive in reaction to said exposure light and a photosensitive layer.

25. The method of manufacturing a semiconductor device according to claim 24, wherein an absorbance coefficient of said photoabsorptive organic layer against said exposure light is greater than an absorbance coefficient of said photosensitive layer.

26. A method of manufacturing a semiconductor device comprising the steps of illuminating photomasks having opaque patterns, and repeatedly conducting a projection exposure for printing said opaque patterns on a semiconductor wafer via projection optics to consecutively form specified patterns, wherein:

a projection exposure treatment during gate formation uses a first photomask having said opaque pattern comprising a metal layer; and a subsequent projection exposure treatment uses a second photomask having said opaque pattern comprising a layered set of an organic layer that is photoabsorptive in reaction to an exposure light with a wavelength over 200 nm and a photosensitive layer.

27. A method of manufacturing a semiconductor device comprising the steps of illuminating photomasks having opaque patterns, and repeatedly conducting a projection exposure for printing said opaque patterns on a semiconductor wafer via projection optics to consecutively form specified patterns, wherein:

said projection exposure is conducted through the use of a photomask having said opaque patterns at least partially comprising an organic layer that is photoabsorptive in reaction to an exposure light with a wavelength over 200 nm and a photosensitive layer and said projection exposure uses oblique illumination.

* * * * *